United States Patent
Ako

(10) Patent No.: US 12,148,476 B2
(45) Date of Patent: Nov. 19, 2024

(54) SEMICONDUCTOR MEMORY DEVICE

(71) Applicant: Kioxia Corporation, Tokyo (JP)

(72) Inventor: Masayuki Ako, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 170 days.

(21) Appl. No.: 18/067,981

(22) Filed: Dec. 19, 2022

(65) Prior Publication Data

US 2023/0410908 A1    Dec. 21, 2023

(30) Foreign Application Priority Data

Jun. 17, 2022  (JP) .................................. 2022-097934

(51) Int. Cl.
| | |
|---|---|
| *G11C 16/08* | (2006.01) |
| *G11C 16/04* | (2006.01) |
| *H10B 41/10* | (2023.01) |
| *H10B 41/27* | (2023.01) |
| *H10B 41/35* | (2023.01) |

(52) U.S. Cl.
CPC .......... *G11C 16/08* (2013.01); *G11C 16/0483* (2013.01); *H10B 41/10* (2023.02); *H10B 41/27* (2023.02); *H10B 41/35* (2023.02)

(58) Field of Classification Search
None
See application file for complete search history.

(56) References Cited

U.S. PATENT DOCUMENTS

| | | |
|---|---|---|
| 2020/0111517 A1 | 4/2020 | Seo et al. |
| 2021/0118862 A1 | 4/2021 | Maejima et al. |
| 2021/0265259 A1 | 8/2021 | Niki |
| 2022/0085048 A1 | 3/2022 | Lee et al. |
| 2022/0301615 A1 | 9/2022 | Maejima |
| 2023/0299015 A1* | 9/2023 | Matsumoto ............ H10B 41/27 257/314 |
| 2023/0307397 A1* | 9/2023 | Okada ................. H01L 25/0657 |

FOREIGN PATENT DOCUMENTS

JP      2021064731 A    4/2021

\* cited by examiner

*Primary Examiner* — Tan T. Nguyen
(74) *Attorney, Agent, or Firm* — Holtz, Holtz & Volek PC

(57) ABSTRACT

According to one embodiment, a semiconductor memory device includes first, second, third and fourth word lines coupled to first, second, third and fourth memory cells, respectively. A first transistor includes a first gate and is electrically coupled to the first word line. A second transistor includes a second gate and is electrically coupled to the second word line. A third transistor includes a third gate and is electrically coupled to the third word line. A fourth transistor includes a fourth gate and is electrically coupled to the fourth word line. The first gate is included in a first conductive layer. The second gate is included in a second conductive layer arranged away from the first conductive layer. The third and fourth gates are included in a third conductive layer which is integral and continuous.

20 Claims, 29 Drawing Sheets

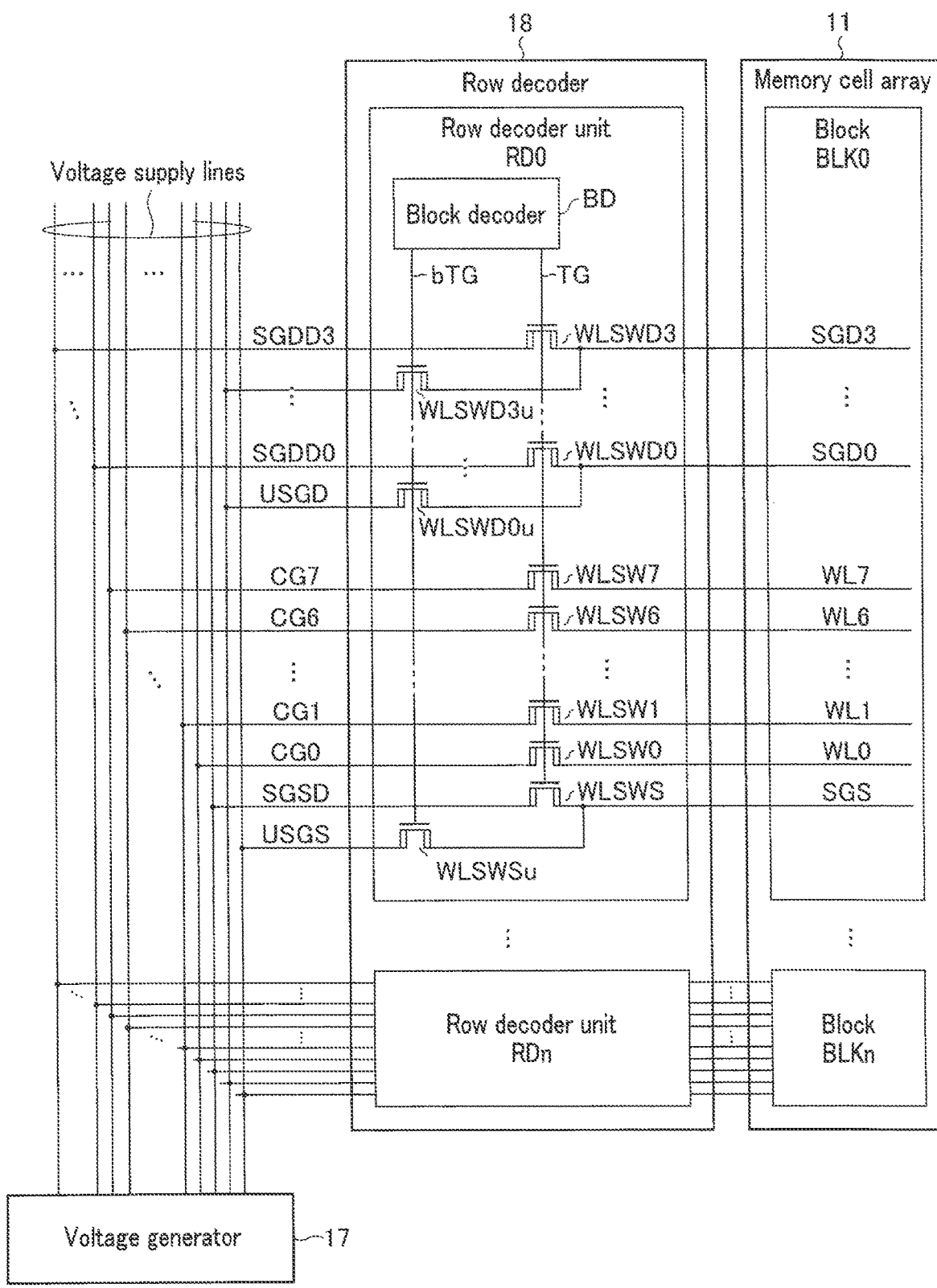
F I G. 3

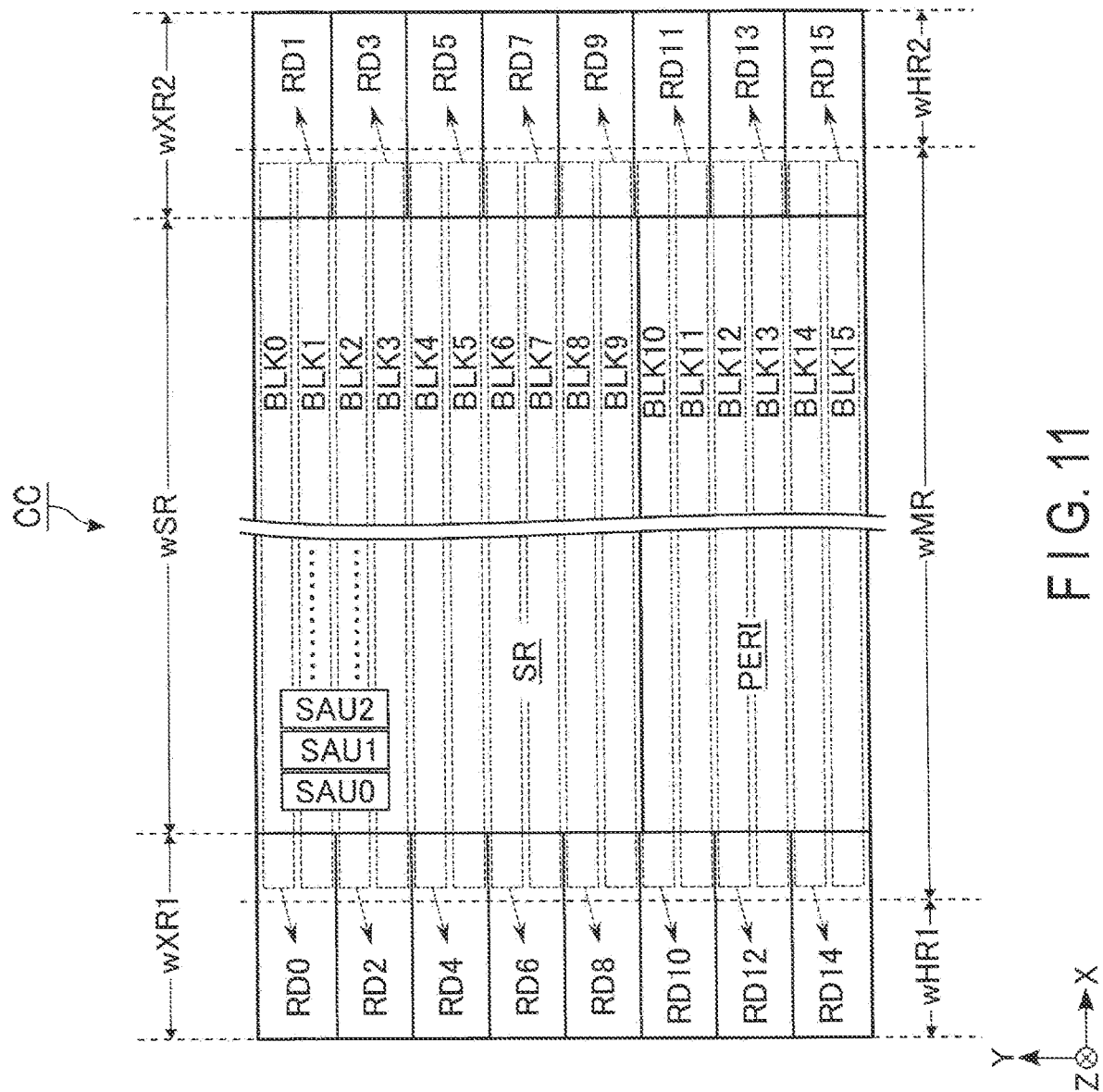
F I G. 11

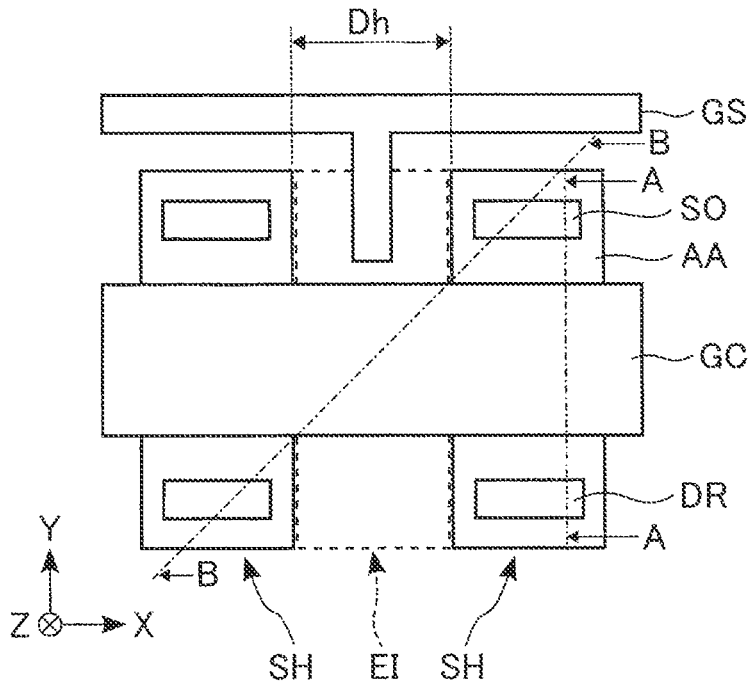
F I G. 15
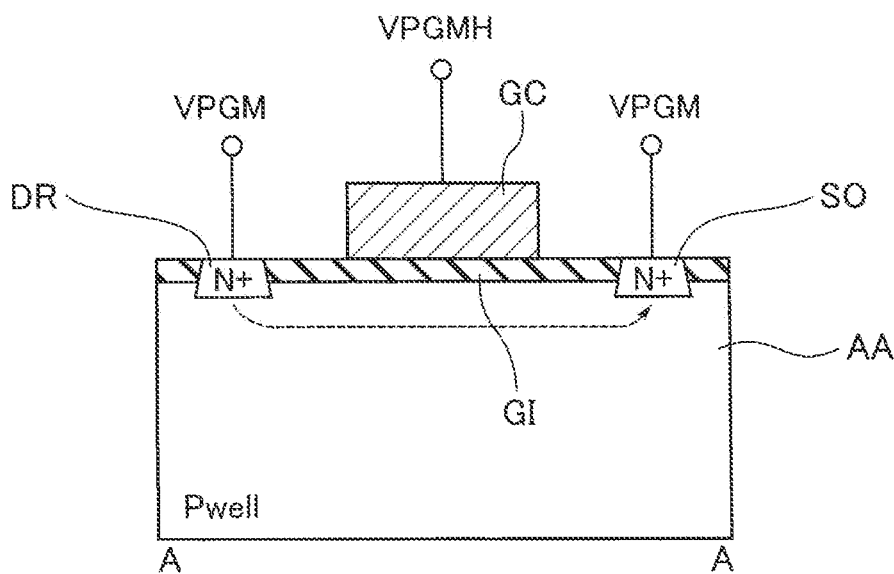
F I G. 16

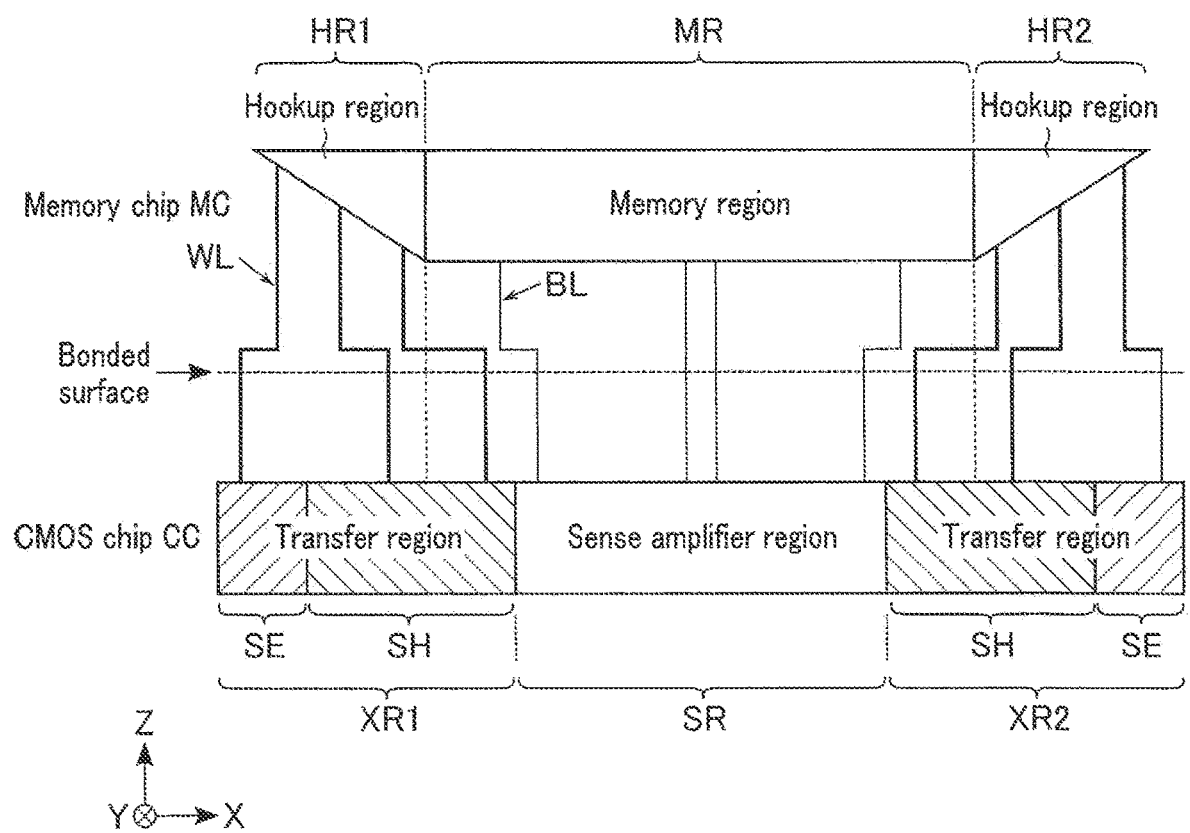
F I G. 23

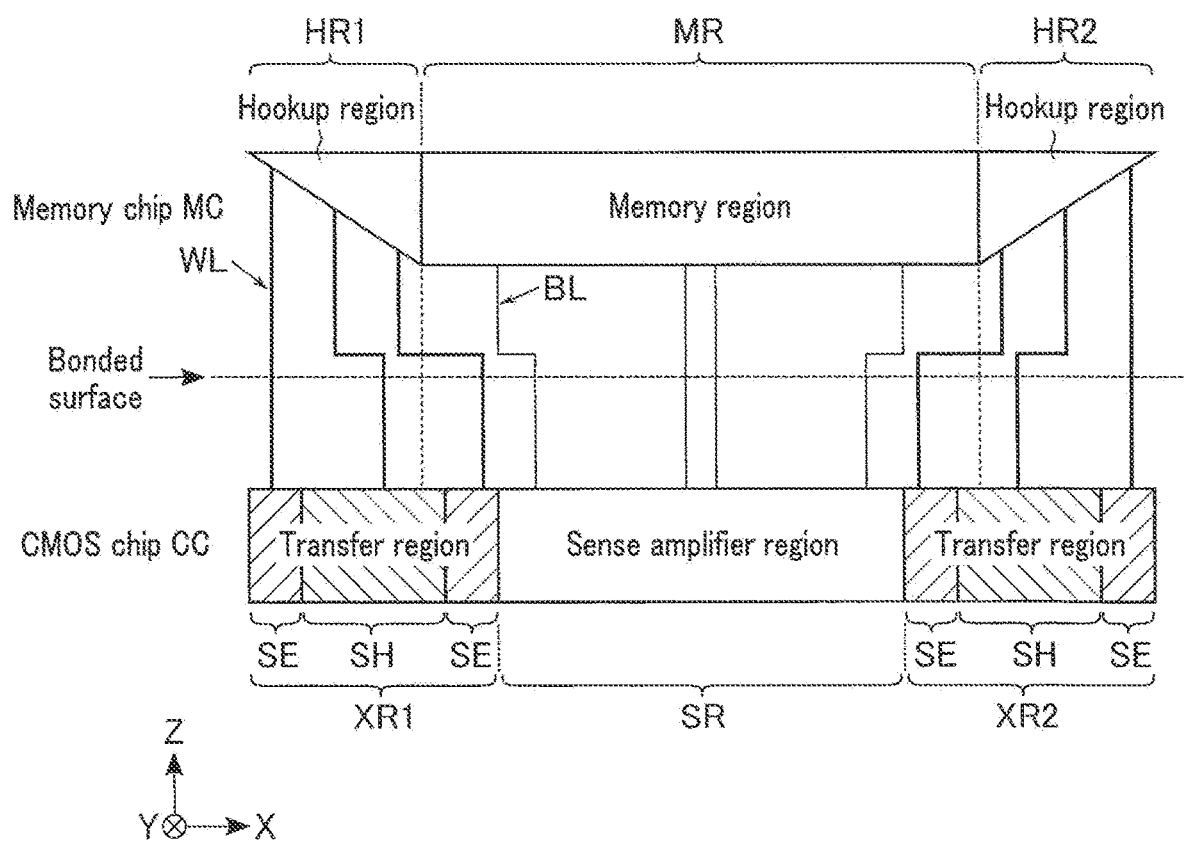
F I G. 29

SEMICONDUCTOR MEMORY DEVICE

CROSS-REFERENCE TO RELATED APPLICATIONS

This application is based upon and claims the benefit of priority from Japanese Patent Application No. 2022-097934, filed Jun. 17, 2022, the entire contents of which are incorporated herein by reference.

FIELD

Embodiments described herein relate generally to a semiconductor memory device.

BACKGROUND

A NAND flash memory capable of storing data in a nonvolatile manner is known.

BRIEF DESCRIPTION OF THE DRAWINGS

FIG. 3 is a diagram illustrating a circuit configuration of a row decoder according to the first embodiment.

FIG. 11 is a diagram illustrating a planar layout of a CMOS chip of the semiconductor memory device according to the first embodiment.

FIG. 15 is a diagram illustrating a planar layout of a gate sharing transistor according to the first embodiment.

FIG. 16 is a cross-sectional view of the gate sharing transistor according to the first embodiment, taken along line A-A.

FIG. 23 is a schematic diagram illustrating a structure of a semiconductor memory device of a second example according to the first embodiment.

FIG. 29 is a schematic diagram illustrating a structure of a semiconductor memory device of a first example according to a second embodiment.

DETAILED DESCRIPTION

In general, according to one embodiment, a semiconductor memory device includes a first word line coupled to a first memory cell; a second word line coupled to a second memory cell; a third word line coupled to a third memory cell; a fourth word line coupled to a fourth memory cell; a first transistor including a first gate and electrically coupled to the first word line; a second transistor including a second gate and electrically coupled to the second word line; a third transistor including a third gate and electrically coupled to the third word line; and a fourth transistor including a fourth gate and electrically coupled to the fourth word line. The first gate is included in a first conductive layer. The second gate is included in a second conductive layer arranged away from the first conductive layer. The third gate and the fourth gate are included in a third conductive layer which is integral and continuous.

In the descriptions below, structural elements having the same functions and configurations will be denoted by common reference symbols. The embodiments to be described below are shown as an example of a device or a method for embodying the technical idea of the embodiments, and are not intended to limit the material, shape, structure, arrangement, etc. of components to those described below.

Each functional block can be implemented in the form of hardware, computer software, or a combination thereof. The functional blocks do not have to be distinguished from each other as in the examples described below. For example, some of the functions may be implemented by a functional block other than the exemplified functional blocks. The exemplified functional blocks may be further divided into functional sub-blocks.

Hereinafter, a description will be given of a semiconductor memory device according to an embodiment. The following description will be made on a semiconductor memory device, exemplified by a three-dimensional stacked NAND flash memory in which memory cell transistors are stacked three-dimensionally above a semiconductor substrate. The NAND flash memory is a semiconductor memory capable of storing data in a nonvolatile manner.

1. First Embodiment

A semiconductor memory device according to a first embodiment will be described.

1.1 Circuit Configuration of Semiconductor Memory Device

Figure 1:
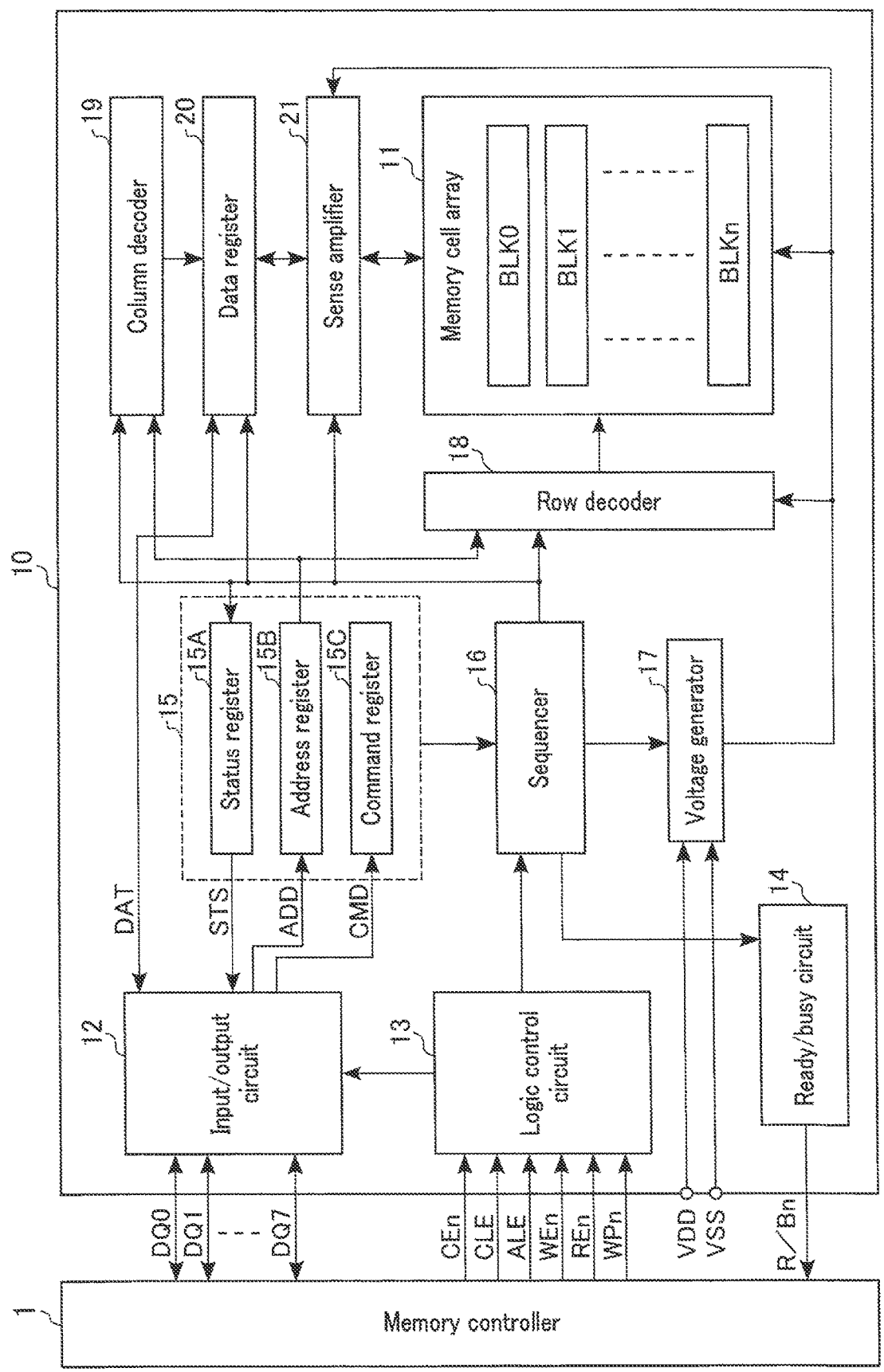
FIG. 1 is a block diagram illustrating a circuit configuration of a semiconductor memory device according to a first embodiment.

A circuit configuration of the semiconductor memory device of the first embodiment will be described. FIG. 1 is a block diagram illustrating the circuit configuration of the semiconductor memory device of the first embodiment.

A semiconductor memory device 10 includes a memory cell array 11, an input/output circuit 12, a logic control circuit 13, a ready/busy circuit 14, a register group 15, a sequencer (or, a control circuit) 16, a voltage generator 17, a row decoder 18, a column decoder 19, a data register 20, and a sense amplifier 21. The register group 15 includes a status register an address register 15B, and a command register 15C.

The memory cell array 11 includes one or more blocks BLK0, BLK1, BLK2, . . . , and BLKn (where n is a natural number of 0 or more). Each of the blocks BLK0 to BLKn includes a plurality of memory cell transistors (hereinafter also referred to as "memory cells") each associated with a row and a column. The memory cell transistor is an electrically erasable and programmable nonvolatile memory cell. The memory cell array 11 includes a plurality of word lines, a plurality of bit lines, and a source line for applying voltages to the memory cell transistors. A specific configuration of the block BLKn will be described later.

The input/output circuit 12 and the logic control circuit 13 are each coupled to the memory controller 1 via an input/output terminal (or a NAND bus). The input/output circuit 12 transmits and receives I/O signals DQ (e.g., DQ0, DQ1, DQ2, . . . , and DQ7) to and from the memory controller 1 via the input/output terminal. The I/O signals DQ are used for communication of commands, addresses, data, etc.

The logic control circuit 13 receives an external control signal from the memory controller 1 via the input/output terminal (or the NAND bus). The external control signal includes, for example, a chip enable signal CEn, a command latch enable signal CLE, an address latch enable signal ALE, a write enable signal WEn, a read enable signal REn, and a write protect signal WPn. The letter "n" appended to the name of a signal indicates that the signal is active-low.

In a case where there are a plurality of semiconductor memory devices 10, the chip enable signal CEn enables selection of a semiconductor memory device and is asserted when that semiconductor memory device 10 is selected. The command latch enable signal CLE allows a command transmitted as signals DQ to be latched in the command register 15C. The address latch enable signal ALE allows an address transmitted as signals DQ to be latched in the address register 15B. The write enable signal WEn allows data transmitted as signals DQ to be stored in the input/output circuit 12. The read enable signal REn allows data read from the memory cell array 11 to be output as signals DQ. The write protect signal WPn is asserted when a write operation and an erase operation directed to the semiconductor memory device 10 are prohibited.

The ready/busy circuit 14 generates a ready/busy signal R/Bn under control of the sequencer 16. The ready/busy signal R/Bn indicates whether the semiconductor memory device 10 is in a ready state or in a busy state. The ready state indicates that the semiconductor memory device 10 is ready to receive an instruction from the memory controller 1. The busy state indicates that the semiconductor memory device 10 is not ready to receive an instruction from the memory controller 1. Through reception of the ready/busy signal R/Bn from the semiconductor memory device 10, the memory controller 1 can recognize whether the semiconductor memory device 10 is in a ready state or in a busy state.

The status register 15A stores status information STS necessary for the operation of the semiconductor memory device 10. The status register 15A transfers the status information STS to the input/output circuit 12 in accordance with an instruction of the sequencer 16.

The address register 15B stores an address ADD transferred from the input/output circuit 12. The address ADD includes a row address and a column address. The row address includes, for example, a block address that designates a block BLKn to be operated, and a page address that designates a word line WL to be operated in the designated block.

The command register 15C stores a command CMD transferred from the input/output circuit 12. The command CMD includes, for example, a write command that instructs the sequencer 16 to perform a write operation, a read command that instructs a read operation, and an erase command that instructs an erase operation.

A static random access memory (SRAM), for example, is used for the status register 15A, the address register 15B, and the command register 15C.

The sequencer 16 receives a command from the command register 15C, and comprehensively controls the semiconductor memory device 10 according to a sequence based on this command.

The sequencer 16 controls the voltage generator 17, the row decoder 18, the column decoder 19, the data register 20, the sense amplifier 21, etc., to execute the write operation, read operation, and erase operation. Specifically, the sequencer 16 controls the voltage generator 17, the row decoder 18, the data register 20, and the sense amplifier 21 based on a write command received from the command register 15C, and writes data in a plurality of memory cell transistors designated by an address ADD. The sequencer 16 also controls the voltage generator 17, the row decoder 18, the column decoder 19, the data register 20, and the sense amplifier 21 based on a read command received from the command register 15C, and reads data from a plurality of memory cell transistors designated by an address ADD. Also, the sequencer 16 controls the voltage generator 17, the row decoder 18, the column decoder 19, the data register 20, and the sense amplifier 21 based on an erase command received from the command register and erases data stored in a block designated by an address ADD. A circuit including the column decoder 19, the data register 20, etc. is referred to as a column control circuit.

The voltage generator 17 receives a power supply voltage VDD and a ground voltage VSS via a power supply terminal from the outside of the semiconductor memory device 10. The power supply voltage VDD is an external voltage supplied from the outside of the semiconductor memory device 10, and is, for example, 3.3 V. The ground voltage VSS is an external voltage supplied from the outside of the semiconductor memory device 10, and is, for example, 0 V.

The voltage generator 17 generates a plurality of voltages necessary for the write operation, read operation, and erase operation, with use of the power supply voltage VDD. The voltage generator 17 supplies the generated voltage to the memory cell array 11, the row decoder 18, the sense amplifier 21, etc.

The row decoder 18 receives a row address from the address register 15B, and decodes this row address. The row decoder 18 selects any one of a plurality of blocks based on a result of decoding the row address, and further selects a word line WL in the selected block BLKn. Further, the row decoder 18 transfers a plurality of voltages supplied from the voltage generator 17 to the selected block BLKn. A specific configuration of the row decoder 18 will be described later.

The column decoder 19 receives a column address from the address register 15B, and decodes this column address. The column decoder 19 selects a latch circuit in the data register 20 based on a result of decoding the column address.

The data register 20 includes a plurality of latch circuits. The latch circuits temporarily store write data or read data.

In a data read operation, the sense amplifier 21 senses and amplifies data read from a memory cell transistor to a bit line. Further, the sense amplifier 21 temporarily stores read data DAT read from the memory cell transistor, and transfers the read data DAT stored therein to the data register 20. In a data write operation, the sense amplifier 21 temporarily stores write data DAT transferred from the input/output circuit 12 via the data register 20. Further, the sense amplifier 21 transfers the write data DAT to a bit line. A specific configuration of the sense amplifier 21 will be described later.

1.1.1 Configuration of Memory Cell Array

Next, a circuit configuration of the memory cell array 11 in the semiconductor memory device 10 of the first embodiment will be described. The memory cell array 11 includes the plurality of blocks BLK0 to BLKn, as described above. In the following, a circuit configuration of the block BLKn will be described.

Figure 2:
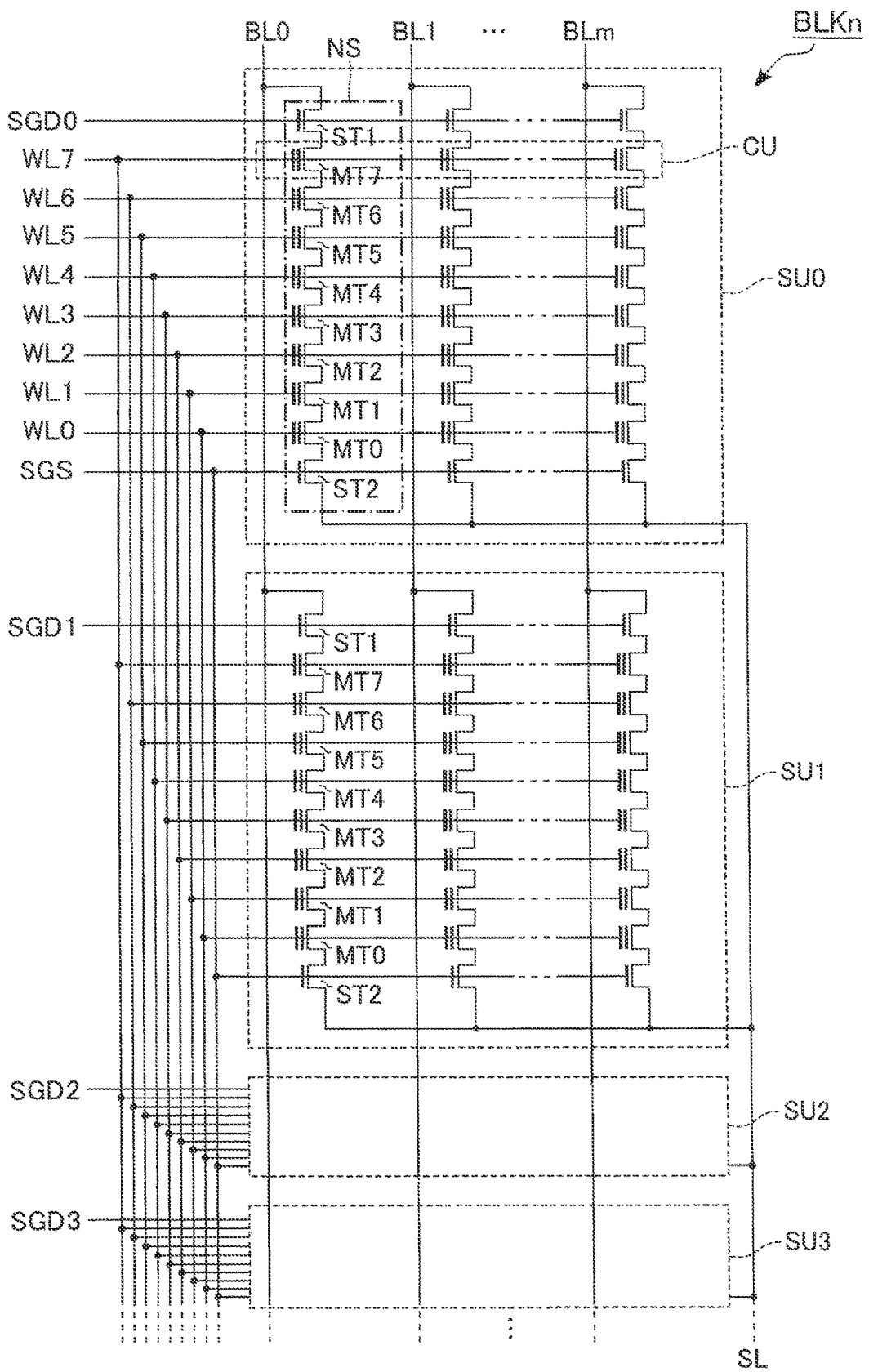
FIG. 2 is a circuit diagram of a block in a memory cell array according to the first embodiment.

FIG. 2 is a circuit diagram of the block BLKn in the memory cell array 11. The block BLKn includes, for example, a plurality of string units SU0, SU1, SU2, and SU3. Hereinafter, it is assumed that the term "string unit SU" refers to each of the string units SU0 to SU3. The string unit SU includes a plurality of NAND strings (or memory strings) NS.

For simplicity of description, an example in which each NAND string NS includes, for example, eight memory cell transistors MT0, MT1, MT2, ..., and MT7 and two select transistors ST1 and ST2 will be described herein. Hereinafter, it is assumed that the term "memory cell transistor MT" refers to each of the memory cell transistors MT0 to MT7.

Each memory cell transistor MT includes a control gate and a charge storage layer, and stores data in a nonvolatile manner. The memory cell transistors MT0 to MT7 are coupled in series between the source of the select transistor ST1 and the drain of the select transistor ST2. The memory cell transistor MT can store 1-bit data or 2-bit or larger data.

The gates of a plurality of select transistors ST1 included in the string unit SU0 are coupled to a select gate line SGD0. Similarly, the gates of the select transistors ST1 in the string units SU1 to SU3 are coupled to respective select gate lines SGD1 to SGD3. The select gate lines SGD0 to SGD3 are independently controlled by the row decoder 18.

The gates of a plurality of select transistors ST2 included in the string unit SU0 are coupled to a select gate line SGS. Similarly, the gates of the select transistors ST2 in the string units SU1 to SU3 are coupled to the select gate line SGS. Individual select gate lines SGS may be respectively coupled to the gates of the select transistors ST2 in the string units SU0 to SU3. The select transistors ST1 and ST2 are used for selection of a string unit SU in various operations.

The control gates of the memory cell transistors MT0 to MT7 included in the block BLKn are coupled to respective word lines WL0 to WL7. Each of word lines WL0 to WL7 is independently controlled by the row decoder 18.

Each of bit lines BL0, BL1, BL2, ..., and BLm (m is a natural number of 0 or more) is coupled to the plurality of blocks BLK0 to BLKn, and is coupled to one NAND string NS in each string unit SU included in the block BLKn. That is, of a plurality of NAND strings NS arranged in a matrix pattern in the block BLKn, each of the bit lines BL0 to BLm is coupled to the drains of the select transistors ST1 of a plurality of NAND strings NS in the same column. A source line SL is coupled to the blocks BLK0 to BLKn. That is, the source line SL is coupled to the sources of the select transistors ST2 included in the block BLKn.

In short, each string unit SU includes a plurality of NAND strings NS that are coupled to different bit lines BL and coupled to the same select gate line SGD. The block BLKn includes a plurality of string units SU sharing the word lines WL. Furthermore, the memory cell array 11 includes the blocks BLK0 to BLKn sharing the bit lines BL.

The block BLKn is, for example, a unit of data erasure. That is, data stored in the memory cell transistors MT included in the block BLKn is erased in a batch. Data in multiple blocks are erased sequentially, one block at a time. In addition, data in multiple blocks are erased concurrently. Data may be erased in units of string units SU or in smaller units.

A plurality of memory cell transistors MT that share the same word line WL in a single string unit SU is referred to as a cell unit CU. A collection of 1-bit data stored in each of the memory cell transistors MT included in the cell unit CU is referred to as a page. The storage capacity of the cell unit CU changes in accordance with the number of bits of data stored in the memory cell transistors MT. For example, a cell unit CU stores 1-page data if each memory cell transistor MT stores 1-bit data, stores 2-page data if each memory cell transistor MT stores 2-bit data, and stores 3-page data if each memory cell transistor MT stores 3-bit data.

A write operation and a read operation are performed on a cell unit CU in units of pages. In other words, a read operation and a write operation are performed on a plurality of memory cell transistors MT coupled to one word line WL provided in one string unit SU in a batch.

The string units provided in the block BLKn are not limited to SU0 to SU3, and the number of string units can be set discretionarily. The number of NAND strings NS included in each string unit SU, and the number of memory cell transistors and select transistors included in each NAND string NS can also be set discretionarily. Furthermore, each memory cell transistor MT may be a metal-oxide-nitride-oxide-silicon (MONOS) type, which uses an insulating film as a charge storage layer, or a floating-gate (FG) type, which uses a conductive layer as a charge storage layer.

1.1.2 Configuration of Row Decoder

Next, the circuit configuration of the row decoder 18 in the semiconductor memory device 10 according to the first embodiment is described. FIG. 3 is a diagram illustrating the circuit configuration of the row decoder 18 in the semiconductor memory device 10. The row decoder 18 includes a plurality of row decoder units RD0, RD1, . . . , and RDn. The row decoder units RD0 to RDn are respectively associated with the blocks BLK0 to BLKn. FIG. 3 illustrates a detailed circuit configuration of the row decoder unit RD0. Circuit configurations of the other row decoder units RDn are similar to that of the row decoder unit RD0.

The row decoder unit RD0 includes, for example, a block decoder BD, transfer gate lines TG and bTG, and transfer switches, e.g., transistors WLSWS, WLSW0, WLSW1, . . . , and WLSW7, WLSWD0, WLSWD1, WLSWD2, WLSWD3, WLSWSu, WLSWD0$u$, WLSWD1$u$, WLSWD2$u$, and WLSWD3$u$. Hereinafter, the term "transistor WLSW" refers to each of the above transistors WLSWS to WLSWD3$u$.

The block decoder BD decodes a block address BAd. The block decoder BD applies predetermined voltages to the transfer gate lines TG and bTG based on a result of decoding the block address BAd. Specifically, the block decoder BD applies, to the transfer gate line bTG, an inversion signal of a signal to be applied to the transfer gate line TG. That is, the voltage applied to the transfer gate line TG and the voltage applied to the transfer gate line bTG are in a complementary relationship.

Each of the transistors WLSWS to WLSWD3$u$ is, for example, a high withstand voltage n-channel MOS field-effect transistor. The gates of the transistors WLSWS to WLSWD3 are coupled to the transfer gate line TG. The gates of the transistors WLSWSu to WLSWD3$u$ are coupled to the transfer gate line bTG. That is, each of the transistors WLSWS to WLSWD3$u$ is controlled by the block decoder BD. The transistors WLSWS to WLSWD3$u$ are also coupled to the voltage generator 17 via voltage supply lines (or, signal lines). The voltage supply lines are shared by a plurality of blocks BLK.

The drain of the transistor WLSWS is coupled to a voltage supply line SGSD. The voltage supply line SGSD is shared by a plurality of blocks BLK, and is used as a global transfer gate line corresponding to the selected block BLKn. The source of the transistor WLSWS is coupled to the select gate line SGS. The select gate line SGS is used as a local transfer gate line provided for each block.

The drains of the transistors WLSW0 to WLSW7 are coupled to the voltage supply lines CG0 to CG7, respectively. Each of the voltage supply lines CG0 to CG7 is used as a global word line shared by a plurality of blocks BLK. The sources of the transistors WLSW0 to WLSW7 are coupled to the word lines WL0 to WL7, respectively. The word lines WL0 to WL7 are respectively used as local word lines provided for each block.

The drains of the transistors WLSWD0 to WLSWD3 are coupled to voltage supply lines SGDD0 to SGDD3, respectively. Each of the voltage supply lines SGDD0 to SGDD3 is shared by a plurality of blocks BLK, and is used as a global transfer gate line corresponding to the selected block BLKn. The sources of the transistors WLSWD0 to WLSWD3 are coupled to the select gate lines SGD0 to SGD3, respectively. Each of the select gate lines SGD0 to SGD3 is used as a local transfer gate line provided for each block.

The drain of the transistor WLSWSu is coupled to a voltage supply line USGS. The source of the transistor WLSWSu is coupled to the select gate line SGS. The drains of the transistors WLSWD0$u$ to WLSWD3$u$ are coupled to the voltage supply line USGD. The sources of the transistors WLSWD0$u$ to WLSWD3$u$ are coupled to the select gate lines SGD0 to SGD3, respectively. Each of the voltage supply lines USGS and USGD is shared by a plurality of blocks BLK, and is used as a global transfer gate line corresponding to a non-selected block BLKn.

With the above-described configuration, the row decoder 18 can select a block BLKn. Specifically, in the various operations, a block decoder BD corresponding to a selected block BLKn applies "H" and "L" level voltages to the transfer gate lines TG and bTG, respectively. A block decoder BD corresponding to a non-selected block BLKn applies "L" and "H" level voltages to the transfer gate lines TG and bTG, respectively.

The row decoder 18 included in the semiconductor memory device 10 according to the first embodiment is not limited to the circuit configuration described above. For example, the number of transistors WLSW included in the row decoder unit RDn may be appropriately changed based on the number of memory cell transistors, select transistors, etc. provided in each block BLKn. In this specification, the transistor WLSW included in the row decoder unit RDn will also be referred to as a "transfer switch WLSW".

1.1.3 Configuration of Sense Amplifier

Figure 4:
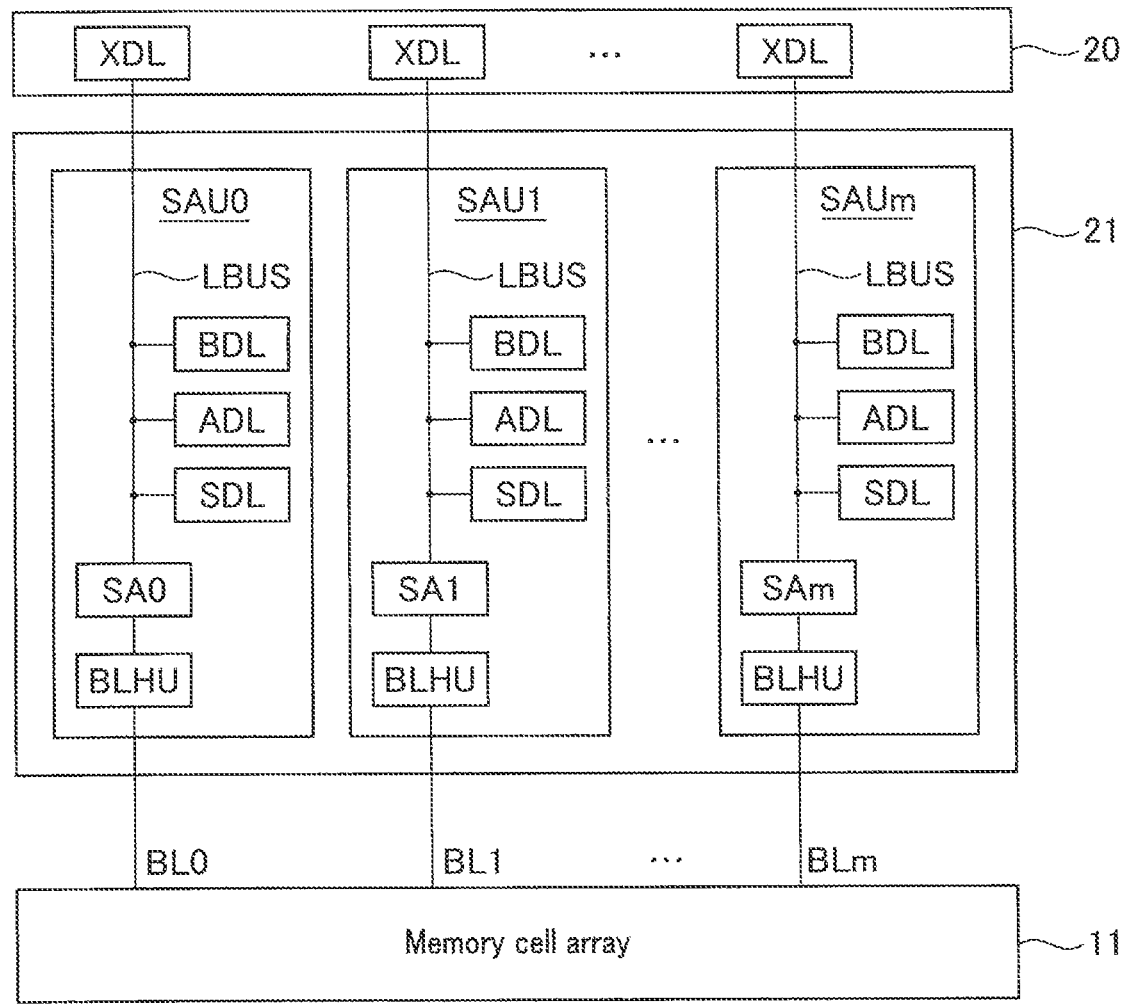
FIG. 4 is a diagram illustrating a circuit configuration of a sense amplifier according to the first embodiment.

Next, a circuit configuration of the sense amplifier 21 in the semiconductor memory device 10 of the first embodiment will be described. FIG. 4 is a diagram illustrating the circuit configuration of the sense amplifier 21 in the semiconductor memory device 10. The sense amplifier 21 includes a plurality of sense amplifier units SAU0, SAU1, . . . , and SAUm (m is a natural number of 0 or more).

The sense amplifier units SAU0 to SAUm are associated with the bit lines BL0 to BLm, respectively. The sense amplifier unit SAUm includes, for example, a sense amplifier section SAm, a bit line hookup BLHU, latch circuits SDL, ADL, and BDL, and a bus LBUS.

In the sense amplifier unit SAUm, the bit line hookup BLHU is coupled between the bit line BLm and the sense amplifier section SAm. For example, in a read operation, the sense amplifier section SAm determines whether read data is "0" or "1" based on a voltage of the bit line BLm. In other words, the sense amplifier section SAm senses and amplifies the voltage read to the bit line BLm, and determines the data stored in the selected memory cell. Each of the latch circuits SDL, ADL, and BDL temporarily stores read data, write data, etc.

Each of the sense amplifier section SAm and the latch circuits SDL, ADL, and BDL is coupled to the bus LBUS, and can mutually transmit and receive data via the LBUS.

A latch circuit XDL included in the data register 20 is coupled to the input/output circuit 12 of the semiconductor memory device 10, and is used to input and output data between the sense amplifier unit SAUm and the input/output circuit 12. The latch circuit XDL may also be used as, for example, a cache memory of the semiconductor memory device 10. For example, even if the latch circuits SDL, ADL, and BDL are in use, the semiconductor memory device 10 can be set to a ready state if the latch circuit XDL is available.

Figure 5:
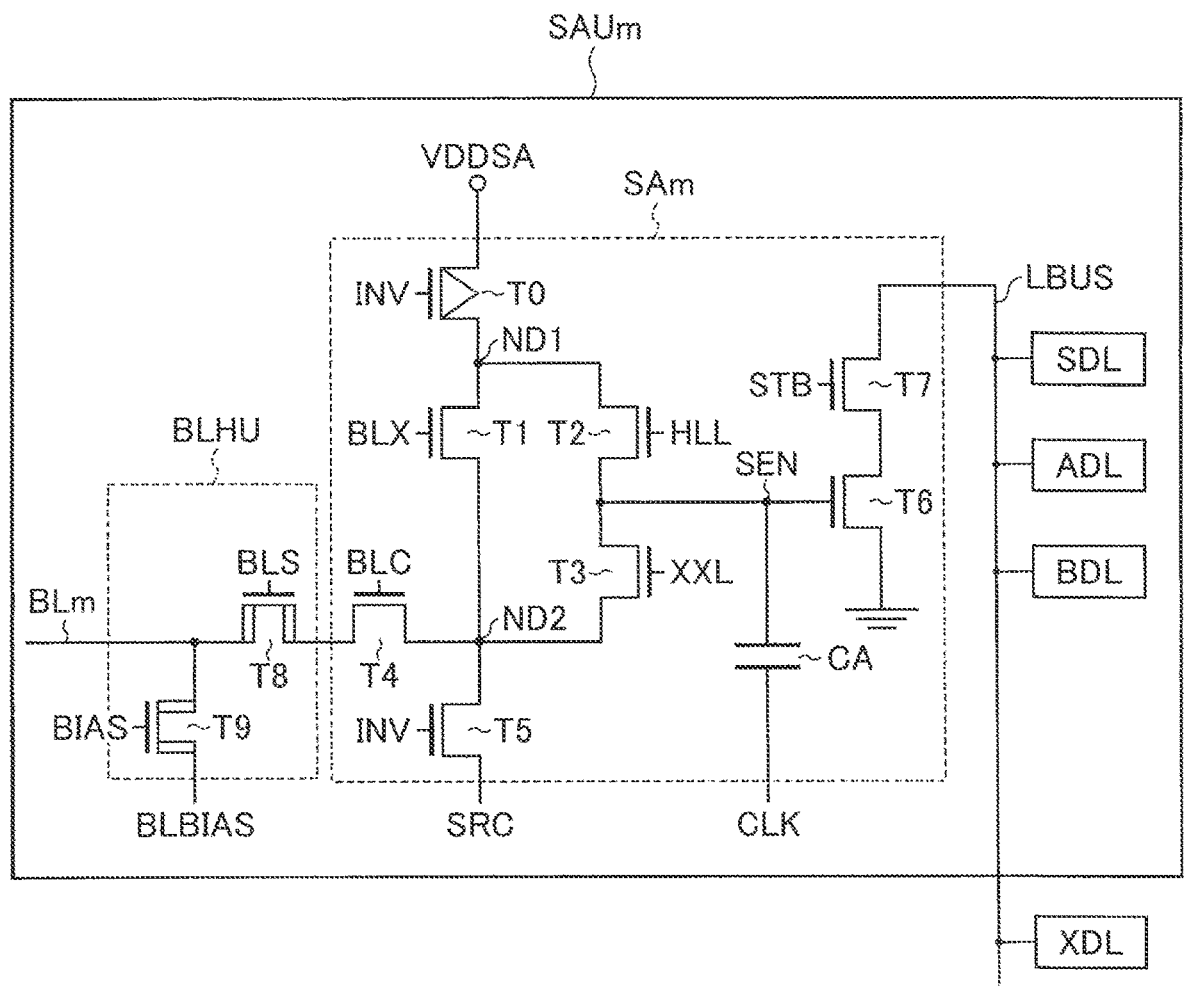
FIG. 5 is a circuit diagram of a sense amplifier unit of the sense amplifier according to the first embodiment.

A configuration of the sense amplifier unit SAUm in the sense amplifier 21 will be described below. FIG. 5 is a circuit diagram of the sense amplifier unit SAUm in the sense amplifier 21. For example, the sense amplifier section SAm includes transistors T0, T1, . . . , and T7 and a capacitor CA. The bit line hookup BLHU includes transistors T8 and T9.

The transistor T0 is, for example, a p-channel MOS field-effect transistor. Each of the transistors T1 to T7 is, for example, an n-channel MOS field-effect transistor. Each of the transistors T8 and T9 is, for example, an n-channel MOS field-effect transistor that has a higher withstand voltage than each of the transistors T0 to T7.

The source of the transistor T0 is coupled to a node of voltage VDDSA. This node is, for example, supplied with the voltage VDDSA from the voltage generator 17. The drain of the transistor T0 is coupled to a node ND1. The gate of the transistor T0 is, for example, coupled to a node INV (not illustrated) of the latch circuit SDL. The drain of the transistor T1 is coupled to the node ND1. The source of the transistor T1 is coupled to a node ND2. A control signal BLX is input to the gate of the transistor T1. The drain of the transistor T2 is coupled to the node ND1. The source of the transistor T2 is coupled to a sense node SEN. A control signal HLL is input to the gate of the transistor T2.

The drain of the transistor T3 is coupled to the sense node SEN. The source of the transistor T3 is coupled to the node ND2. A control signal XXL is input to the gate of the transistor T3. The drain of the transistor T4 is coupled to the node ND2. The source of the transistor T4 is coupled to the drain of the transistor T8. A control signal BLC is input to the gate of the transistor T4. The drain of the transistor T5 is coupled to the node ND2. The source of the transistor T5 is coupled to a node SRC. A ground voltage VSS, for example, is supplied to the node SRC. The gate of the transistor T5 is coupled to a node INV.

The drain of the transistor T7 is coupled to the bus LBUS. The source of the transistor T7 is coupled to the drain of the transistor T6. A control signal STB is input to the gate of the transistor T7. The source of the transistor T6 is, for example, grounded. In other words, a ground voltage VSS is supplied to the source of the transistor T6. The gate of the transistor T6 is coupled to the sense node SEN.

One electrode of the capacitor CA is coupled to the sense node SEN. A clock signal CLK is input to the other electrode of the capacitor CA.

The drain of the transistor T8 is coupled to the source of the transistor T4. The source of the transistor T8 is coupled to the bit line BLm. A control signal BLS is input to the gate of the transistor T8. The drain of the transistor T9 is coupled to a node BLBIAS. An erase voltage VERA, for example, is applied to the node BLBIAS. The source of the transistor T9 is coupled to the bit line BLm. A control signal BIAS is input to the gate of the transistor T9.

In the circuit configuration of the sense amplifier unit SAUm described above, the node INV is a node included in the latch circuit SDL. A voltage of the node INV changes based on data stored in the latch circuit SDL. Each of the control signals BLX, HLL, XXL, BLC, STB, BLS, and BIAS and the clock signal CLK is generated by the sequencer 16, for example. For example, in a read operation, the sense amplifier section SAm determines data read to the bit line BLm based on the timing at which the control signal STB is asserted.

The sense amplifier 21 included in the semiconductor memory device 10 of the first embodiment is not limited to the circuit configuration described above. For example, the number of latch circuits included in the sense amplifier unit SAUm can be changed as appropriate, based on the number of pages stored in each cell unit CU. The sense amplifier section SAm may have other circuit configurations as long as it can determine data read to the bit line BLm. The transistor T9 may be omitted in the bit line hookup BLHU.

1.2 Structure of Semiconductor Memory Device

An example of a structure of the semiconductor memory device 10 according to the first embodiment will be described. In the drawings referred to below, an X direction corresponds to an extending direction of the word lines WL, a Y direction corresponds to an extending direction of the bit lines BL, and a Z direction corresponds to a direction vertical to the surface of the semiconductor substrate included in the semiconductor memory device 10. In the plan views, hatching is appropriately added to make it easier to see the figures. The hatching added in the plan views is not necessarily related to a material and characteristics of a constituent element to which the hatching is added. In each of the plan views and cross-sectional diagrams, interconnects, contacts, interlayer insulating films, etc., are omitted as appropriate to make the figures easy to see.

1.2.1 Overall Structure of Semiconductor Memory Device

Figure 6:
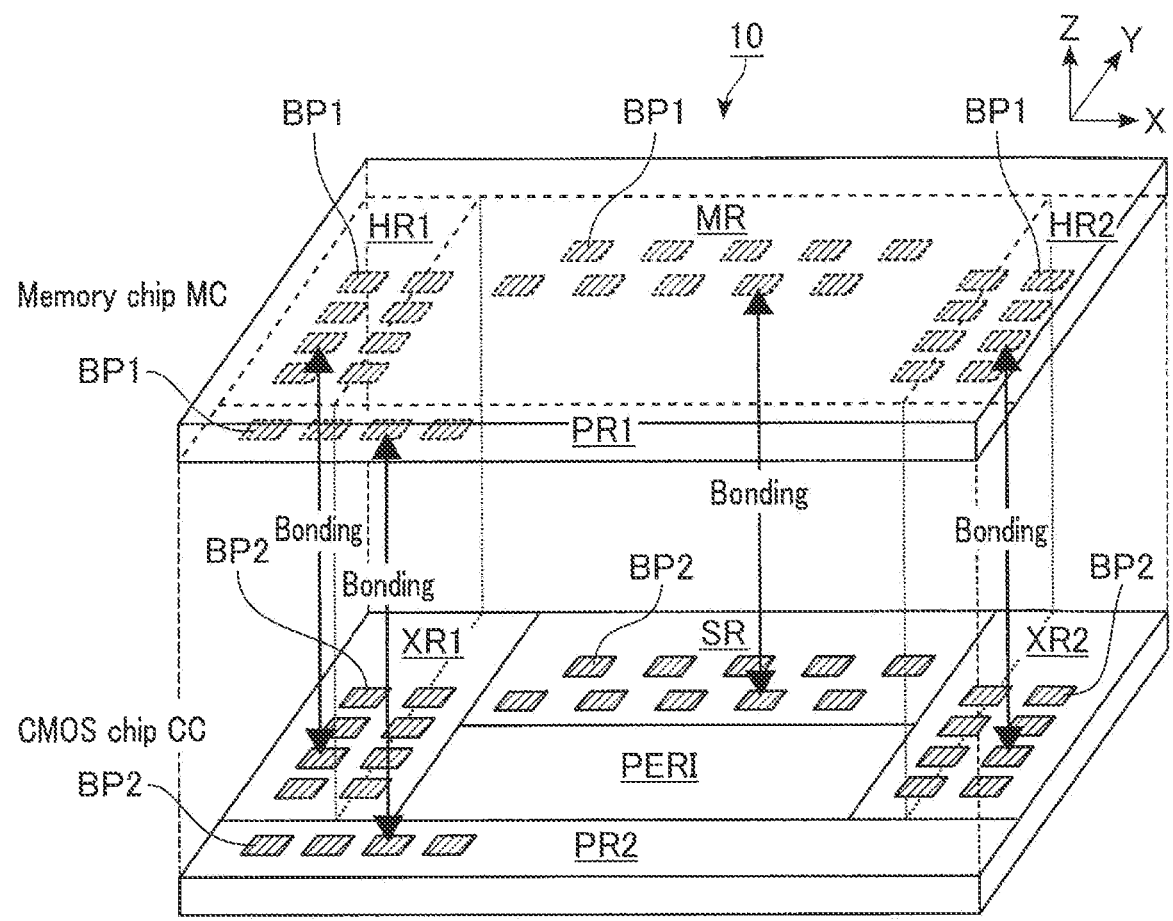
FIG. 6 is a perspective view illustrating an example of a structure of the semiconductor memory device according to the first embodiment.

First, an overall structure of the semiconductor memory device 10 of the first embodiment will be described. FIG. 6 is a perspective view illustrating an example of the overall structure of the semiconductor memory device 10 of the first embodiment. The semiconductor memory device 10 includes a memory chip MC and a CMOS chip CC, and has a structure in which a lower surface of the memory chip MC and an upper surface of the CMOS chip CC are bonded together.

The memory chip MC includes a structure corresponding to the memory cell array 11. The CMOS chip CC includes structures corresponding to, for example, the input/output circuit 12, logic control circuit 13, ready/busy circuit 14, register group 15, sequencer 16, voltage generator 17, row decoder 18, column decoder 19, data register 20, and sense amplifier 21.

An area of the memory chip MC is divided into, for example, a memory region MR, hookup regions HR1 and HR2, and a pad region PR1. The memory region MR occupies most of the memory chip MC and is used for storing data. For example, the memory region MR includes a plurality of NAND strings NS. The hookup regions HR1 and HR2 sandwich the memory region MR in the X direction. That is, the hookup regions HR1 and HR2 are arranged to sandwich the memory region MR in the X direction. The hookup regions HR1 and HR2 are used for coupling between the stacked interconnects (e.g., the word lines WL and the select gate lines SGD and SGS) in the memory chip MC and the row decoder 18 (e.g., the transistors WLSW) in the CMOS chip CC. The pad region PR1 is adjacent to each of the memory region MR and the hookup regions HR1 and HR2 in the Y direction. The pad region PR1 includes, for example, a circuit related to the input/output circuit 12 of the semiconductor memory device 10.

The memory chip MC has a plurality of bonding pads BP1 at lower portions of the memory region MR, hookup regions HR1 and HR2, and pad region PR1. The bonding pads BP1 are also referred to as joint metals, for example.

The bonding pads BP1 in the memory region MR are coupled to associated bit lines BL. The bonding pads BP1 in the hookup regions HR1 and HR2 are coupled to associated interconnects (e.g., the word lines WL and the select gate lines SGD and SGS) of the stacked interconnects provided in the memory region MR. The bonding pads BP1 in the pad region PR1 are coupled to pads (not illustrated) provided on the memory chip MC. The pads provided on the memory chip MC are used, for example, for coupling between the semiconductor memory device 10 and the memory controller 1.

An area of the CMOS chip CC is divided into, for example, a sense amplifier region SR, a peripheral circuit region PERI, transfer regions XR1 and XR2, and a pad region PR2. The sense amplifier region SR and the peripheral circuit region PERI are arranged adjacent to each other in the Y direction and overlap the memory region MR in the Z direction. The sense amplifier region SR includes, for example, the sense amplifier 21 and the column control circuit (e.g., the column decoder 19 and the data register 20). The peripheral circuit region PERI includes, for example, the logic control circuit 13, the ready/busy circuit 14, the register group 15, the sequencer 16, the voltage generator 17, etc.

The transfer regions XR1 and XR2 sandwich the sense amplifier region SR and the peripheral circuit region PERI in the X direction. That is, the transfer regions XR1 and XR2 are arranged to sandwich the sense amplifier region SR and the peripheral circuit region PERI in the X direction. The transfer region XR1 overlaps the hookup region HR1 and a part of the memory region MR in the Z direction. The transfer region XR2 overlaps the hookup region HR2 and a part of the memory region MR in the Z direction. The transfer regions XR1 and XR2 include the plurality of transfer switches in the row decoder 18, i.e., the plurality of transistors WLSW. The pad region PR2 overlaps the pad region PR1 in the memory chip MC in the Z direction. The pad region PR2 includes the input/output circuit 12, etc. of the semiconductor memory device 10.

The CMOS chip CC has a plurality of bonding pads BP2 at upper portions of the sense amplifier region SR, transfer regions XR1 and XR2, and pad region PR2. The bonding pads BP2 are also referred to as joint metals, for example.

The plurality of bonding pads BP2 in the transfer region XR1 respectively overlap the plurality of bonding pads BP1 in the hookup region HR1 in the Z direction. The plurality of bonding pads BP2 in the transfer region XR2 respectively overlap the plurality of bonding pads BP1 in the hookup region HR2 in the Z direction. These bonding pads BP2 are in contact with and bonded to the bonding pads BP1 in the Z direction.

The plurality of bonding pads BP2 in the sense amplifier region SR respectively overlap the plurality of bonding pads BP1 in the memory region MR in the Z direction. These bonding pads BP2 are in contact with and bonded to the bonding pads BP1 in the Z direction.

The plurality of bonding pads BP2 in the pad region PR2 respectively overlap the plurality of bonding pads BP1 in the pad region PR1 in the Z direction. These bonding pads BP2 are in contact with and bonded to the bonding pads BP1 in the Z direction.

As described above, the bonding pads BP1 and BP2 facing each other between the memory chip MC and the CMOS chip CC are bonded together ("Bonding" in FIG. 6). Thereby, the circuits in the memory chip MC and the circuits in the CMOS chip CC are electrically coupled. The bonding pads BP1 and BP2 that form a pair and face each other between the memory chip MC and the CMOS chip CC may have a boundary or may be integrated.

In the semiconductor memory device 10 according to the first embodiment, the widths of the hookup regions HR1 and HR2 in the X direction are different from the widths of the transfer regions XR1 and XR2 in the X direction. Specifically, the width of the transfer region XR1 in the X direction is greater than the width of the hookup region HR1 in the X direction. The width of the transfer region XR2 in the X direction is greater than the width of the hookup region HR2 in the X direction. That is, a part of the transfer region XR1 and a part of the transfer region XR2 overlap the memory region MR.

The bonding pads BP2 in the transfer region XR1 are arranged in an region where the transfer region XR1 and the hookup region HR1 overlap and an region where the transfer region XR1 and the memory region MR overlap. The bonding pads BP1 corresponding to the bonding pads BP2 in the transfer region XR1 are arranged in a region where the hookup region HR1 and the transfer region XR1 overlap and a region where the memory region MR and the transfer region XR1 overlap. Similarly, the bonding pads BP2 in the transfer region XR2 are arranged in a region where the transfer region XR2 and the hookup region HR2 overlap and a region where the transfer region XR2 and the memory region MR overlap. The bonding pads BP1 corresponding to the bonding pads BP2 in the transfer region XR2 are arranged in a region where the hookup region HR2 and the transfer region XR2 overlap and a region where the memory region MR and the transfer region XR2 overlap.

The semiconductor memory device 10 according to the first embodiment is not limited to the structure described above. For example, it suffices that at least one hookup region HR adjacent to the memory region MR is provided. The semiconductor memory device 10 may include a plurality of sets of a memory region MR and a hookup region HR. In this case, a set of a sense amplifier region SR, transfer regions XR, and a peripheral circuit region PERI is appropriately provided in accordance with an arrangement of the memory region MR and the hookup region HR. The arrangement of the memory chip MC and CMOS chip CC may be upside down, or in other words, reversed in the Z direction. In this case, the bonding pads BP1 provided on the upper surface of the memory chip MC and the bonding pads BP2 provided on the lower surface of the CMOS chip CC are bonded together. Furthermore, the pads used for external coupling are provided on the CMOS chip CC.

1.2.2 Structure of Memory Chip MC

Next, a structure of the memory chip MC of the semiconductor memory device 10 according to the first embodiment will be described.

1.2.2.1 Planar Layout of Memory Chip MC

Figure 7:
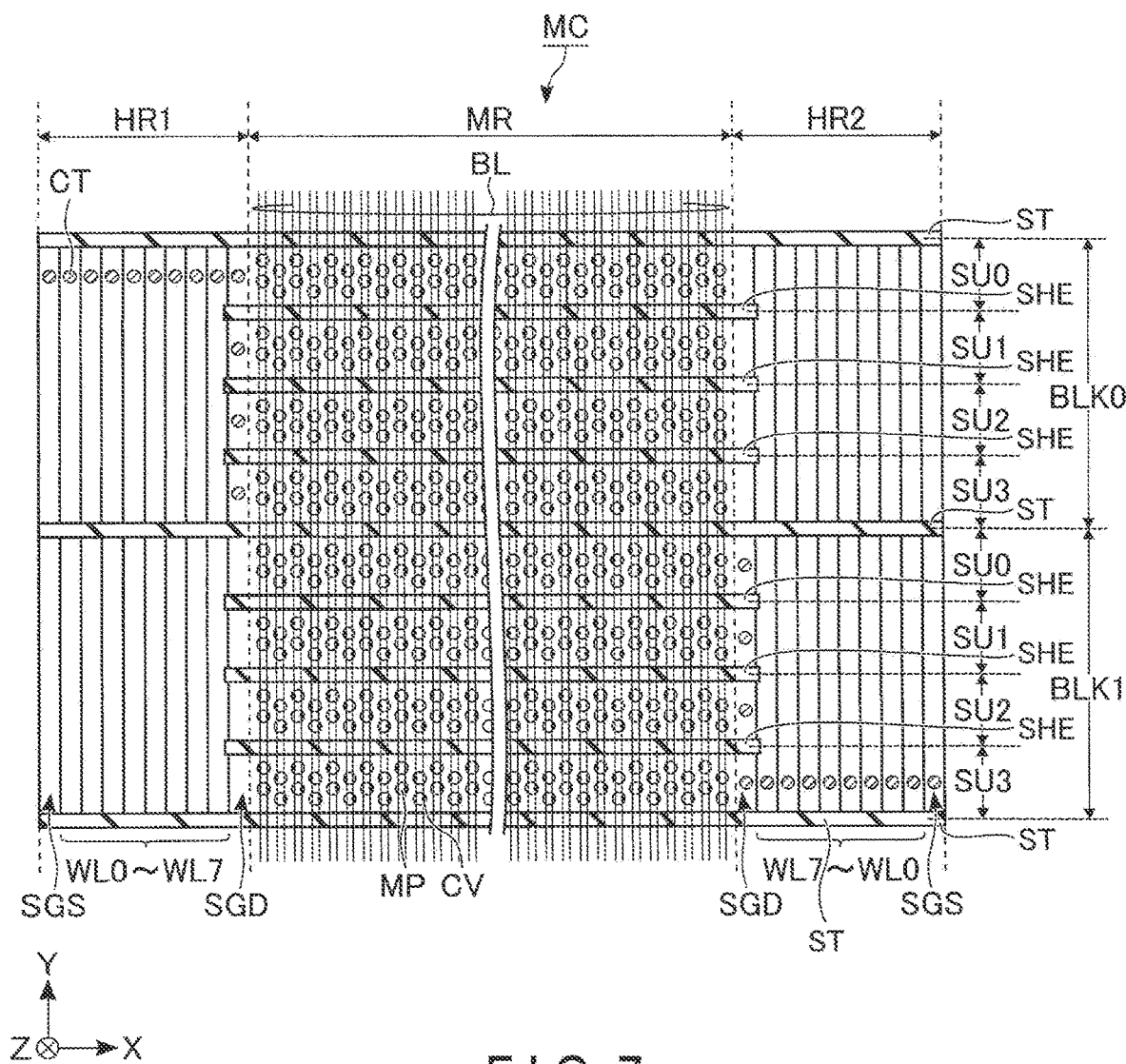
FIG. 7 is a diagram illustrating a planar layout of a memory chip of the semiconductor memory device according to the first embodiment.

A planar layout of the memory chip MC will be described with reference to FIG. 7. FIG. 7 is a diagram illustrating an example of the planar layout of the memory chip MC in the semiconductor memory device 10 according to the first embodiment. FIG. 7 illustrates a region corresponding to the blocks BLK0 and BLK1. As illustrated in FIG. 7, the memory chip MC includes a plurality of slits ST and SHE, a plurality of memory pillars MP, a plurality of bit lines BL, and a plurality of contacts CT and CV.

The plurality of slits ST and SHE are arranged in the Y direction. For example, three slits SHE are arranged between a slit ST and another slit ST. Each of the slits ST and SHE extends in the X direction. Each slit ST crosses the memory region MR and the hookup regions HR1 and HR2. Each slit SHE crosses the memory region MR and the select gate lines SGD in the hookup regions HR1 and HR2. That is, each slit ST or SHE divides and insulates interconnect layers (or conductive layers) that are adjacent to each other with that slit ST or SHE intervening therebetween. Specifically, each slit ST divides and insulates a plurality of interconnect layers respectively corresponding to the word lines WL0 to WL7 and the select gate lines SGD and SGS. Each slit SHE divides and insulates a plurality of interconnect layers respectively corresponding to the word lines WL0 to WL7 and the select gate lines SGD.

Each memory pillar MP functions as one NAND string NS. In a region between adjacent slits ST and SHE in the memory region MR, a plurality of memory pillars MP are arranged, for example, in a four-row staggered manner. In this example, each of the regions partitioned by the slit ST or SHE corresponds to one string unit SU. The number and arrangement of memory pillars MP between any adjacent slits ST or SHE can be changed appropriately.

A plurality of bit lines BL are arranged in the X direction. Each bit line BL extends in the Y direction. In each string unit SU, each bit line BL overlaps at least one memory pillar MP. In this example, two bit lines BL overlap one memory pillar MP. A contact CV is provided between a memory pillar MP and one of the bit lines BL overlapping that memory pillar MP. Each memory pillar MP is coupled to an associated bit line BL via a contact CV.

In each of the hookup regions HR1 and HR2, each of the select gate line SGS, the word lines WL0 to WL7, and the select gate line SGD has a portion (hereinafter, a terrace portion) that does not overlap an upper interconnect layer (or conductive layer). The portion that does not overlap the upper interconnect layer has a shape called a step, a terrace, a rimstone, or the like. Specifically, terrace portions are provided between the select gate line SGS and the word line WL0, between the word line WL0 and the word line WL1, between the word line WL6 and the word line WL7, and between the word line WL7 and the select gate line SGD, respectively. Similarly, each of the word lines WL1 to WL5 has a terrace portion between them and the word line one above.

A plurality of contacts CT are respectively used for coupling between the word lines WL0 to WL7 and select gate lines SGS and SGD and the transistors WLSW in the row decoder 18. Further, the contacts CT are respectively arranged on the terrace portions of the word lines WL0 to WL7 and the select gate lines SGS and SGD. The example indicated here is that the contacts CT on the terrace portions of the word lines WL0 to WL7 and the select gate line SGS are arranged in a row in the X direction, but they may be staggered in the Y direction, respectively.

The contacts CT associated with the block BLK0 are, for example, arranged in the hookup region HR1, and the contacts CT associated with the block BLK1 are arranged in the hookup region HR2. In other words, for example, even-numbered blocks BLK are coupled to the transistors WLSW in the row decoder 18 via the contacts CT in the hookup region HR1. Odd-numbered blocks BLK are coupled to the transistors WLSW in the row decoder 18 via the contacts CT in the hookup region HR2.

In the planar layout of the memory chip MC, the above-described memory region MR and hookup regions HR1 and HR2 are repeatedly arranged in the Y direction. The arrangement of the contacts CT for each block BLK is not limited to the layout described above. For example, if one hookup region HR is omitted, the contacts CT corresponding to each block BLK are collectively arranged in the one-side hookup region HR in contact with the memory region MR. In addition, the contacts CT may be arranged on both sides of the hookup regions HR1 and HR2, and a voltage may be applied from both sides of each block BLK. A hookup region HR may be arranged such that it is sandwiched by memory regions MR.

1.2.2.2 Cross-Sectional Structure of Memory Chip MC

Figure 8:
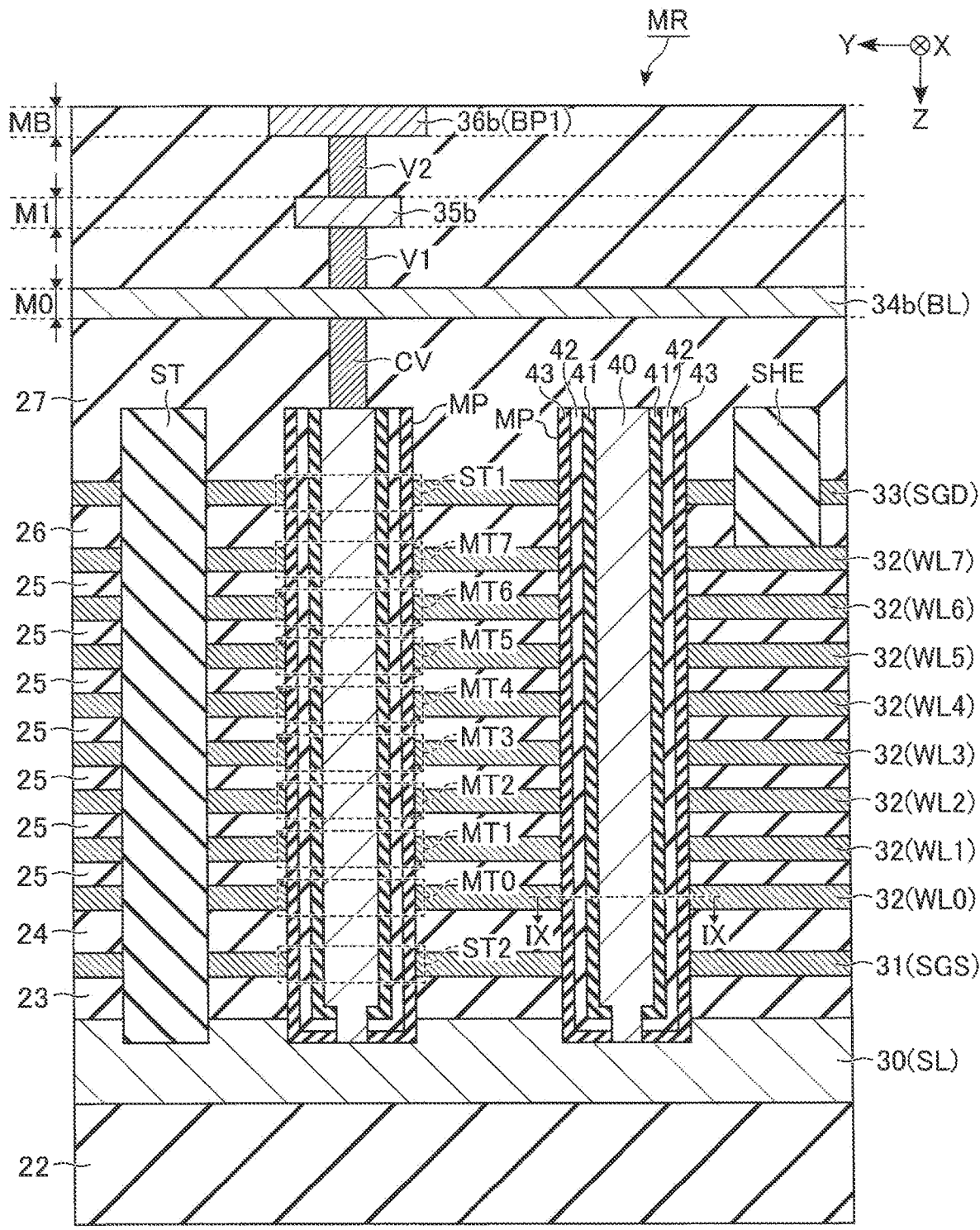
FIG. 8 is a diagram illustrating a cross-sectional structure of a memory region of the semiconductor memory device according to the first embodiment.

A cross-sectional structure of the memory region MR in the memory chip MC will be described with reference to FIG. 8. FIG. 8 is a diagram illustrating an example of the cross-sectional structure of the memory region MR in the semiconductor memory device 10 according to the first embodiment. FIG. 8 illustrates a cross section along the Y direction, including the memory pillars MP and the slits ST and SHE. The Z direction in FIG. 8 is opposite to that in FIG. 6. That is, an upper side of FIG. 8 corresponds to a lower side of FIG. 6, and a lower side of FIG. 8 corresponds to an upper side of FIG. 6. As illustrated in FIG. 8, the memory region MR includes insulating layers 22 to 27, conductive layers 30 to 33, 34b, 35b, and 36b, and contacts CV, V1, and V2.

The insulating layer 22 is provided, for example, in the uppermost layer of the memory chip MC. However, this structure is not restrictive, and an interconnect layer, an insulating layer, or the like may be provided on the insulating layer 22. The conductive layer 30 is provided below the insulating layer 22. The conductive layer 30 is, for example, formed in a plate shape extending along the XY plane, and is used as the source line SL. The conductive layer 30 includes, for example, polysilicon doped with phosphorus.

The insulating layer 23 is provided below the conductive layer 30. The conductive layer 31 is provided below the insulating layer 23. The conductive layer 31 is, for example, formed in a plate shape extending along the XY plane, and is used as the select gate line SGS. The conductive layer 31 contains, for example, polysilicon doped with phosphorus. The select gate line SGS may be constituted by a plurality of conductive layers 31. In the case where the select gate line SGS is constituted by a plurality of conductive layers 31, the plurality of conductive layers 31 may be constituted by conductors that are different from each other.

The insulating layer 24 is provided below the conductive layer 31. The conductive layers 32 and the insulating layers 25 are alternately stacked below the insulating layer 24. Each of the plurality of conductive layers 32 is formed, for example, in a plate shape extending along the XY plane. The plurality of conductive layers 32 are respectively used as the word lines WL0 to WL7 in order from the conductive layer 30 side. The conductive layers 32 contain, for example, tungsten.

The insulating layer 26 is provided below the lowermost conductive layer 32. The conductive layer 33 is provided below the insulating layer 26. The conductive layer 33 is, for example, formed in a plate shape extending along the XY plane, and is used as the select gate line SGD. The select gate line SGD may be constituted by a plurality of conductive layers 33. The conductive layers 33 contain, for example, tungsten.

The insulating layer 27 is provided below the conductive layer 33. The conductive layer 34b is provided below the insulating layer 27. The conductive layer 34b is, for example, formed in a line shape extending in the Y direction, and is used as a bit line BL. That is, in a region that is not illustrated, a plurality of conductive layers 34b are arranged in the X direction. The conductive layers 34b contain, for example, copper. Hereinafter, an interconnect layer provided with the conductive layers 34b will be referred to as M0.

Each memory pillar MP extends along the Z direction. Each memory pillar MP penetrates the insulating layers 23 to 26 and the conductive layers 31 to 33. An upper portion of the memory pillar MP is in contact with the conductive layer 30. A lower portion of the memory pillar MP reaches the conductive layer 27.

Each memory pillar MP includes, for example, a semiconductor layer 40, a tunnel insulating layer (also referred to as a tunnel insulating film) 41, an insulating layer 42, and a block insulating layer 43.

The semiconductor layer 40 extends along the Z direction. For example, a lower end of the semiconductor layer 40 is included in a layer including the insulating layer 27. An upper end of the semiconductor layer 40 is in contact with the conductive layer 30. The tunnel insulating layer 41 is arranged on a side surface of the semiconductor layer 40. The insulating layer 42 is arranged on a side surface of the tunnel insulating layer 41. The block insulating layer 43 is arranged on a side surface of the insulating layer 42.

An intersection between the memory pillar MP and the conductive layer 31 (select gate line SGS) functions as a select transistor ST2. An intersection between the memory pillar MP and each conductive layer 32 (word line WL) functions as a memory cell transistor MT. An intersection between the memory pillar MP and the conductive layer 33 (select gate line SGD) functions as a select transistor ST1. That is, the semiconductor layer 40 functions as channel layers of the memory cell transistors MT0 to MT7 and the select transistors ST1 and ST2. The insulating layer 42 functions as a charge storage layer for the memory cell transistors MT.

A columnar contact CV is provided below the semiconductor layer 40 of each memory pillar MP. In the illustrated region, a contact CV corresponding to one of the two memory pillars MP is shown. In a region that is not illustrated, a contact CV is coupled to the memory pillar MP to which no contact CV is coupled in the illustrated region. One conductive layer 34b (bit line BL) is in contact with a lower surface of the contact CV.

The slit ST is formed in a plate shape at least a part of which extends along the XZ plane, and divides the insulating layers 23 to 26 and the conductive layers 31 to 33. A lower end of the slit ST is included in a layer including the insulating layer 27. An upper end of the slit ST is, for example, in contact with the conductive layer 30. The slit ST contains, for example, silicon oxide ($SiO_2$).

A slit SHE is, for example, formed in a plate shape extending along the XZ plane, and divides the conductive layer 33 and the insulating layer 26. A lower end of the slit SHE is included in a layer including the insulating layer 27. An upper end of the slit SHE is, for example, in contact with the conductive layer 32. The slit SHE contains, for example, silicon oxide ($SiO_2$).

A columnar contact V1 is provided below the conductive layer 34b. A conductive layer 35b is provided below the contact V1. The conductive layer 35b is used as an interconnect that couples circuits in the memory chip MC. Hereinafter, the interconnect layer provided with the conductive layer 35b will be referred to as Ml.

A columnar contact V2 is provided below the conductive layer 35b. A conductive layer 36b is provided below the contact V2. The conductive layer 36b is in contact with an interface of the memory chip MC, and is used as a bonding pad BP1. The conductive layer 36b contains, for example, copper. Hereinafter, an interconnect layer provided with the conductive layer 36b will be referred to as MB. The interconnect layer MB is also provided with conductive layers 36s and 36w to be described later.

Figure 9:
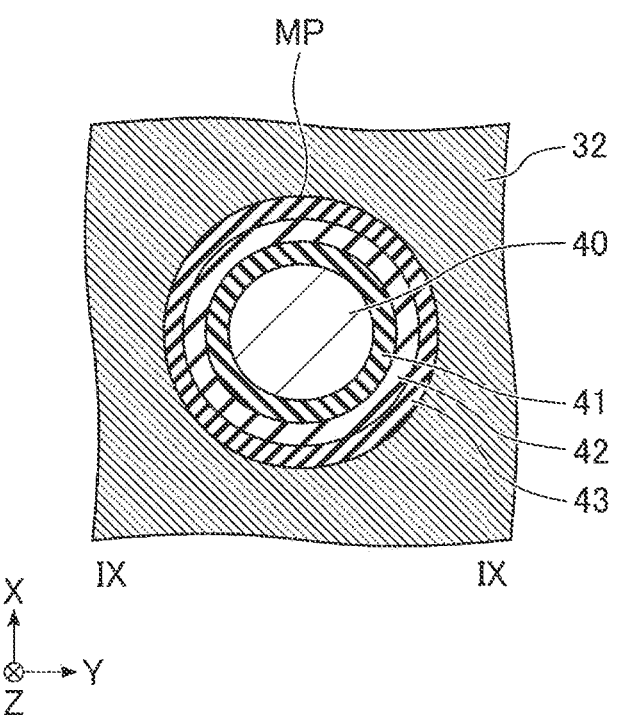
FIG. 9 is a diagram illustrating a cross-sectional structure of a memory pillar of the semiconductor memory device according to the first embodiment.

FIG. 9 is a cross-sectional view taken along line IX-IX in FIG. 8, and illustrates an example of a cross-sectional structure of the memory pillar MP in the semiconductor memory device 10 according to the first embodiment. Specifically, FIG. 9 illustrates a cross section that includes the memory pillar MP and the conductive layer 32 and that is parallel to the surface of the semiconductor substrate included in the semiconductor memory device 10.

As illustrated in FIG. 9, the semiconductor layer 40 is, for example, provided in the central portion of the memory pillar MP. The tunnel insulating layer 41 surrounds the side surface of the semiconductor layer 40. The insulating layer 42 surrounds the side surface of the tunnel insulating layer 41. The block insulating layer 43 surrounds the side surface of the insulating layer 42. The conductive layer 32 surrounds the side surface of the block insulating layer 43. Both of the tunnel insulating layer 41 and the block insulating layer 43 contain, for example, silicon oxide ($SiO_2$). The insulating layer 42 contains, for example, silicon nitride (SiN). Each memory pillar MP may further include an insulating layer inside the semiconductor layer 40, and that insulating layer may be located in the central portion of the memory pillar MP. That is, the semiconductor layer 40 may have an insulating layer formed in a cylindrical shape.

Figure 10:
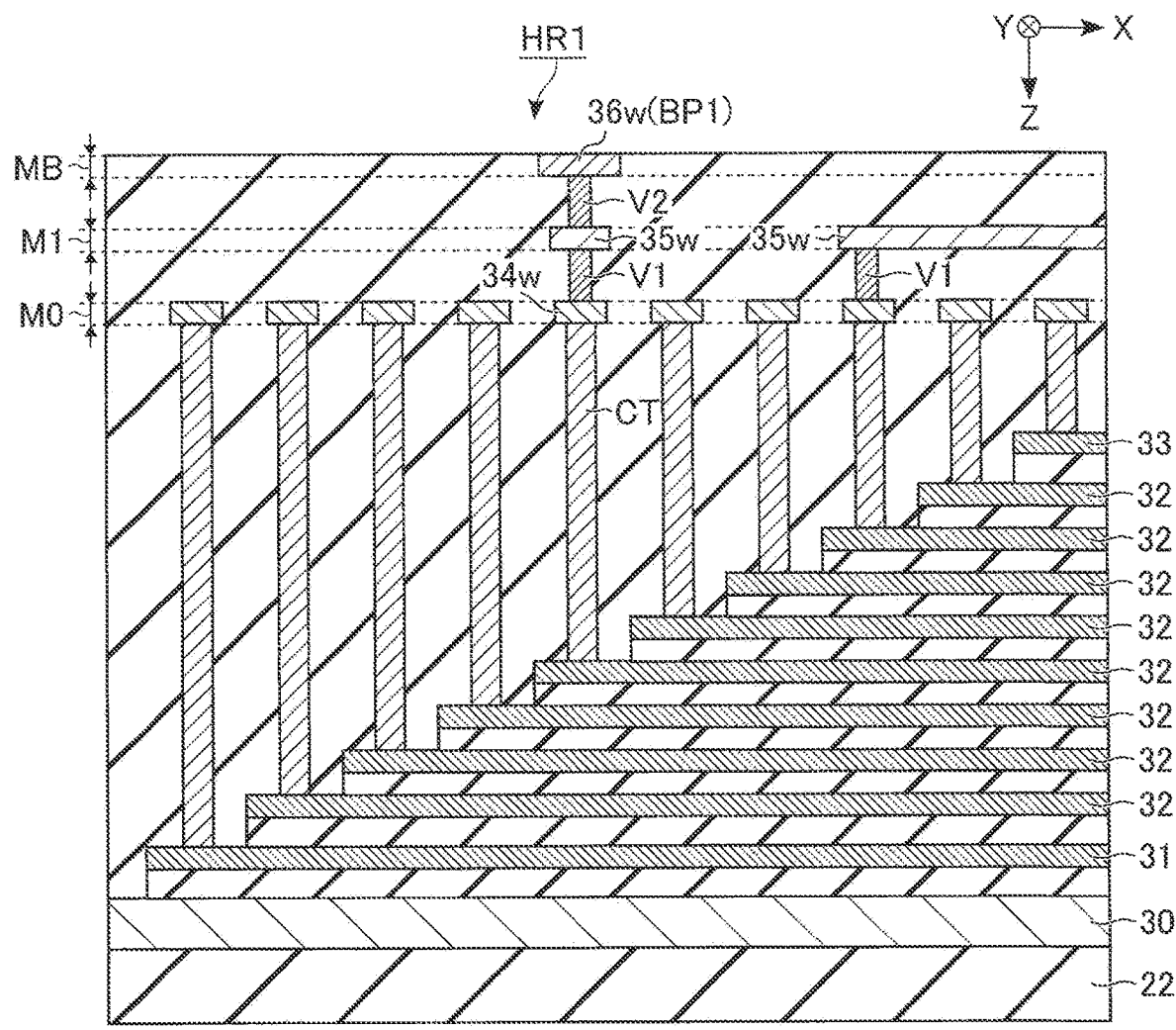
FIG. 10 is a diagram illustrating a cross-sectional structure of a hookup region of the semiconductor memory device according to the first embodiment.

A cross-sectional structure of the hookup region HR1 in the memory chip MC will be described with reference to FIG. 10. FIG. 10 is a diagram illustrating an example of the cross-sectional structure of the hookup region HR1 in the semiconductor memory device 10 according to the first embodiment. FIG. 10 illustrates a cross section corresponding to an even-numbered block BLK included in the hookup region HR1. Similarly to FIG. 8, the Z direction in FIG. 10 is opposite to that shown in FIG. 6. As illustrated in FIG. 10, in the hookup region HR1, the end portions of the select gate line SGS (conductive layer 31), word lines WL0 to WL7 (conductive layers 32), and select gate line SGD (conductive layer 33) are provided like a staircase. Also, the hookup region HR1 is provided with, for example, the contacts CT, V1, and V2, and the conductive layers 34w, 35w, and 36w.

Specifically, the conductive layer 31 has a terrace portion that does not overlap the conductive layers 32 and 33 provided below in the Z direction. Each conductive layer 32 has a terrace portion that does not overlap the conductive layers 32 and 33 provided below in the Z direction. The conductive layer 33 has a terrace portion in the Z direction. The plurality of contacts CT are provided below the respective terrace portions of the conductive layers 31 to 33. A lower portion of each of the plurality of contacts CT is, for example, arranged along the surface provided with the interconnect layer M0. In other words, the lower portion of each of the plurality of contacts CT is located at a substantially equal distance from the conductive layer 30.

The conductive layer 34w, for example, is provided below each contact CT. The conductive layer 34w is included in the interconnect layer M0. The contact V1 is provided below the conductive layer 34w. The conductive layer 35w is provided below the contact V1. The conductive layer 35w is included in an interconnect layer Ml. The contact V2 is provided below the conductive layer 35w. The conductive layer 36w is provided below the contact V2. The conductive layer 36w is included in an interconnect layer MB. That is, the conductive layer 36w is in contact with the interface of the memory chip MC, and is used as a bonding pad BP1. The conductive layer 36w contains, for example, copper.

FIG. 10 illustrates only a set of contacts V1 and V2 and conductive layers 35w and 36w provided on the conductive layer 34w corresponding to the word line WL3. A set of contacts V1 and V2 and conductive layers 35w and 36w is coupled to each of the other conductive layers 34w in a region that is not illustrated. A structure in a region corresponding to an odd-numbered block BLK in the hookup region HR1 is similar to the structure illustrated in FIG. 10 except that the contacts CT are omitted. A structure in a region corresponding to an odd-numbered block BLK in the hookup region HR2 is similar to a structure obtained by inverting the structure illustrated in FIG. 10 with the YZ plane as a symmetry plane.

1.2.3 Structure of CMOS Chip CC

Next, a structure of the CMOS chip CC in the semiconductor memory device 10 according to the first embodiment will be described.

1.2.3.1 Planar Layout of CMOS chip CC

A planar layout of the CMOS chip CC will be described with reference to FIG. 11. FIG. 11 is a diagram illustrating an example of the planar layout of the CMOS chip CC in the semiconductor memory device 10 according to the first embodiment. FIG. 11 illustrates coupling relationships among the blocks BLK, the sense amplifier units SAU, and the row decoder units RDn. In the drawings referred to below, ranges in which the memory region MR, the hookup regions HR1 and HR2, the sense amplifier region SR, and the transfer regions XR1 and XR2 are provided in the X direction are indicated as areas wMR, wHR1, wHR2, wSR, wXR1, and wXR2, respectively. For simplification of description, reference will be made to a case where the memory cell array 11 includes sixteen blocks BLK0 to BLK15 and the row decoder 18 includes row decoder units RD0 to RD15.

The transfer region XR1 includes even-numbered row decoder units RD0, RD2, RD4, RD6, RD8, RD10, RD12, and RD14. The transfer region XR2 includes odd-numbered row decoder units RD1, RD3, RD5, RD7, RD9, RD11, RD13, and RD15. The row decoder units RD0, RD2, RD4, RD6, RD8, RD10, RD12, and RD14 are respectively opposed to the row decoder units RD1, RD3, RD5, RD7, RD9, RD11, RD13, and RD15 in the X direction, with the sense amplifier region SR intervening therebetween. That is, the row decoder units RD0 and RD2 to RD14 and the row decoder units RD1 and RD3 to RD15 are arranged to sandwich the sense amplifier region SR in the X direction.

A plurality of sense amplifier units SAU0 to SAUm, for example, are arranged in the X direction in the sense amplifier region SR.

In the memory region MR, the blocks BLK0 to BLK15 are arranged in the Y direction. The blocks BLK0 to BLK15 are controlled by the row decoder units RD0 to RD15, respectively, as described above. That is, the even-numbered blocks BLK are controlled by the row decoders RD arranged in the transfer region XR1. Further, the odd-numbered blocks BLK are controlled by the row decoders RD arranged in the transfer region XR2.

The above-described arrangement of the blocks BLK, sense amplifier units SAU, and row decoder units RD is merely an example. For example, the arrangement of the row decoder units RD coupled to the respective blocks BLK can be changed appropriately within the transfer regions XR1 and XR2.

1.2.3.2 Cross-Sectional Structure of CMOS Chip CC

Figure 12:
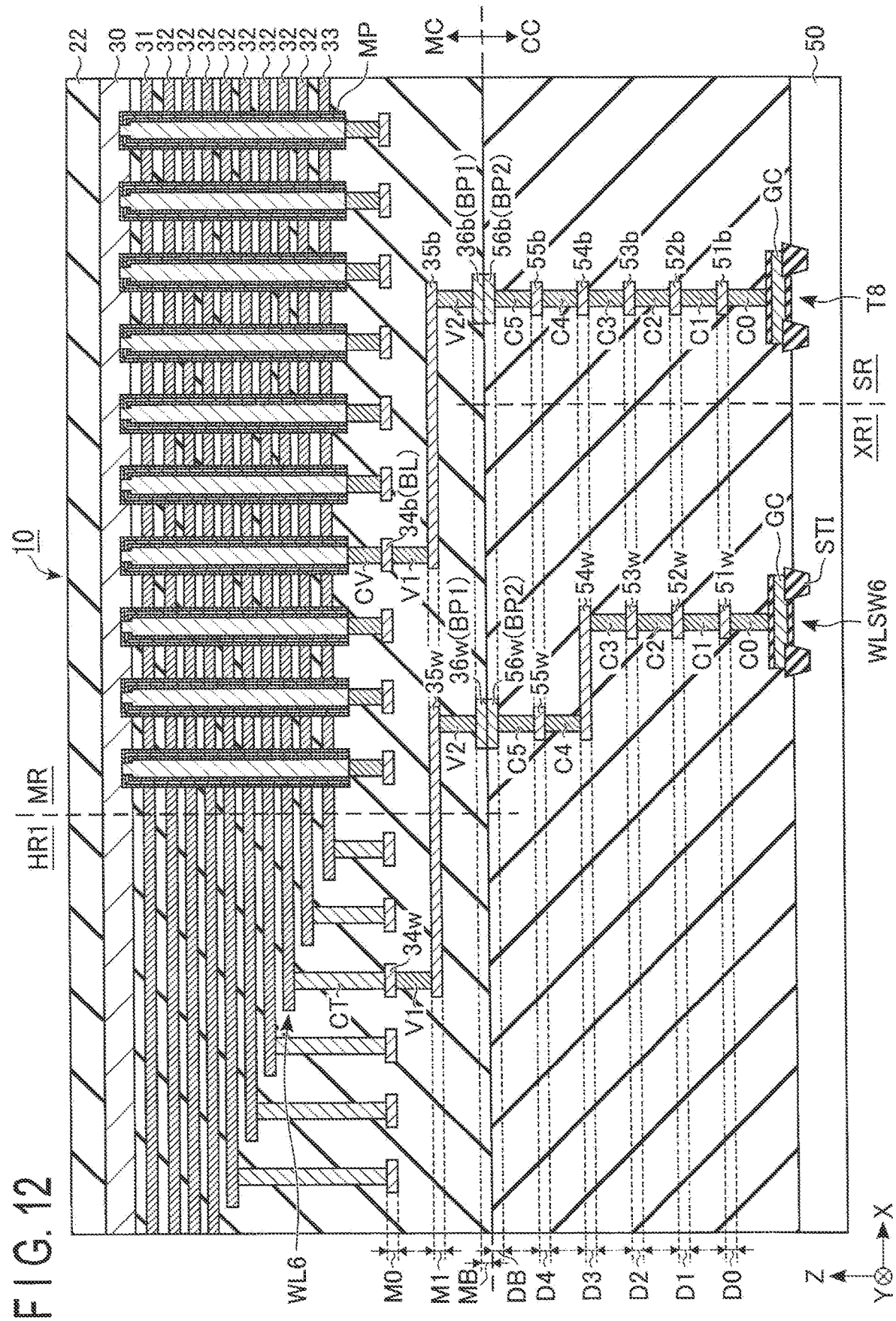
FIG. 12 is a diagram illustrating a cross-sectional structure of the CMOS chip of the semiconductor memory device according to the first embodiment.

A cross-sectional structure of the CMOS chip CC will be described with reference to FIG. 12. FIG. 12 is a diagram illustrating an example of the cross-sectional structure of the CMOS chip CC in the semiconductor memory device 10 according to the first embodiment. FIG. 12 illustrates a structure in which the memory chip MC and the CMOS chip CC are bonded together. FIG. 12 illustrates a configuration corresponding to the transistor WLSW6 in the transfer region XR1 and a configuration corresponding to the transistor T8 in the sense amplifier region SR. As illustrated in FIG. 12, the CMOS chip CC includes, for example, a semiconductor substrate 50, conductive layers GC, 51b, 52b, 53b, 54b, 55b, 56b, 51w, 52w, 53w, 54w, 55w, and 56w, and columnar contacts C0 to C5.

The semiconductor substrate 50 is used for forming the CMOS chip CC and contains, for example, p-type impurities. The semiconductor substrate 50 also includes a plurality of well regions (not illustrated). For example, a transistor is formed in each of the well regions. The well regions are separated by element isolation regions (e.g., shallow trench isolation (STI)).

In the transfer region XR1, the conductive layer GC is provided on the semiconductor substrate 50 with a gate insulating film intervening therebetween. The conductive layer GC in the transfer region XR1 is used, for example, as a gate electrode of the transistor WLSW6 included in the row decoder RD. A source region and a drain region (not illustrated) of the transistor WLSW6 are provided in the well region of the semiconductor substrate 50. Further, the contact C0 is provided on the source region of the transistor WLSW6.

In the transfer region XR1, the conductive layer 51w is provided on the contact C0. The contact C1 is provided on the conductive layer 51w. The conductive layer 52w is provided on the contact C1. The contact C2 is provided on the conductive layer 52w. The conductive layer 53w is provided on the contact C2. The contact C3 is provided on the conductive layer 53w. The conductive layer 54w is provided on the contact C3. The contact C4 is provided on the conductive layer 54w. The conductive layer 55w is provided on the contact C4. The contact C5 is provided on the conductive layer 55w. Further, the conductive layer 56w is provided on the contact C5.

The conductive layer 56w is arranged in the interface between the CMOS chip CC and the memory chip MC, and is used as a bonding pad BP2. The conductive layer 56w in the transfer region XR1 is bonded to the conductive layer 36w opposed thereto in the memory region MR. The conductive layer 36w is arranged in the interface between the memory chip MC and the CMOS chip CC, and is used as a bonding pad BP1. The conductive layer 56w is, for example, electrically coupled to the word line WL6. The conductive layer 56w contains, for example, copper. Although not illustrated, the transfer region XR1 includes a plurality of transistors having the same structure as that of the transistor WLSW6. The structure in the transfer region XR2 is similar to that of the transfer region XR1.

In the sense amplifier region SR, the conductive layer GC is provided on the semiconductor substrate 50 with a gate insulating film intervening therebetween. The conductive layer GC in the sense amplifier region SR is used, for example, as a gate electrode of the transistor T8 included in the sense amplifier unit SAUm. A source region and a drain region (not illustrated) of the transistor T8 are provided in the well region of the semiconductor substrate 50. Further, the contact C0 is provided on the source region of the transistor T8.

In the sense amplifier region SR, the conductive layer 51b is provided on the contact C0. The contact C1 is provided on the conductive layer 51b. The conductive layer 52b is provided on the contact C1. The contact C2 is provided on the conductive layer 52b. The conductive layer 53b is provided on the contact C2. The contact C3 is provided on the conductive layer 53b. The conductive layer 54b is provided on the contact C3. The contact C4 is provided on the conductive layer 54b. The conductive layer 55b is provided on the contact C4. The contact C5 is provided on the conductive layer 55b. Further, the conductive layer 56b is provided on the contact C5.

The conductive layer 56b is arranged in the interface between the CMOS chip CC and the memory chip MC, and is used as a bonding pad BP2. The conductive layer 56b in the sense amplifier region SR is bonded to the conductive layer 36b (bonding pad BP1) opposed thereto in the memory region MR. The conductive layer 56b is, for example, electrically coupled to the conductive layer 34b as a bit line BL. The conductive layer 36b contains, for example, copper. Although not illustrated, the sense amplifier region SR includes a plurality of transistors having the same structure as that of the transistor T8.

In the description below, an interconnect layer provided with the conductive layers 51w and 51b will be referred to as D0. An interconnect layer provided with the conductive layers 52w and 52b will be referred to as D1. An interconnect layer provided with the conductive layers 53w and 53b will be referred to as D2. An interconnect layer provided with the conductive layers 54w and 54b will be referred to as D3. An interconnect layer provided with the conductive layers 55w and 55b will be referred to as D4. Further, an interconnect layer provided with the conductive layers 56w and 56b will be referred to as DB. The interconnect layer DB is also provided with a conductive layer 56s to be described later.

The conductive layers 51w to 55w respectively provided in the interconnect layers D0 to D4 are used as interconnects for coupling the transistor WLSW and the conductive layer 56w. The conductive layers 51b to 55b respectively provided in the interconnect layers D0 to D4 are used as interconnects for coupling the transistor T8 and the conductive layer 56b.

The number of interconnect layers provided in the CMOS chip CC can be designed to be any number. The contacts respectively coupled to the conductive layers 51w to 56w and 51b to 56b may be omitted depending on the circuit design.

A path coupling the word line WL6 and the transistor WLSW6 and a path coupling the bit line BL and the transistor T8 described above are merely examples. An interconnect used for coupling between any one of the word lines WL and the select gate lines SGD and SGS and a transistor WLSW included in the row decoder RD and extending in the X direction may be provided on either the memory chip MC side or the CMOS chip side, or may be provided on both sides. Similarly, an interconnect used for coupling between a bit line BL and a transistor included in a sense amplifier unit SAU and extending in the X direction may be provided on either the memory chip MC side or the CMOS chip side, or may be provided on both sides. In this manner, the layout of the interconnects used for coupling the circuits in the memory chip MC and the circuits in the CMOS chip CC can be appropriately changed.

1.2.4 Structure of Transfer Region XR (Transistor WLSW)

Next, structures of the transfer regions XR1 and XR2 of the CMOS chip CC according to the first embodiment will be described. In the first embodiment, the plurality of transistors WLSW provided in the transfer regions XR1 and XR2 include two types of transistors having different structures. One is a transistor having a structure in which an interconnect (hereinafter, a gate interconnect) including a gate is shared by a plurality of transistors. That is, the transistor has a structure in which the gates of the plurality of transistors WLSW are composed of a conductive layer GC formed integrally and continuously. Hereinafter, the transistors that share one conductive layer GC as the gate will be referred to as gate sharing transistors SH. The other one is a transistor having a structure in which a gate interconnect is separated for each transistor. That is, the transistor has a structure in which the gate of each transistor WLSW is composed of an individually separated conductive layer GC. Hereinafter, each transistor having an individually separated conductive layer GC as the gate will be referred to as a gate separation transistor SE.

The first embodiment is divided into a case where the external shape of the CMOS chip CC is almost the same as that of the memory chip MC and a case where the external shape of the CMOS chip CC is larger than that of the memory chip MC. The case where the external shapes of the CMOS chip CC and the memory chip MC are almost the same is a first example, and the case where the external shape of the CMOS chip CC is larger than that of the memory chip MC is a second example.

1.2.4.1 First Example

Figure 13:
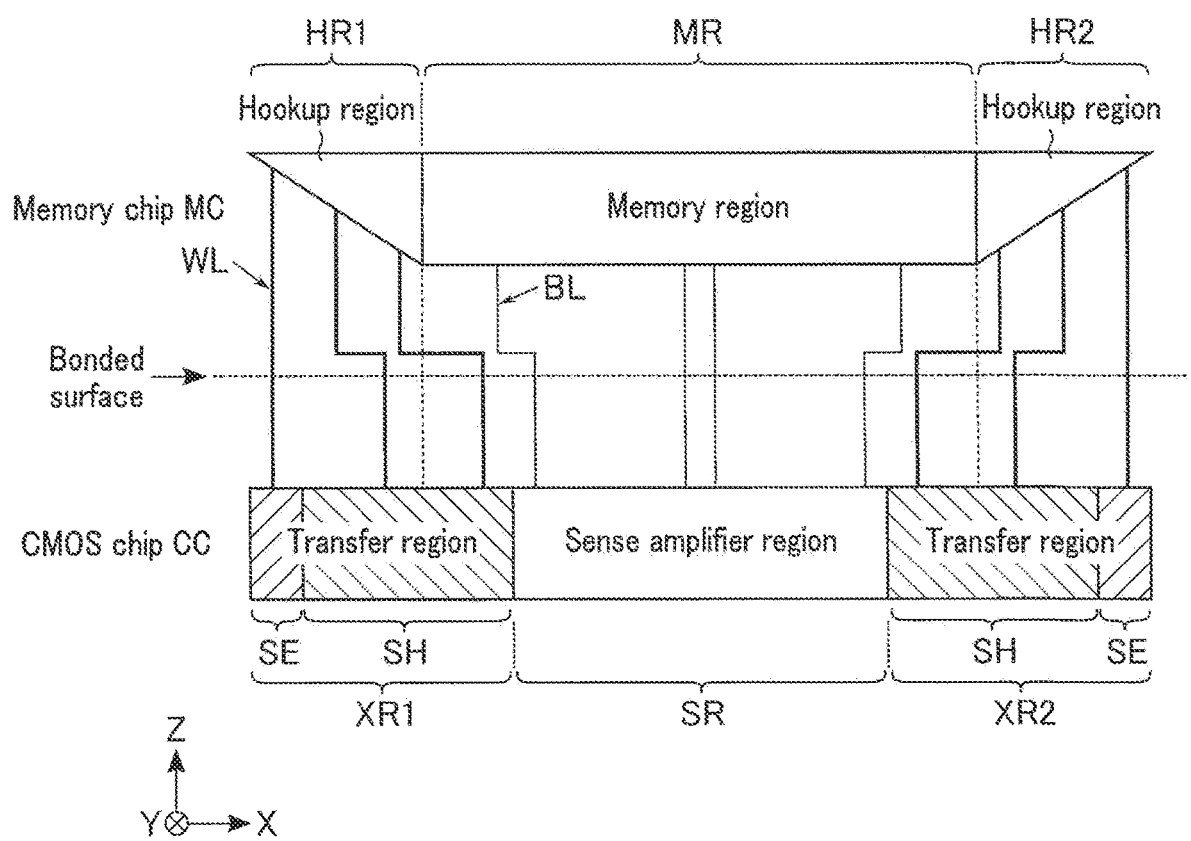
FIG. 13 is a schematic diagram illustrating a structure of a semiconductor memory device of a first example according to the first embodiment.

An outline of a structure of the semiconductor memory device 10 of a first example according to the first embodiment will be described with reference to FIG. 13. FIG. 13 is a schematic diagram illustrating the structure of the semiconductor memory device 10 of the first example. FIG. 13 illustrates a layout of the memory region MR, hookup regions HR1 and HR2, sense amplifier region SR, and transfer regions XR1 and XR2 in the X direction as viewed from the side surface (or the Y direction). In the hookup regions HR1 and HR2, the word lines WL and the select gate lines SGD and SGS are illustrated in the form of an image.

In the X direction, the external shape of the CMOS chip CC substantially coincides with that of the memory chip MC. In other words, as viewed from the Z direction, an outer end portion of the transfer region XR1 in the CMOS chip CC substantially coincides with an outer end portion of the hookup region HR1 in the memory chip MC. An outer end portion of the transfer region XR2 in the CMOS chip CC substantially coincides with an outer end portion of the hookup region HR2 in the memory chip MC.

Further, the sense amplifier region SR and a part of the transfer regions XR1 and XR2 are arranged to overlap the memory region MR in the Z direction. In other words, the semiconductor memory device 10 has a structure in which the memory region MR overlaps the sense amplifier region SR, a part of the transfer region XR1, and a part of the transfer region XR2 as viewed from the Z direction.

Further, some of the word lines WL or the select gate lines SGD and SGS in the memory chip MC are coupled to the transistors WLSW in the transfer regions XR1 and XR2 of the CMOS chip CC by using interconnects orthogonal to the bit lines BL extending in the Y direction. Some of the bit lines BL in the memory chip MC are coupled to the sense amplifier sections SA (or the sense amplifier units SAU) in the sense amplifier region SR of the CMOS chip CC by using interconnects orthogonal to the bit lines BL.

In each of the transfer regions XR1 and XR2, a plurality of transistors WLSW are arranged as described above. In an outer end portion region of the transfer region XR1, a plurality of gate separation transistors SE are arranged as the transistors WLSW. On the other hand, in a region on an inner side (i.e., the sense amplifier region SR side) of the transfer region XR1, in other words, a region other than the outer end portion region of the transfer region XR1, a plurality of gate sharing transistors SH are arranged as the transistors WLSW.

Similarly, in an outer end portion region of the transfer region XR2, a plurality of gate separation transistors SE are arranged as the transistors WLSW. On the other hand, in a region on an inner side (i.e., the sense amplifier region SR side) of the transfer region XR2, in other words, a region other than the outer end portion region of the transfer region XR2, a plurality of gate sharing transistors SH are arranged as the transistors WLSW.

Figure 14:
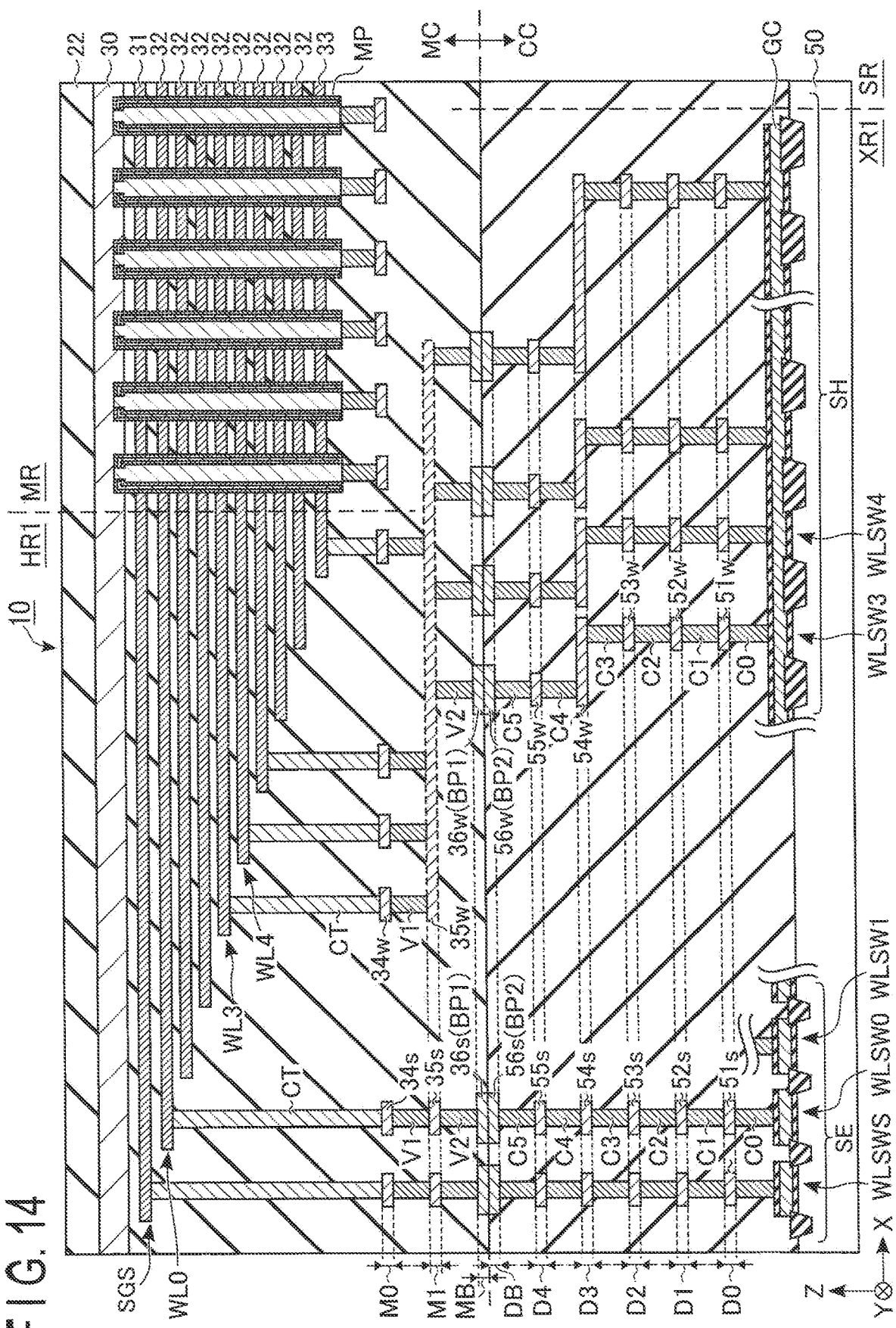
FIG. 14 is a diagram illustrating a cross-sectional structure of a hookup region and a transfer region in the first example according to the first embodiment.

Next, detailed structures of the hookup region HR1 and the transfer region XR1 in the semiconductor memory device 10 will be described with reference to FIG. 14. FIG. 14 is a cross-sectional view along the X direction of the hookup region HR1 and the transfer region XR1 in the first example. Since the structures of the hookup region HR2 and the transfer region XR2 are substantially the same as those of the hookup region HR1 and the transfer region XR1, descriptions thereof will be omitted.

As shown in FIG. 14, in the end portion region on the outer side (i.e., the chip end side) of the transfer region XR1, a plurality of gate separation transistors SE are arranged as the transistors WLSW.

For example, the source of a transistor WLSWS is coupled to a conductive layer 56$s$ via a contact C0, a conductive layer 51$s$, a contact C1, a conductive layer 52$s$, a contact C2, a conductive layer 53$s$, a contact C3, a conductive layer 54$s$, a contact C4, a conductive layer and a contact C5.

The conductive layer 56$s$ is bonded to a conductive layer 36$s$, and is joined to the conductive layer 36$s$. Thereby, the conductive layer 56$s$ is electrically coupled to the conductive layer 36$s$. The conductive layers 56$s$ and 36$s$ are bonding pads BP2 and BP1, respectively.

The conductive layer 36$s$ is coupled to the conductive layer 31 (i.e., a select gate line SGS) via a contact V2, a conductive layer 35$s$, a contact V1, a conductive layer 34$s$, and a contact CT. Thereby, the source of the transistor WLSWS is electrically coupled to the select gate line SGS.

Similarly, for example, the source of a transistor WLSW0 is coupled to a conductive layer 56$s$ via a contact C0, a conductive layer 51$s$, a contact C1, a conductive layer 52$s$, a contact C2, a conductive layer 53$s$, a contact C3, a conductive layer 54$s$, a contact C4, a conductive layer 55$s$, and a contact C5.

The conductive layer 56$s$ is bonded to a conductive layer 36$s$, and is joined to the conductive layer 36$s$. Thereby, the conductive layer 56$s$ is electrically coupled to the conductive layer 36$s$. The conductive layer 36$s$ is coupled to the conductive layer 32 (i.e., a word line WL0) via a contact V2, a conductive layer 35$s$, a contact V1, a conductive layer 34$s$, and a contact CT. Thereby, the source of the transistor WLSW0 is electrically coupled to the word line WL0.

As illustrated in FIG. 14, in the region on the sense amplifier region SR side of the transfer region XR1, a plurality of gate sharing transistors SH are arranged as the transistors WLSW.

For example, the source of a transistor WLSW3 is coupled to a conductive layer 56$w$ via a contact C0, a conductive layer 51$w$, a contact C1, a conductive layer 52$w$, a contact C2, a conductive layer 53$w$, a contact C3, a conductive layer 54$w$, a contact C4, a conductive layer and a contact C5.

The conductive layer 56$w$ is bonded to a conductive layer 36$w$, and is joined to the conductive layer 36$w$. Thereby, the conductive layer 56$w$ is electrically coupled to the conductive layer 36$w$. The conductive layers 56$w$ and 36$w$ are bonding pads BP2 and BP1, respectively.

The conductive layer 36$w$ is coupled to a conductive layer 32 (i.e., a word line WL3) via a contact V2, a conductive layer 35$w$, a contact V1, a conductive layer 34$w$, and a contact CT. Thereby, the source of the transistor WLSW3 is electrically coupled to the word line WL3.

Similarly, for example, the source of a transistor WLSW4 is coupled to a conductive layer 56$w$ via a contact C0, a conductive layer 51$w$, a contact C1, a conductive layer 52$w$, a contact C2, a conductive layer 53$w$, a contact C3, a conductive layer 54$w$, a contact C4, a conductive layer 55$w$, and a contact C5.

The conductive layer 56$w$ is bonded to a conductive layer 36$w$, and is joined to the conductive layer 36$w$. Thereby, the conductive layer 56$w$ is electrically coupled to the conductive layer 36$w$. The conductive layer 36$w$ is coupled to a conductive layer 33 (i.e., a word line WL4) via a contact V2, a conductive layer 35$w$, a contact V1, a conductive layer 34w, and a contact CT. Thereby, the source of the transistor WLSW4 is electrically coupled to the word line WL4.

Next, planar layouts and cross-sectional structures of a gate sharing transistor SH and a gate separation transistor SE will be described.

FIG. 15 is a diagram illustrating an example of the planar layout of the gate sharing transistor SH, illustrating that two gate sharing transistors SH are arranged in the X direction. FIG. 16 is a cross-sectional view taken along line A-A in FIG. 15, illustrating a cross-sectional structure of the gate, source, and drain of the gate sharing transistor SH.

Two active areas AA are provided in the semiconductor substrate 50. An element isolation region (e.g., STI) EI is provided between the two active areas AA. A source SO and a drain DR are provided in each of the active areas AA. A gate insulating film GI is provided on the active area AA between the source SO and the drain DR. A conductive layer GC as the gate is provided on the gate insulating film GI. The conductive layer GC functions as the gate of the two gate sharing transistors SH. The conductive layer GC is formed integrally and continuously on the gate insulating film GI of the two gate sharing transistors SH. Furthermore, a shield layer GS is provided on the element isolation region EI between the active areas AA.

For example, in a write operation, the gate sharing transistor SH operates as follows. As illustrated in FIG. 16, a voltage VPGMH is supplied to the conductive layer GC as the gate. A write voltage VPGM is supplied to the drain DR from the voltage generator 17 via a voltage supply line CG. As a result, the gate sharing transistor SH is turned on and the write voltage VPGM from the voltage generator 17 is supplied to the word line WL through the drain DR and the source SO. The voltage VPGMH is higher than the write voltage VPGM by a threshold voltage of the gate sharing transistor SH or more.

However, the gate sharing transistors have an advantage wherein the gate can be shared by multiple transistors and a gate interconnect can be easily routed, but as described below, a parasitic transistor may be formed and a leakage current may be generated.

Figure 17:
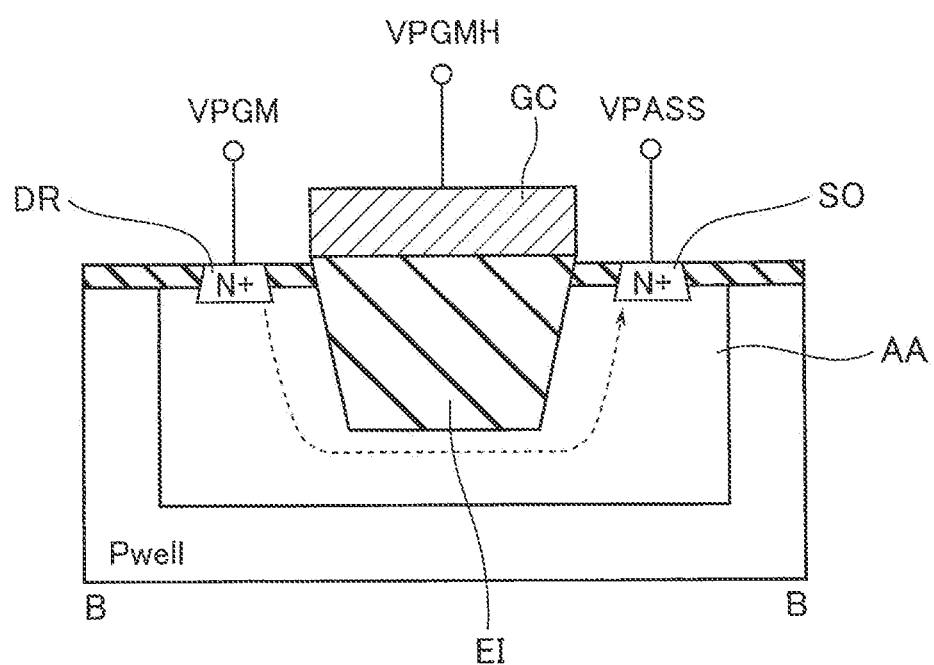
FIG. 17 is a cross-sectional view of the gate sharing transistor according to the first embodiment, taken along line B-B.

FIG. 17 is a cross-sectional view taken along line B-B in FIG. 15, illustrating a cross-sectional structure of the two gate sharing transistors SH and the element isolation region EI. If two gate sharing transistors SH are arranged next to each other, a parasitic transistor may be formed using the conductive layer GC on the element isolation region EI as the gate. If a parasitic transistor is formed, a leakage current flows from the drain DR of one gate sharing transistor SH to the source SO of the other gate sharing transistor SH through the active area AA under the element isolation region EI. To reduce the leakage current generated in the parasitic transistor, in a case where a plurality of gate sharing transistors SH are arranged, a distance Dh between adjacent active areas AA is set to be long.

Figure 18:
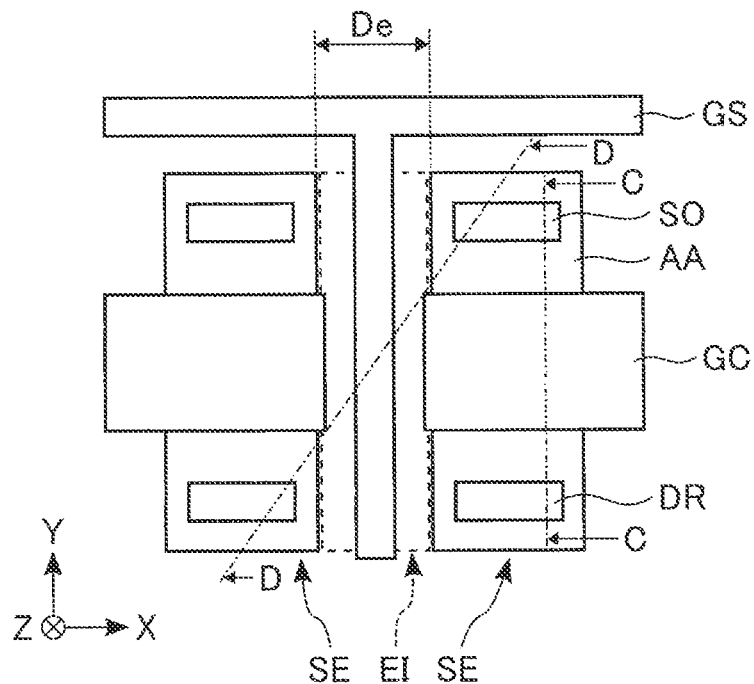
FIG. 18 is a diagram illustrating a planar layout of a gate separation transistor according to the first embodiment.
Figure 19:
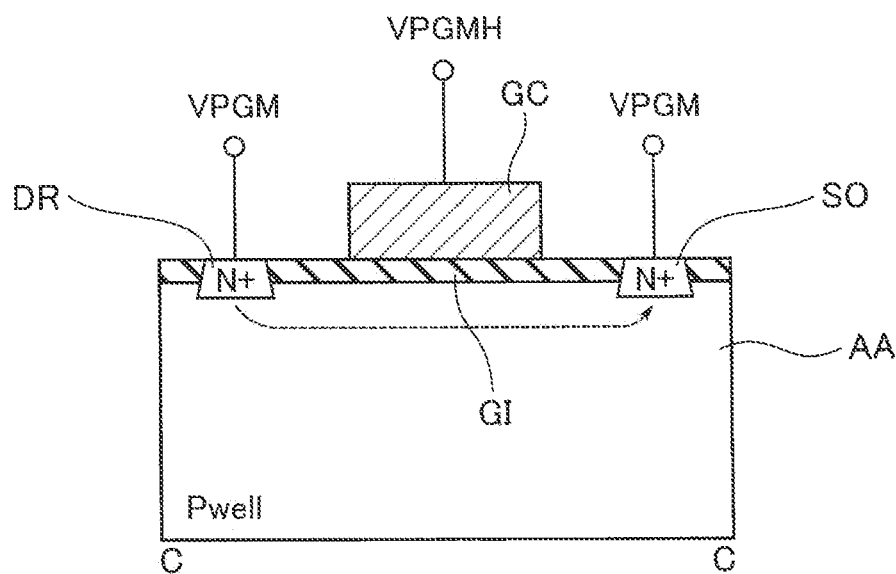
FIG. 19 is a cross-sectional view of the gate separation transistor according to the first embodiment, taken along line C-C.

FIG. 18 is a diagram illustrating an example of a planar layout of gate separation transistors SE, showing that two gate separation transistors SE are arranged in the X direction. FIG. 19 is a cross-sectional view taken along line C-C in FIG. 18, illustrating a cross-sectional structure of the gate, source, and drain of the gate separation transistor SE.

Two active areas AA are provided in the semiconductor substrate 50. An element isolation region EI is provided between the two active areas AA. A source SO and a drain DR are provided in each of the active areas AA. A gate insulating film GI is provided on the active area AA between the source SO and the drain DR. A conductive layer GC as the gate is provided on each gate insulating film GI. The conductive layers GC are arranged on the gate insulating films GI of the gate separation transistors SE, respectively, separated from each other. The conductive layers GC function as the respective gates of the gate separation transistors SE. Further, a shield layer GS is provided on the element isolation region EI between the active areas AA.

Similarly to the gate sharing transistor SH, for example, the gate separation transistor SE operates as follows in a write operation. As illustrated in FIG. 19, a voltage VPGMH is supplied to the conductive layer GC as the gate. A write voltage VPGM is supplied to the drain DR from the voltage generator 17 via a voltage supply line CG. As a result, the gate separation transistor SE is turned on and the write voltage VPGM from the voltage generator 17 is supplied to the word line WL through the drain DR and the source SO.

The gate separation transistors SE have an advantage wherein no parasitic transistor is formed between adjacent gate separation transistors SE and no leakage current is generated, but as described below, the conductive layer GC is separated, so a gate interconnect may not be easily routed.

Figure 20:
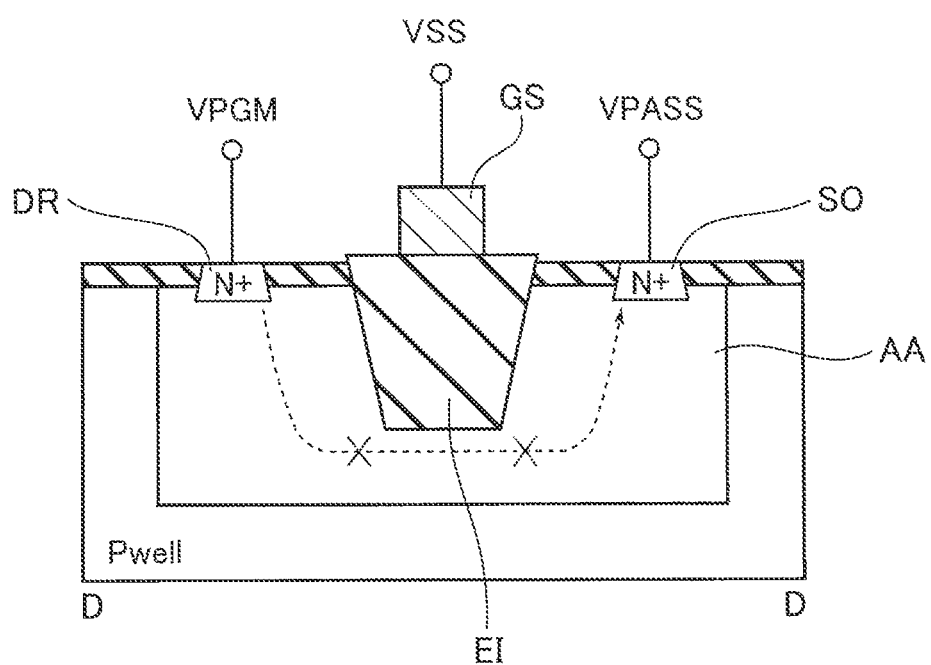
FIG. 20 is a cross-sectional view of the gate separation transistor according to the first embodiment, taken along line D-D.

FIG. 20 is a cross-sectional view taken along line D-D in FIG. 18, illustrating a cross-sectional structure of the two gate separation transistors SE and the element isolation region EI. As illustrated in FIGS. 18 and 20, a shield layer GS is provided on the element isolation region EI between the active areas AA. For example, a ground voltage VSS is supplied to the shield layer GS. This prevents the formation of a parasitic transistor that uses the element isolation region EI as a gate insulating film and reduces the generation of leakage current. Thus, the formation of a parasitic transistor can be prevented, and a distance De between adjacent active areas AA can be set to be short in the gate separation transistors SE. That is, the distance De between active areas AA in adjacent gate separation transistors SE can be set shorter than the distance Dh between active areas AA in adjacent gate sharing transistors SH.

Figure 21:
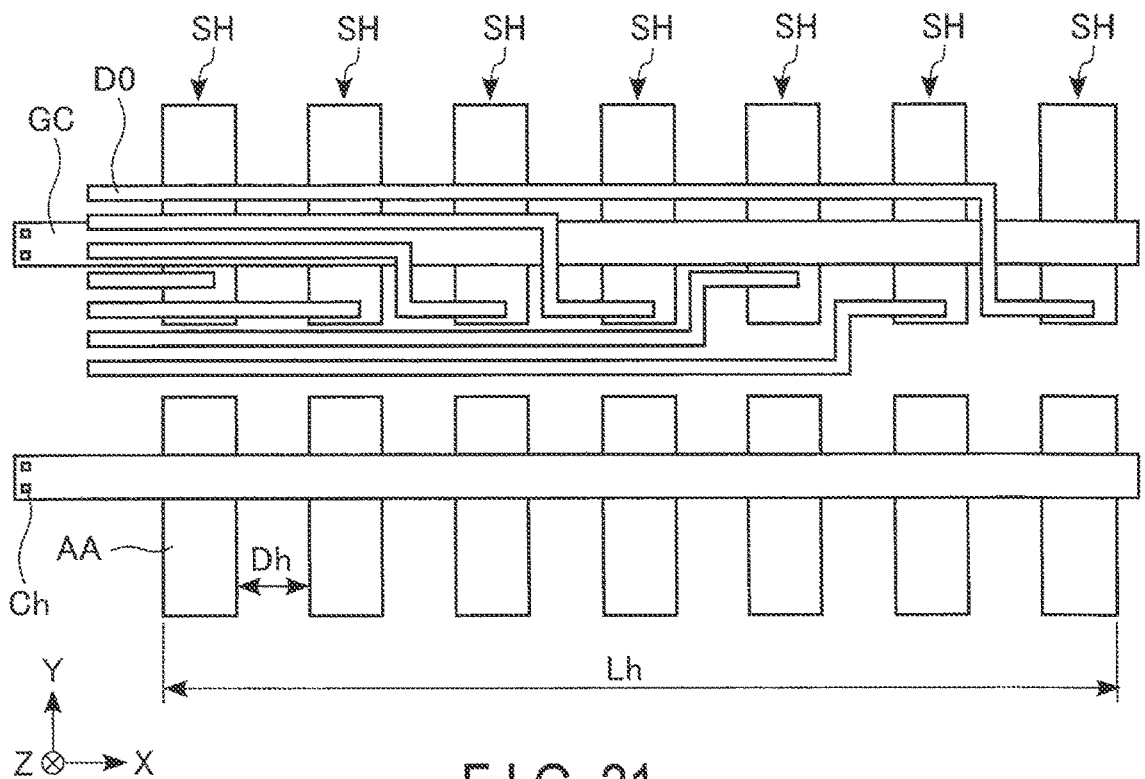
FIG. 21 is a diagram illustrating a planar layout in which the gate sharing transistors are arrayed according to the first embodiment.

Next, a planar layout in which a plurality of gate sharing transistors SH are arranged will be described. FIG. 21 is a diagram illustrating the planar layout in which a plurality of gate sharing transistors SH are arranged. As illustrated in FIG. 21, the plurality of gate sharing transistors SH are arranged in the X direction on the semiconductor substrate. The gates of the gate sharing transistors SH are shared by a conductive layer GC. The conductive layer GC is formed integrally and continuously. The conductive layer GC is coupled to a block decoder BD via a contact Ch, etc.

The drain (or source) of each of the gate sharing transistors SH is, for example, coupled to an interconnect provided in the conductive layer D0.

Figure 22:
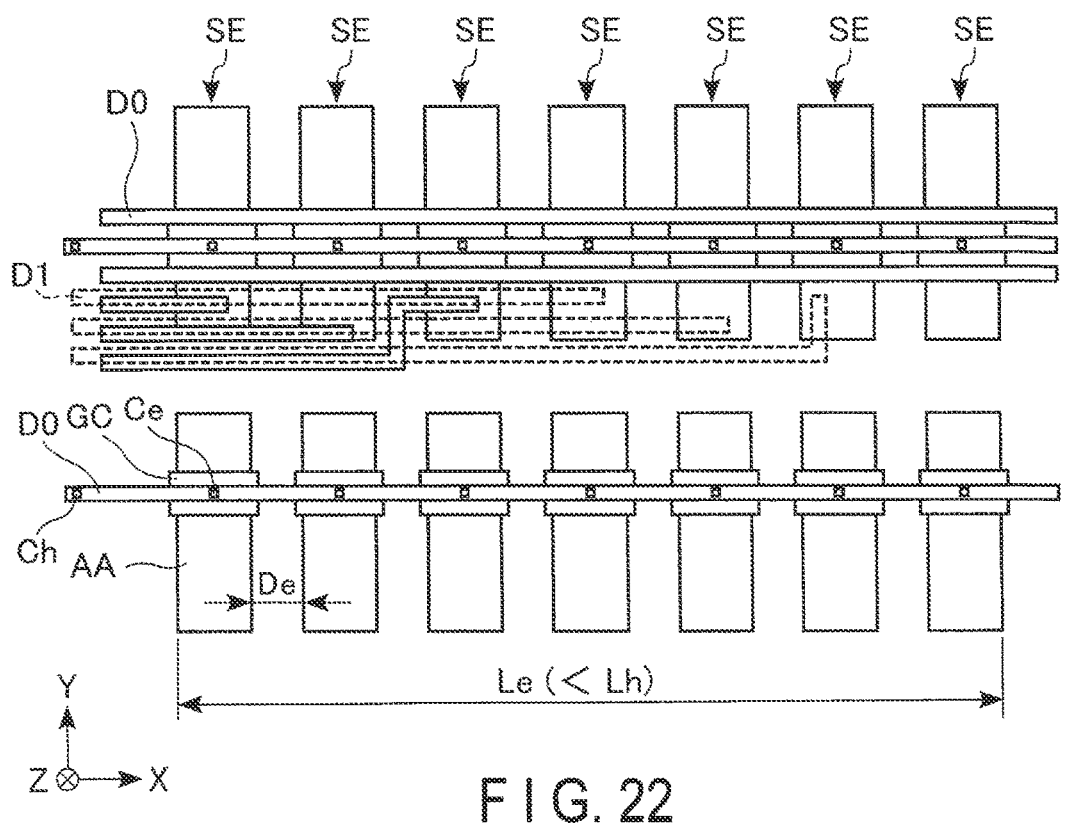
FIG. 22 is a diagram illustrating a planar layout in which the gate separation transistors are arrayed according to the first embodiment.

Next, a planar layout in which a plurality of gate separation transistors SE are arranged will be described. FIG. 22 is a diagram illustrating the planar layout in which a plurality of gate separation transistors SE are arranged. As illustrated in FIG. 22, the plurality of gate separation transistors SE are arranged in the X direction on the semiconductor substrate. The gate of each of the plurality of gate separation transistors SE is composed of each of the conductive layers GC. The conductive layers GC are electrically coupled with one another via the conductive layer D0 and contacts Ce coupled to the conductive layer D0. The conductive layer D0 coupled to the conductive layer GC is coupled to a block decoder BD via a contact Ch, etc.

The drain (or source) of each of the gate separation transistors SE is, for example, coupled to interconnects provided in the conductive layers D0 and D1.

As illustrated in FIGS. 21 and 22, the distance Dh between active areas AA of adjacent gate sharing transistors SH is longer than the distance De between active areas AA of adjacent gate separation transistors SE. That is, a length of an element isolation region EI between adjacent gate sharing transistors SH is longer than a length of an element isolation region EI between adjacent gate separation transistors SE. Thus, a region indicated by Lh required for the arrangement of a plurality of (e.g., seven illustrated in FIG. 21) gate sharing transistors SH requires a larger region than a region indicated by Le required for the arrangement of a plurality of (e.g., seven illustrated in FIG. 22) gate separation transistors SE.

The plurality of gate sharing transistors SH share the gate interconnect (conductive layer GC). On the other hand, the plurality of gate separation transistors SE do not share the gate interconnect, and each of the gate separation transistors SE has its own gate interconnect. Thus, the gate separation transistors SE require the interconnects (conductive layers D0 and D1) for coupling the gate interconnects. Therefore, the gate sharing transistor SH arrangement reduces the interconnects for coupling the gate interconnects required in the gate separation transistor SE arrangement.

1.2.4.2 Second Example

An outline of a structure of a semiconductor memory device 10 of a second example according to the first embodiment will be described with reference to FIG. 23. FIG. 23 is a schematic diagram illustrating the structure of the semiconductor memory device 10 of the second example. Similar to the first example, FIG. 23 illustrates a layout of the memory region MR, hookup regions HR1 and HR2, sense amplifier region SR, and transfer regions XR1 and XR2 in the X direction as viewed from the side surface (or the Y direction). In the hookup regions HR1 and HR2, the word lines WL and the select gate lines SGD and SGS are illustrated in the form of an image.

In the X direction, the external shape of the CMOS chip CC is larger than that of the memory chip MC. In other words, as viewed from the Z direction, the outer end portion of the transfer region XR1 in the CMOS chip CC extends outward from the outer end portion of the hookup region HR1 in the memory chip MC. The outer end portion of the transfer region XR2 in the CMOS chip CC extends outward from the outer end portion of the hookup region HR2 in the memory chip MC.

Further, the sense amplifier region SR and a part of the transfer regions XR1 and XR2 are arranged to overlap the memory region MR in the Z direction. In other words, the semiconductor memory device 10 has a structure in which the memory region MR overlaps the sense amplifier region SR, the part of the transfer region XR1, and the part of the transfer region XR2 as viewed from the Z direction.

A part of the transfer region XR1 is arranged to overlap the hookup region HR1 in the Z direction. A part of the transfer region XR2 is arranged to overlap the hookup region HR2 in the Z direction. In other words, the semiconductor memory device 10 has a structure such that, as viewed from the Z direction, the hookup region HR1 overlaps the part of the transfer region XR1, and further the hookup region HR2 overlaps the part of the transfer region XR2.

Further, some of the word lines WL or the select gate lines SGD and SGS in the memory chip MC are coupled to the transistors WLSW in the transfer regions XR1 and XR2 of the CMOS chip CC by using interconnects orthogonal to the bit lines BL extending in the Y direction. Some of the bit lines BL in the memory chip MC are coupled to the sense amplifier sections SA (or the sense amplifier units SAU) in the sense amplifier region SR of the CMOS chip CC by using interconnects orthogonal to the bit lines BL.

In each of the transfer regions XR1 and XR2, a plurality of transistors WLSW are arranged as described above. In an outer end portion region of the transfer region XR1, a plurality of gate separation transistors SE are arranged as the transistors WLSW. On the other hand, a plurality of gate sharing transistors SH are arranged as the transistors WLSW in a region on an inner side (i.e., on the sense amplifier region SR side) of the transfer region XR1.

Similarly, in an outer end portion region of the transfer region XR2, a plurality of gate separation transistors SE are arranged as the transistors WLSW. On the other hand, a plurality of gate sharing transistors SH are arranged as the transistors WLSW in a region on an inner side (i.e., on the sense amplifier region SR side) of the transfer region XR2.

Figure 24:
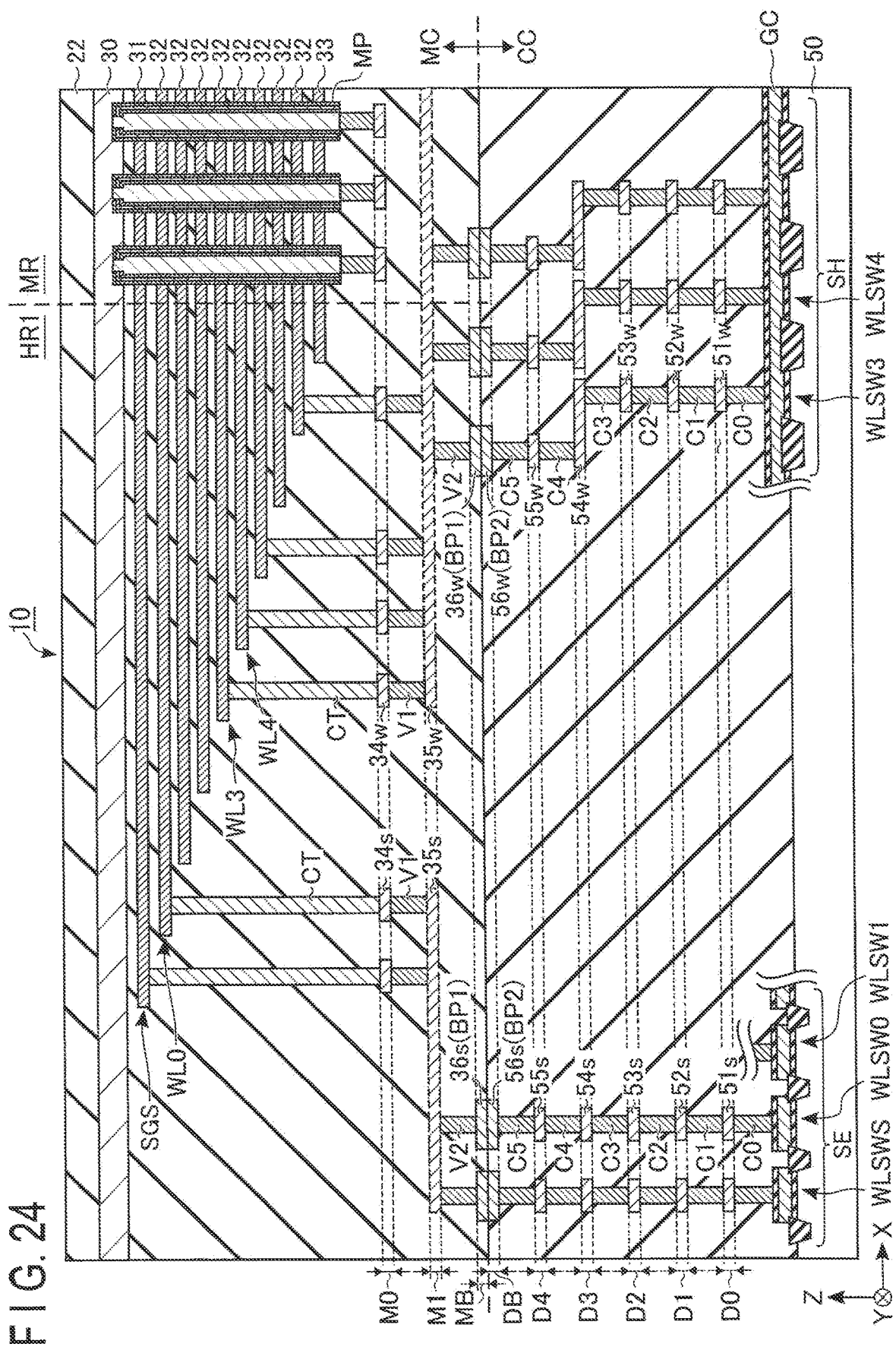
FIG. 24 is a diagram illustrating a cross-sectional structure of a hookup region and a transfer region in the second example according to the first embodiment.

Next, detailed structures of the hookup region HR1 and the transfer region XR1 in the semiconductor memory device 10 will be described with reference to FIG. 24. FIG. 24 is a cross-sectional view along the X direction of the hookup region HR1 and the transfer region XR1 in the second example. Since the structures of the hookup region HR2 and the transfer region XR2 are substantially the same as those of the hookup region HR1 and the transfer region XR1, descriptions thereof will be omitted.

As illustrated in FIG. 24, in the end portion region on the outer side (i.e., the chip end side) of the transfer region XR1, a plurality of gate separation transistors SE are arranged as the transistors WLSW.

For example, the source of a transistor WLSWS is coupled to a conductive layer 56$s$ via a contact C0, a conductive layer 51$s$, a contact C1, a conductive layer 52$s$, a contact C2, a conductive layer 53$s$, a contact C3, a conductive layer 54$s$, a contact C4, a conductive layer 55$s$, and a contact C5.

The conductive layer 56$s$ is bonded to a conductive layer 36$s$, and is joined to the conductive layer 36$s$. Thereby, the conductive layer 56$s$ is electrically coupled to the conductive layer 36$s$. The conductive layers 56$s$ and 36$s$ are used as bonding pads BP2 and BP1, respectively.

The conductive layer 36$s$ is coupled to a conductive layer 31 (i.e., a select gate line SGS) via a contact V2, a conductive layer 35$s$, a contact V1, a conductive layer 34$s$, and a contact CT. For example, the conductive layer 35$s$ is a conductive layer extending to the chip end side beyond the select gate line SGS in the X direction. Thereby, the source of the transistor WLSWS is electrically coupled to the select gate line SGS.

Similarly, for example, the source of a transistor WLSW0 is coupled to a conductive layer 56$s$ via a contact C0, a conductive layer 51$s$, a contact C1, a conductive layer 52$s$, a contact C2, a conductive layer 53$s$, a contact C3, a conductive layer 54$s$, a contact C4, a conductive layer 55$s$, and a contact C5.

The conductive layer 56$s$ is bonded to a conductive layer 36$s$, and is joined to the conductive layer 36$s$. Thereby, the conductive layer 56$s$ is electrically coupled to the conductive layer 36$s$.

The conductive layer 36$s$ is coupled to a conductive layer 32 (i.e., a word line WL0) via a contact V2, a conductive layer 35$s$, a contact V1, a conductive layer 34$s$, and a contact CT. For example, a conductive layer 35$s$ is a conductive layer extending to the chip end side beyond the word line WL0 in the X direction. Thereby, the source of the transistor WLSW0 is electrically coupled to the word line WL0.

The gates of the transistors WLSWS and WLSW0 are composed of individual conductive layers GC, which are separated from each other. That is, the gate interconnects that constitute the gates of the gate separation transistors SE are formed of individual conductive layers GC.

As illustrated in FIG. 24, in the region on the sense amplifier region SR side of the transfer region XR1, the plurality of gate sharing transistors SH are arranged as the transistors WLSW.

For example, the source of a transistor WLSW3 is coupled to a conductive layer 56w via a contact C0, a conductive layer 51w, a contact C1, a conductive layer 52w, a contact C2, a conductive layer 53w, a contact C3, a conductive layer 54w, a contact C4, a conductive layer and a contact C5.

The conductive layer 56w is bonded to a conductive layer 36w, and is joined to the conductive layer 36w. Thereby, the conductive layer 56w is electrically coupled to the conductive layer 36w. The conductive layer 36w is coupled to a conductive layer 32 (i.e., a word line WL3) via a contact V2, a conductive layer 35w, a contact V1, a conductive layer 34w, and a contact CT. For example, the conductive layer 35w is a conductive layer extending from an end portion side of the word line WL3 to the sense amplifier region SR side in the X direction. Thereby, the source of the transistor WLSW3 is electrically coupled to the word line WL3.

Similarly, for example, the source of a transistor WLSW4 is coupled to a conductive layer 56w via a contact C0, a conductive layer 51w, a contact C1, a conductive layer 52w, a contact C2, a conductive layer 53w, a contact C3, a conductive layer 54w, a contact C4, a conductive layer 55w, and a contact C5.

The conductive layer 56w is bonded to a conductive layer 36w, and is joined to the conductive layer 36w. Thereby, the conductive layer 56w is electrically coupled to the conductive layer 36w. The conductive layer 36w is coupled to a conductive layer 32 (i.e., a word line WL4) via a contact V2, a conductive layer 35w, a contact V1, a conductive layer 34w, and a contact CT. For example, the conductive layer 35w is a conductive layer extending from an end portion side of the word line WL4 to the sense amplifier region SR side in the X direction. Thereby, the source of the transistor WLSW4 is electrically coupled to the word line WL4.

The gates of the transistors WLSW3 and WLSW4 are composed of a conductive layer GC formed integrally and continuously. That is, the gate interconnect that constitutes the gates of the gate sharing transistors SH is formed of an integrated and continuous conductive layer GC.

1.3 Advantageous Effect of First Embodiment

According to the first embodiment, it is possible to provide a semiconductor memory device that can reduce the external size or secure a circuit area including a sense amplifier.

An advantageous effect of the first embodiment will be described below.

The semiconductor memory device according to the present embodiment has a structure in which the memory chip MC and the CMOS chip CC are bonded together. In the memory chip MC, a plurality of word lines WL and select gate lines SGD and SGS are stacked. The stacked word lines WL and select gate lines SGD and SGS are coupled to the transistors WLSW via the contacts and lead-out interconnects in the hookup regions HR and transfer regions XR. Further, the transistors WLSW are coupled to the voltage generator 17 via the voltage supply lines.

The external size of the memory chip MC is, for example, mainly determined by the storage capacity of the memory cell array to be mounted in the semiconductor memory device. Thus, in order to reduce the external size (i.e., chip size) of the semiconductor memory device, it is desirable to keep the external size of the CMOS chip CC within the external size of the memory chip MC.

In particular, if interconnects orthogonal to the bit lines BL are used for the lead-out interconnects from the word lines WL and the lead-out interconnects from the bit lines BL, a reduction in the external size of the CMOS chip CC, that is, a reduction in an area of the row decoder 18, transistors WLSW, sense amplifier 21, and column control circuit, contributes directly to the reduction in the external size of the semiconductor memory device.

Here, with respect to the transfer region XR, or the region where the transistors WLSW are arranged, there are two factors that determine its area. The first is the number of lead-out interconnects from the word lines and the size of a region for arranging these lead-out interconnects, and the second is the size of a region occupied by the transistors WLSW.

In the present embodiment, gate sharing transistors SH, in which the gate interconnect is easily routed, are used in a region where the number of lead-out interconnects from the word lines WL is large and these lead-out interconnects are tight, for example, in a transfer region corresponding to a boundary region between the memory region MR and the hookup region HR1 (or HR2) in the CMOS chip CC. That is, gate sharing transistors SH, in which the gate interconnect is shared and no interconnect is required to couple the gate interconnects to each other, are used in a transfer region corresponding to a region where the lead-out interconnects from the word lines are tight. On the other hand, in a region where the number of lead-out interconnects from the word lines WL is relatively small and these lead-out interconnects are sparse, for example, in a transfer region corresponding to an outer end portion region of the hookup region HR1 (or HR2), gate separation transistors SE which can reduce an area occupied by the transistors are used. This allows the transfer region to be reduced and the external size of the semiconductor memory device to be reduced.

Figure 25:
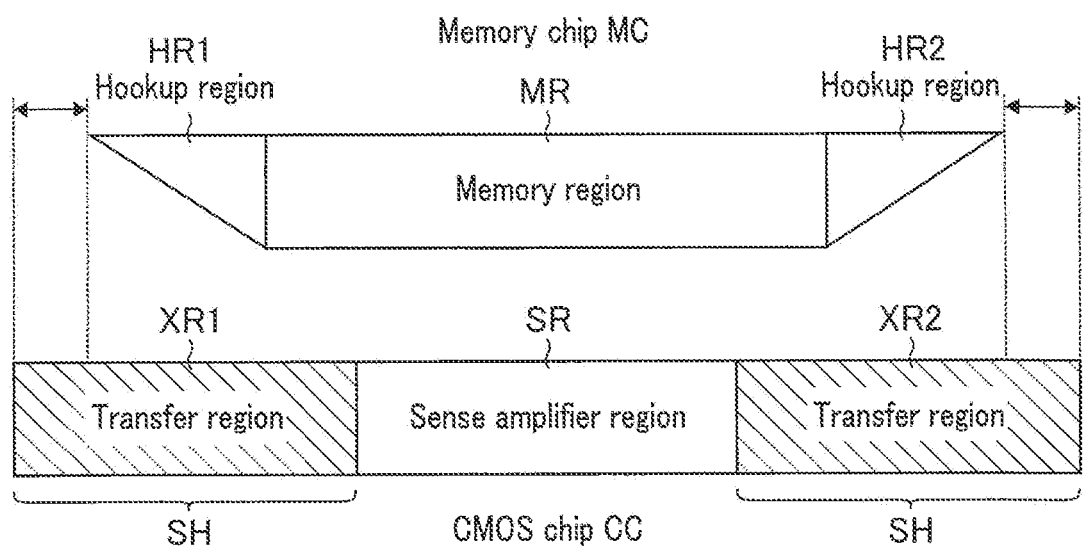
FIG. 25 is a schematic diagram illustrating a structure of a semiconductor memory device of a comparative example.
Figure 26:
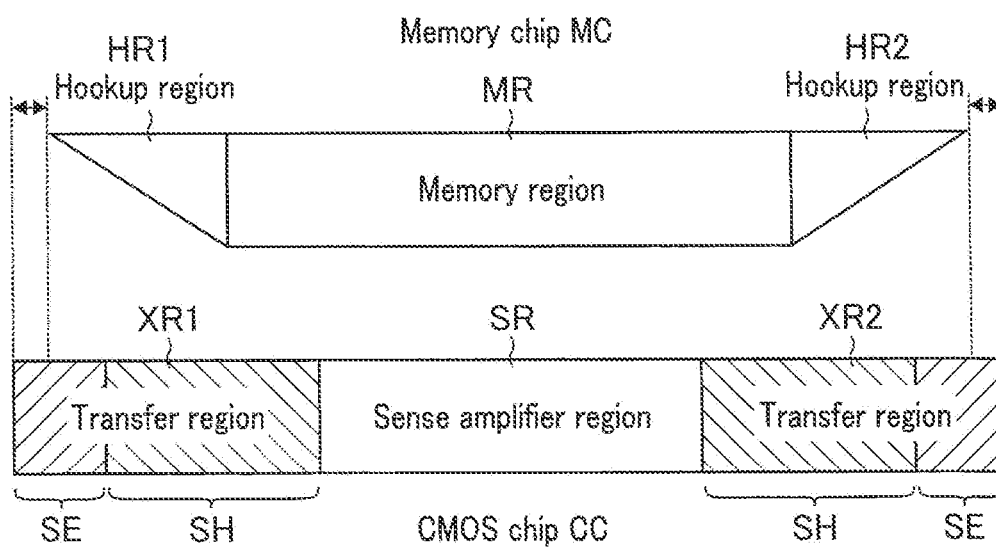
FIG. 26 is a schematic diagram illustrating a structure of the semiconductor memory device according to the first embodiment corresponding to the comparative example.

For example, if the external size of the CMOS chip CC is larger than that of the memory chip MC as illustrated in FIG. 25, the gate sharing transistors SH in the end portion region in the transfer region XR1 are replaced with gate separation transistors SE as illustrated in FIG. 26. The gate sharing transistors SH in the end portion region in the transfer region XR2 are replaced with gate separation transistors SE. This reduces the area of the transfer regions XR1 and XR2, thereby reducing the external size of the semiconductor memory device 10.

Figure 27:
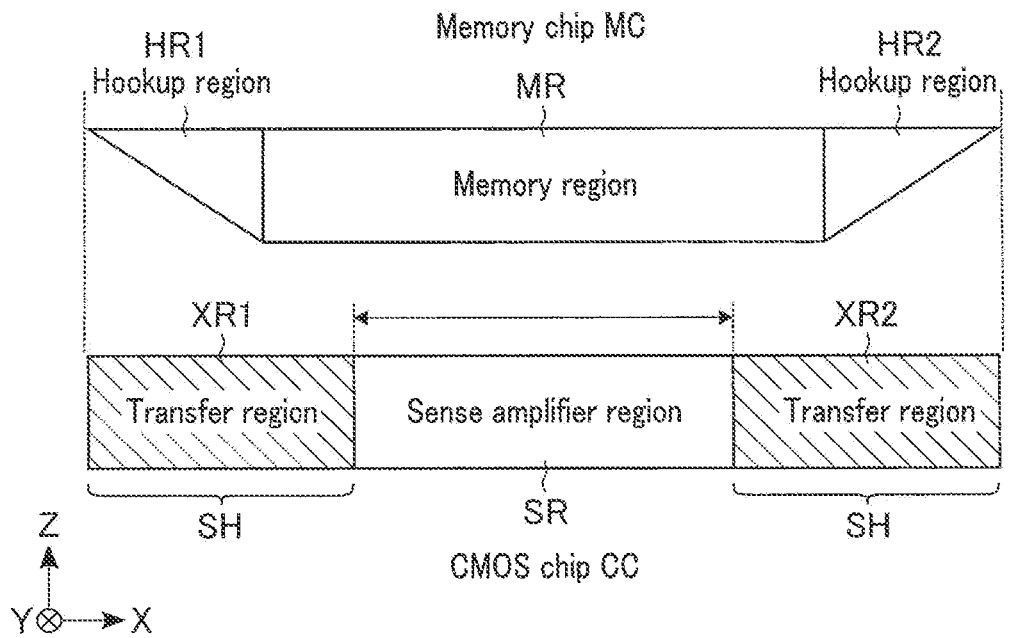
FIG. 27 is a schematic diagram illustrating a structure of a semiconductor memory device of another comparative example.
Figure 28:
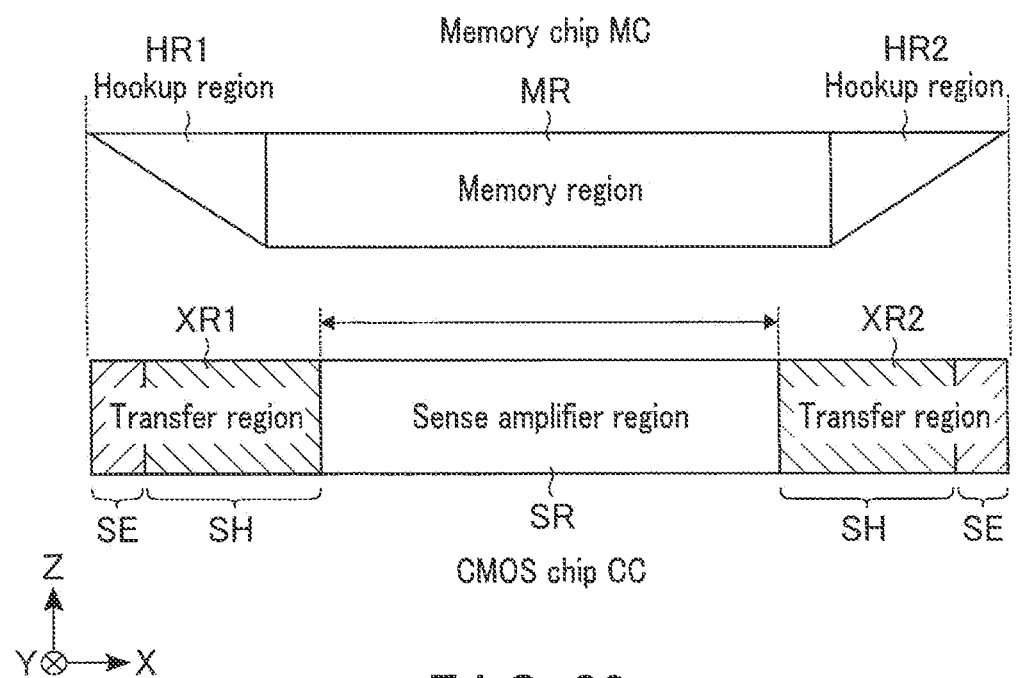
FIG. 28 is a schematic diagram illustrating a structure of the semiconductor memory device according to the first embodiment corresponding to another comparative example.

If the external sizes of the memory chip MC and the CMOS chip CC are substantially the same as illustrated in FIG. 27, the gate sharing transistors SH in the end portion region in the transfer regions XR1 and XR2 are similarly replaced with gate separation transistors SE as illustrated in FIG. 28. This reduces the area of the transfer regions XR1 and XR2. In this case, a sufficient sense amplifier region SR can be secured to arrange the sense amplifier 21 and the column control circuit.

As described above, according to the semiconductor memory device of the first embodiment, it is possible to reduce the external size. Further, an arrangement area of the sense amplifier region SR, including the sense amplifier 21 and the column control circuit, can be secured.

2. Second Embodiment

A semiconductor memory device according to a second embodiment will be described. In the first embodiment, the gate separation transistor SE as a transistor WLSW is arranged only on the end portion side of the CMOS chip, but in the second embodiment, an example will be described in which the gate separation transistor SE is arranged on both the end portion side of the CMOS chip and the side where the sense amplifier 21 is arranged.

In the second embodiment, circuit configurations and structures that will not be described such as a circuit configuration of the semiconductor memory device are similar to those of the first embodiment. The description of the second embodiment will focus mainly on the points different from the first embodiment.

2.1 Structure of Transfer Region XR (Transistor WLSW)

Structures of transfer regions XR1 and XR2 of a CMOS chip CC according to the second embodiment will be described. In the second embodiment, as in the first embodiment, a case where the external shape of the CMOS chip CC is almost the same as that of the memory chip MC is taken as a first example, and a case where the external shape of the CMOS chip CC is larger than that of the memory chip MC is taken as a second example.

2.1.1 First Example

An outline of a structure of a semiconductor memory device 10 of the first example according to the second embodiment will be described with reference to FIG. 29. FIG. 29 is a schematic diagram illustrating the structure of the semiconductor memory device 10 of the first example. FIG. 29 illustrates a layout of the memory region MR, hookup regions HR1 and HR2, sense amplifier region SR, and transfer regions XR1 and XR2 in the X direction as viewed from the side surface (or the Y direction). In the hookup regions HR1 and HR2, the word lines WL and the select gate lines SGD and SGS are illustrated in the form of an image.

In the X direction, the external shape of the CMOS chip CC substantially coincides with that of the memory chip MC. In other words, as viewed from the Z direction, an outer end portion of the transfer region XR1 in the CMOS chip CC substantially coincides with an outer end portion of the hookup region HR1 in the memory chip MC. An outer end portion of the transfer region XR2 in the CMOS chip CC substantially coincides with an outer end portion of the hookup region HR2 in the memory chip MC.

Further, the sense amplifier region SR and a part of the transfer regions XR1 and XR2 are arranged to overlap the memory region MR in the Z direction. In other words, the semiconductor memory device 10 has a structure such that, as viewed from the Z direction, the sense amplifier region SR, the part of the transfer region XR1, and the part of the transfer region XR2 overlap the memory region MR.

Further, some of the word lines WL or the select gate lines SGD and SGS in the memory chip MC are coupled to the transistors WLSW in the transfer regions XR1 and XR2 of the CMOS chip CC by using interconnects orthogonal to the bit lines BL extending in the Y direction. Some of the bit lines BL in the memory chip MC are coupled to the sense amplifier sections SA (or sense amplifier units SAU) in the sense amplifier region SR of the CMOS chip CC by using interconnects orthogonal to the bit lines BL.

In the outer end portion region of the transfer region XR1, a plurality of gate separation transistors SE are arranged as the transistors WLSW. In the inner region on the sense amplifier region SR side of the transfer region XR1, a plurality of gate separation transistors SE are arranged as the transistors WLSW. Further, a plurality of gate sharing transistors SH are arranged as the transistors WLSW in a central region between the outer end portion region and the inner region on the sense amplifier region SR side of the transfer region XR1.

Similarly, in the outer end portion region of the transfer region XR2, a plurality of gate separation transistors SE are arranged as the transistors WLSW. In the inner region on the sense amplifier region SR side of the transfer region XR2, a plurality of gate separation transistors SE are arranged as the transistors WLSW. Further, a plurality of gate sharing transistors SH are arranged as the transistors WLSW in a central region between the outer end portion region and the inner region on the sense amplifier region SR side of the transfer region XR2.

Figure 30:
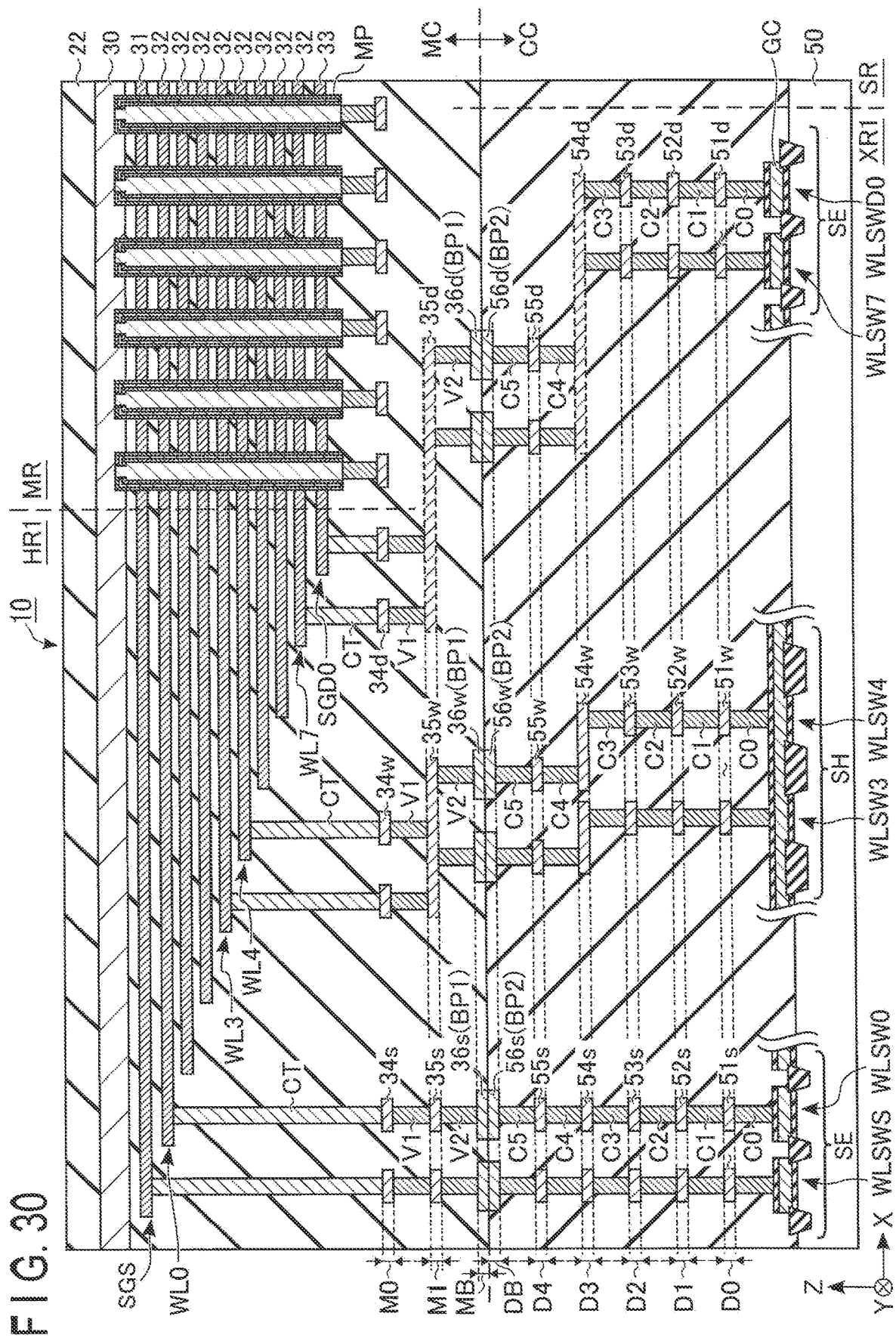
FIG. 30 is a diagram illustrating a cross-sectional structure of a hookup region and a transfer region in the first example according to the second embodiment.

Next, detailed structures of the hookup region HR1 and the transfer region XR1 in the semiconductor memory device 10 will be described with reference to FIG. 30. FIG. 30 is a cross-sectional view along the X direction of the hookup region HR1 and the transfer region XR1 in a first example. Since the structures of the hookup region HR2 and the transfer region XR2 are substantially the same as those of the hookup region HR1 and the transfer region XR1, descriptions thereof will be omitted.

As illustrated in FIG. 30, in the end portion region on the outer side (i.e., the chip end side) of the transfer region XR1, a plurality of gate separation transistors SE are arranged as the transistors WLSW.

For example, the source of a transistor WLSWS is coupled to a conductive layer 56s via a contact C0, a conductive layer 51s, a contact C1, a conductive layer 52s, a contact C2, a conductive layer 53s, a contact C3, a conductive layer 54s, a contact C4, a conductive layer 55s, and a contact C5.

The conductive layer 56s is bonded to a conductive layer 36s, and is joined to the conductive layer 36s. Thereby, the conductive layer 56s is electrically coupled to the conductive layer 36s. The conductive layers 56s and 36s are bonding pads BP2 and BP1, respectively.

The conductive layer 36s is coupled to a conductive layer 31 (i.e., a select gate line SGS) via a contact V2, a conductive layer 35s, a contact V1, a conductive layer 34s, and a contact CT. Thereby, the source of the transistor WLSWS is electrically coupled to the select gate line SGS.

Similarly, for example, the source of a transistor WLSW0 is coupled to a conductive layer 56s via a contact C0, a conductive layer 51s, a contact C1, a conductive layer 52s, a contact C2, a conductive layer 53s, a contact C3, a conductive layer 54s, a contact C4, a conductive layer 55s, and a contact C5.

The conductive layer 56s is bonded to a conductive layer 36s, and is joined to the conductive layer 36s. Thereby, the conductive layer 56s is electrically coupled to the conductive layer 36s. The conductive layer 36s is coupled to a conductive layer 32 (i.e., a word line WL0) via a contact V2, a conductive layer 35s, a contact V1, a conductive layer 34s, and a contact CT. Thereby, the source of the transistor WLSW0 is electrically coupled to the word line WL0.

The gates of the transistors WLSWS and WLSW0 are composed of individual conductive layers GC, which are separated from each other. That is, gate interconnects that constitute the gates of the gate separation transistors SE are formed of the individual conductive layers GC.

As illustrated in FIG. 30, a plurality of gate separation transistors SE are arranged as the transistors WLSW in the inner region on the sense amplifier region SR side of the transfer region XR1.

For example, the source of a transistor WLSW7 is coupled to a conductive layer 56$d$ via a contact C0, a conductive layer 51$d$, a contact C1, a conductive layer 52$d$, a contact C2, a conductive layer 53$d$, a contact C3, a conductive layer 54$d$, a contact C4, a conductive layer and a contact C5.

The conductive layer 56$d$ is bonded to a conductive layer 36$d$, and is joined to the conductive layer 36$d$. Thereby, the conductive layer 56$d$ is electrically coupled to the conductive layer 36$d$. The conductive layers 56$d$ and 36$d$ are bonding pads BP2 and BP1, respectively.

The conductive layer 36$d$ is coupled to a conductive layer 32 (i.e., a word line WL7) via a contact V2, a conductive layer 35$d$, a contact V1, a conductive layer 34$d$, and a contact CT. Thereby, the source of the transistor WLSW7 is electrically coupled to the word line WL7.

Similarly, for example, the source of a transistor WLSWD0 is coupled to a conductive layer 56$d$ via a contact C0, a conductive layer 51$d$, a contact C1, a conductive layer 52$d$, a contact C2, a conductive layer 53$d$, a contact C3, a conductive layer 54$d$, a contact C4, a conductive layer 55$d$, and a contact C5.

The conductive layer 56$d$ is bonded to a conductive layer 36$d$, and is joined to the conductive layer 36$d$. Thereby, the conductive layer 56$d$ is electrically coupled to the conductive layer 36$d$. The conductive layer 36$d$ is coupled to a conductive layer 33 (i.e., a select gate line SGD0) via a contact V2, a conductive layer 35$d$, a contact V1, a conductive layer 34$d$, and a contact CT. The source of the transistor WLSWD0 is electrically coupled to the select gate line SGD0.

The gates of the transistors WLSW7 and WLSWD0 are composed of individual conductive layers GC, which are separated from each other. That is, gate interconnects that constitute the gates of the gate separation transistors SE are formed of the individual conductive layers GC.

As illustrated in FIG. 30, a plurality of gate sharing transistors SH are arranged as the transistors WLSW in a central region between the outer end portion region and the inner region on the sense amplifier region SR side of the transfer region XR1.

For example, the source of a transistor WLSW3 is coupled to a conductive layer 56$w$ via a contact C0, a conductive layer 51$w$, a contact C1, a conductive layer 52$w$, a contact C2, a conductive layer 53$w$, a contact C3, a conductive layer 54$w$, a contact C4, a conductive layer and a contact C5.

The conductive layer 56$w$ is bonded to a conductive layer 36$w$, and is joined to the conductive layer 36$w$. Thereby, the conductive layer 56$w$ is electrically coupled to the conductive layer 36$w$. The conductive layers 56$w$ and 36$w$ are bonding pads BP2 and BP1, respectively.

The conductive layer 36$w$ is coupled to a conductive layer 32 (i.e., a word line WL3) via a contact V2, a conductive layer 35$w$, a contact V1, a conductive layer 34$w$, and a contact CT. Thereby, the source of the transistor WLSW3 is electrically coupled to the word line WL3.

Similarly, for example, the source of a transistor WLSW4 is coupled to a conductive layer 56$w$ via a contact C0, a conductive layer 51$w$, a contact C1, a conductive layer 52$w$, a contact C2, a conductive layer 53$w$, a contact C3, a conductive layer 54$w$, a contact C4, a conductive layer 55$w$, and a contact C5.

The conductive layer 56$w$ is bonded to a conductive layer 36$w$, and is joined to the conductive layer 36$w$. Thereby, the conductive layer 56$w$ is electrically coupled to the conductive layer 36$w$. The conductive layer 36$w$ is coupled to a conductive layer 32 (i.e., a word line WL4) via a contact V2, a conductive layer 35$w$, a contact V1, a conductive layer 34$w$, and a contact CT. Thereby, the source of the transistor WLSW4 is electrically coupled to the word line WL4.

The gates of the transistors WLSW3 and WLSW4 are composed of a conductive layer GC that is formed integrally and continuously. That is, gate interconnects that constitute the gates of the gate sharing transistors SH are formed of an integrated and continuous conductive layer GC.

2.1.2 Second Example

Figure 31:
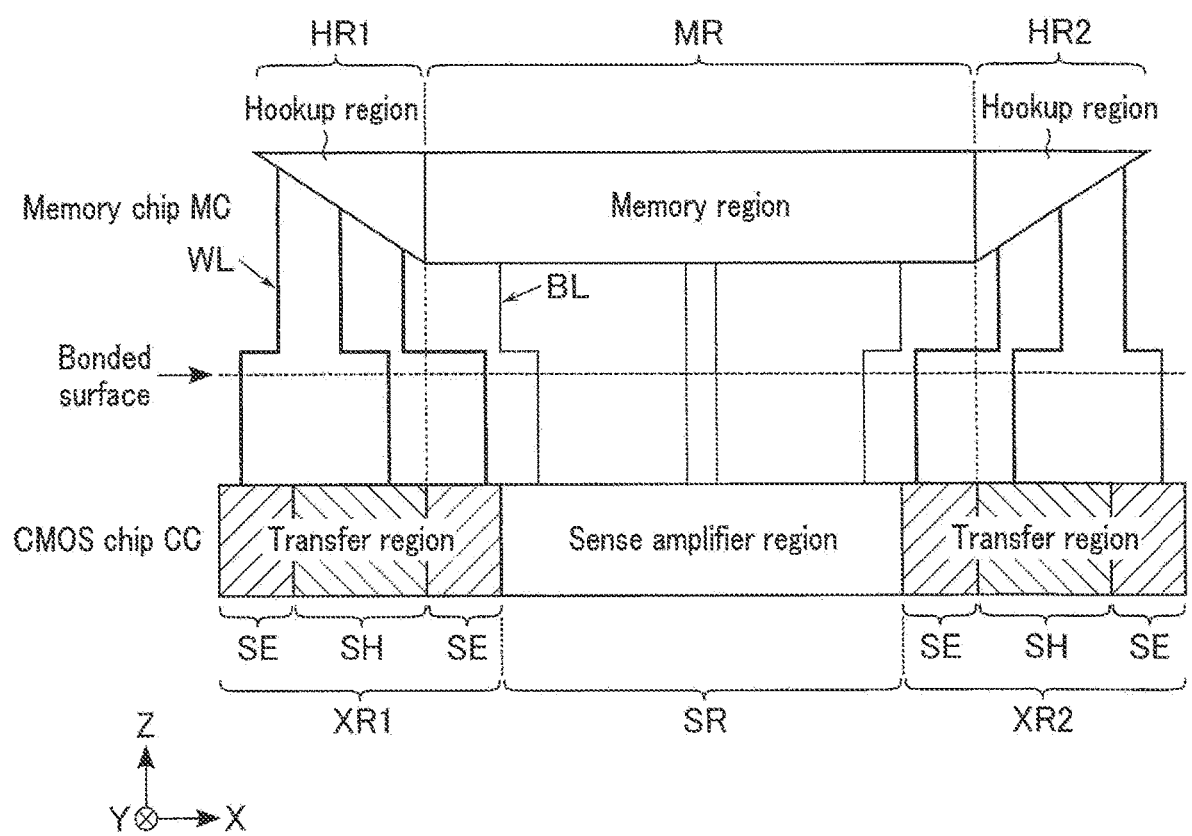
FIG. 31 is a schematic diagram illustrating a structure of a semiconductor memory device of a second example according to the second embodiment.

An outline of a structure of a semiconductor memory device 10 of a second example according to the second embodiment will be described with reference to FIG. 31. FIG. 31 is a schematic diagram illustrating the structure of the semiconductor memory device 10 of the second example. Similar to the first example, FIG. 31 illustrates a layout of the memory region MR, hookup regions HR1 and HR2, sense amplifier region SR, and transfer regions XR1 and XR2 in the X direction as viewed from the side surface (or the Y direction). In the hookup regions HR1 and HR2, the word lines WL and the select gate lines SGD and SGS are illustrated in the form of an image.

In the X direction, the external shape of the CMOS chip CC is larger than that of the memory chip MC. In other words, as viewed from the Z direction, an outer end portion of the transfer region XR1 in the CMOS chip CC extends outward from an outer end portion of the hookup region HR1 in the memory chip MC. An outer end portion of the transfer region XR2 in the CMOS chip CC extends outward from an outer end portion of the hookup region HR2 in the memory chip MC.

Further, the sense amplifier region SR and a part of the transfer regions XR1 and XR2 are arranged to overlap the memory region MR in the Z direction. In other words, the semiconductor memory device 10 has a structure such that, as viewed from the Z direction, the memory region MR overlaps the sense amplifier region SR, the part of the transfer region XR1, and the part of the transfer region XR2.

A part of the transfer region XR1 is arranged to overlap the hookup region HR1 in the Z direction. A part of the transfer region XR2 is arranged to overlap the hookup region HR2 in the Z direction. In other words, the semiconductor memory device 10 has a structure such that, as viewed from the Z direction, the hookup region HR1 overlaps the part of the transfer region XR1, and further the hookup region HR2 overlaps the part of the transfer region XR2.

Further, some of the word lines WL or the select gate lines SGD and SGS in the memory chip MC are coupled to the transistors WLSW in the transfer regions XR1 and XR2 of the CMOS chip CC by using interconnects orthogonal to the bit lines BL extending in the Y direction. Some of the bit lines BL in the memory chip MC are coupled to the sense amplifier sections SA (or sense amplifier units SAU) in the sense amplifier region SR of the CMOS chip CC by using interconnects orthogonal to the bit lines BL.

In the outer end portion region of the transfer region XR1, a plurality of gate separation transistors SE are arranged as the transistors WLSW. In the inner region on the sense amplifier region SR side of the transfer region XR1, a plurality of gate separation transistors SE are arranged as the transistors WLSW. Further, a plurality of gate sharing transistors SH are arranged as the transistors WLSW in a central region between the outer end portion region and the inner region on the sense amplifier region SR side of the transfer region XR1.

Similarly, in the outer end portion region of the transfer region XR2, a plurality of gate separation transistors SE are arranged as the transistors WLSW. In the inner region on the sense amplifier region SR side of the transfer region XR2, a plurality of gate separation transistors SE are arranged as the transistors WLSW. Further, a plurality of gate sharing transistors SH are arranged as the transistors WLSW in a central region between the outer end portion region and the inner region on the sense amplifier region SR side of the transfer region XR2.

Figure 32:
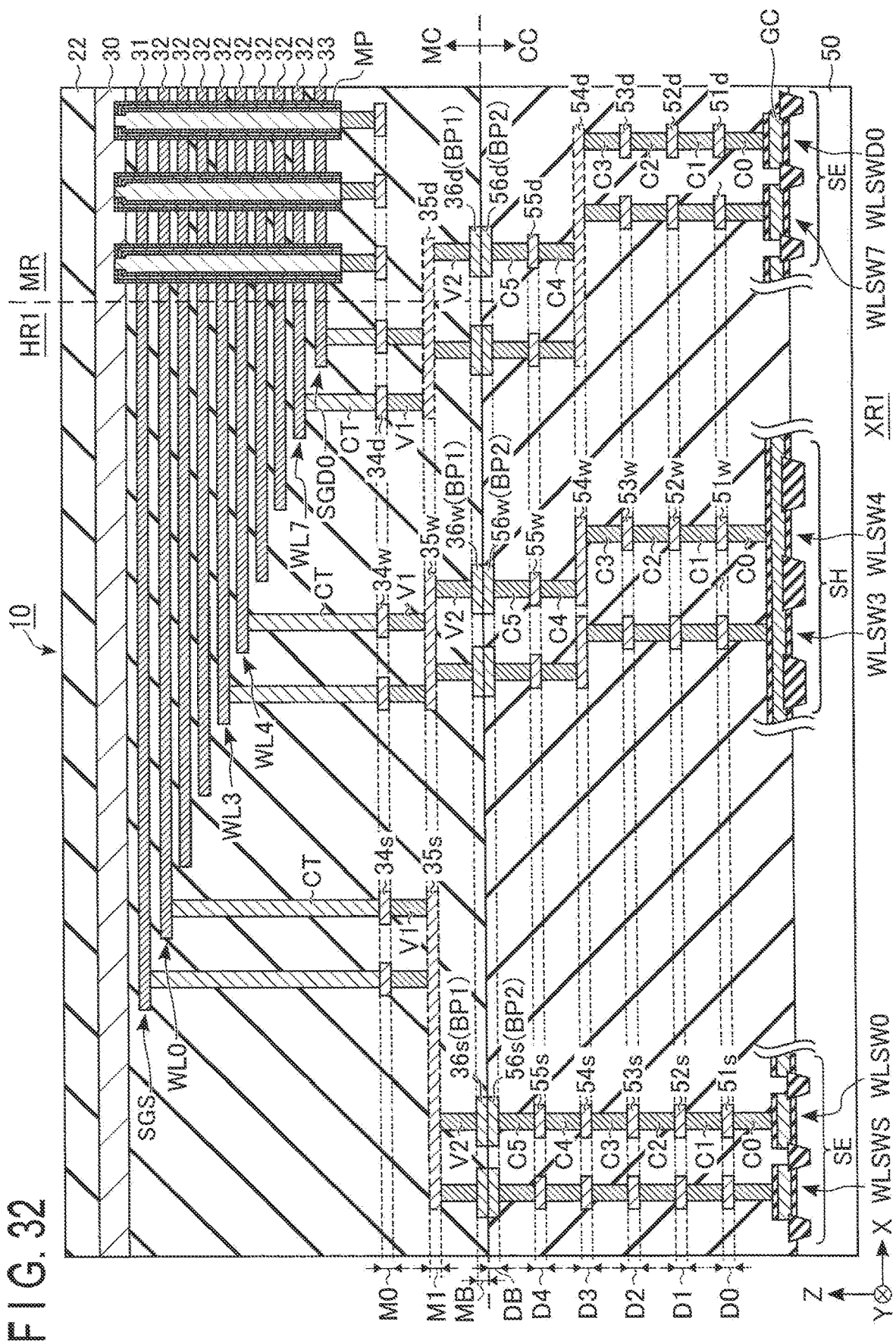
FIG. 32 is a diagram illustrating a cross-sectional structure of a hookup region and a transfer region in the second example according to the second embodiment.

Next, detailed structures of the hookup region HR1 and the transfer region XR1 in the semiconductor memory device 10 will be described with reference to FIG. 32. FIG. 32 is a cross-sectional view along the X direction of the hookup region HR1 and the transfer region XR1 in the second example. Since the structures of the hookup region HR2 and the transfer region XR2 are substantially the same as those of the hookup region HR1 and the transfer region XR1, descriptions thereof will be omitted.

As illustrated in FIG. 32, in the end portion region on the outer side (i.e., the chip end side) of the transfer region XR1, a plurality of gate separation transistors SE are arranged as the transistors WLSW.

For example, the source of a transistor WLSWS is coupled to a conductive layer 56s via a contact C0, a conductive layer 51s, a contact C1, a conductive layer 52s, a contact C2, a conductive layer 53s, a contact C3, a conductive layer 54s, a contact C4, a conductive layer and a contact C5.

The conductive layer 56s is bonded to a conductive layer 36s, and is joined to the conductive layer 36s. Thereby, the conductive layer 56s is electrically coupled to the conductive layer 36s. The conductive layers 56s and 36s are used as bonding pads BP2 and BP1, respectively.

The conductive layer 36s is coupled to a conductive layer 31 (i.e., a select gate line SGS) via a contact V2, a conductive layer 35s, a contact V1, a conductive layer 34s, and a contact CT. For example, the conductive layer 35s is a conductive layer extending to the chip end side beyond the select gate line SGS in the X direction. Thereby, the source of the transistor WLSWS is electrically coupled to the select gate line SGS.

Similarly, for example, the source of a transistor WLSW0 is coupled to a conductive layer 56s via a contact C0, a conductive layer 51s, a contact C1, a conductive layer 52s, a contact C2, a conductive layer 53s, a contact C3, a conductive layer 54s, a contact C4, a conductive layer 55s, and a contact C5.

The conductive layer 56s is bonded to a conductive layer 36s, and is joined to the conductive layer 36s. Thereby, the conductive layer 56s is electrically coupled to the conductive layer 36s. The conductive layer 36s is coupled to a conductive layer 32 (i.e., a word line WL0) via a contact V2, a conductive layer 35s, a contact V1, a conductive layer 34s, and a contact CT. For example, the conductive layer 35s is a conductive layer that extends to the chip end side beyond the word line WL0 in the X direction. Thereby, the source of the transistor WLSW0 is electrically coupled to the word line WL0.

The gates of the transistors WLSWS and WLSW0 are composed of individual conductive layers GC, which are separated from each other. That is, the conductive layers GC that constitute the gates of the gate separation transistors SE are formed of individual conductive layers.

As illustrated in FIG. 32, a plurality of gate separation transistors SE are arranged as the transistors WLSW in the inner region on the sense amplifier region SR side of the transfer region XR1.

For example, the source of a transistor WLSW7 is coupled to a conductive layer 56d via a contact C0, a conductive layer 51d, a contact C1, a conductive layer 52d, a contact C2, a conductive layer 53d, a contact C3, a conductive layer 54d, a contact C4, a conductive layer and a contact C5.

The conductive layer 56d is bonded to a conductive layer 36d, and is joined to the conductive layer 36d. Thereby, the conductive layer 56d is electrically coupled to the conductive layer 36d. The conductive layer 36d is coupled to a conductive layer 32 (i.e., a word line WL7) via a contact V2, a conductive layer 35d, a contact V1, a conductive layer 34d, and a contact CT. For example, the conductive layer 35d is a conductive layer extending from an end portion side of the word line WL7 to the sense amplifier region SR side in the X direction. Thereby, the source of the transistor WLSW7 is electrically coupled to the word line WL7.

Similarly, for example, the source of a transistor WLSWD0 is coupled to a conductive layer 56d via a contact C0, a conductive layer 51d, a contact C1, a conductive layer 52d, a contact C2, a conductive layer 53d, a contact C3, a conductive layer 54d, a contact C4, a conductive layer 55d, and a contact C5.

The conductive layer 56d is bonded to a conductive layer 36d, and is joined to the conductive layer 36d. Thereby, the conductive layer 56d is electrically coupled to the conductive layer 36d. The conductive layer 36d is coupled to a conductive layer 33 (i.e., a select gate line SGD0) via a contact V2, a conductive layer 35d, a contact V1, a conductive layer 34d, and a contact CT. For example, the conductive layer is a conductive layer extending from an end portion side of the select gate line SGD0 to the sense amplifier region SR side in the X direction. Thereby, the source of the transistor WLSWD0 is electrically coupled to the select gate line SGD0.

The gates of the transistors WLSW7 and WLSWD0 are composed of individual conductive layers GC, which are separated from each other. That is, the conductive layers GC that constitute the gates of the gate separation transistors SE are formed of individual conductive layers.

As illustrated in FIG. 32, a plurality of gate sharing transistors SH are arranged as the transistors WLSW in a central region between the outer end portion region and the inner region on the sense amplifier region SR side of the transfer region XR1.

For example, the source of a transistor WLSW3 is coupled to a conductive layer 56w via a contact C0, a conductive layer 51w, a contact C1, a conductive layer 52w, a contact C2, a conductive layer 53w, a contact C3, a conductive layer 54w, a contact C4, a conductive layer and a contact C5.

The conductive layer 56w is bonded to a conductive layer 36w, and is joined to the conductive layer 36w. Thereby, the conductive layer 56w is electrically coupled to the conductive layer 36w. The conductive layer 36w is coupled to a conductive layer 32 (i.e., a word line WL3) via a contact V2, a conductive layer 35w, a contact V1, a conductive layer 34w, and a contact CT. Thereby, the source of the transistor WLSW3 is electrically coupled to the word line WL3.

Similarly, for example, the source of a transistor WLSW4 is coupled to a conductive layer 56w via a contact C0, a conductive layer 51w, a contact C1, a conductive layer 52w, a contact C2, a conductive layer 53w, a contact C3, a conductive layer 54w, a contact C4, a conductive layer 55w, and a contact C5.

The conductive layer 56w is bonded to a conductive layer 36w, and is joined to the conductive layer 36w. Thereby, the conductive layer 56w is electrically coupled to the conductive layer 36w. The conductive layer 36w is coupled to a conductive layer 32 (i.e., a word line WL4) via a contact V2, a conductive layer 35w, a contact V1, a conductive layer 34w, and a contact CT. Thereby, the source of the transistor WLSW4 is electrically coupled to the word line WL4.

The gates of the transistors WLSW3 and WLSW4 are composed of a conductive layer GC that is formed integrally and continuously. That is, the conductive layer GC that constitutes the gates of the gate sharing transistors SH is formed integrally and continuously.

2.2 Advantageous Effect of Second Embodiment

According to the second embodiment, it is possible to provide a semiconductor memory device that can reduce the external size or secure a circuit area including a sense amplifier, similarly to the first embodiment.

An advantageous effect of the second embodiment will be described below.

In the present embodiment, gate sharing transistors SH, in which a gate interconnect is easily routed, are used in a region where the number of lead-out interconnects from the word lines WL is large and these lead-out interconnects are tight, for example, in a transfer region corresponding to a boundary region between the memory region MR and the hookup region HR1 (or HR2) in the CMOS chip CC. That is, gate sharing transistors SH, in which a gate interconnect is shared and no interconnect is required to couple gate interconnects to each other, are used in a transfer region corresponding to a region where the lead-out interconnects from the word lines are tight. On the other hand, in a region where the number of lead-out interconnects from the word lines WL is relatively small and these lead-out interconnects are sparse, for example, in a transfer region corresponding to an outer end portion region of the hookup region HR1 (or HR2) and a transfer region closer to the memory region side than the boundary region between the memory region MR and the hookup region HR1, gate separation transistors SE, which can reduce an area occupied by the transistors, are used. This allows the transfer region to be reduced and the external size of the semiconductor memory device to be reduced.

Figure 33:
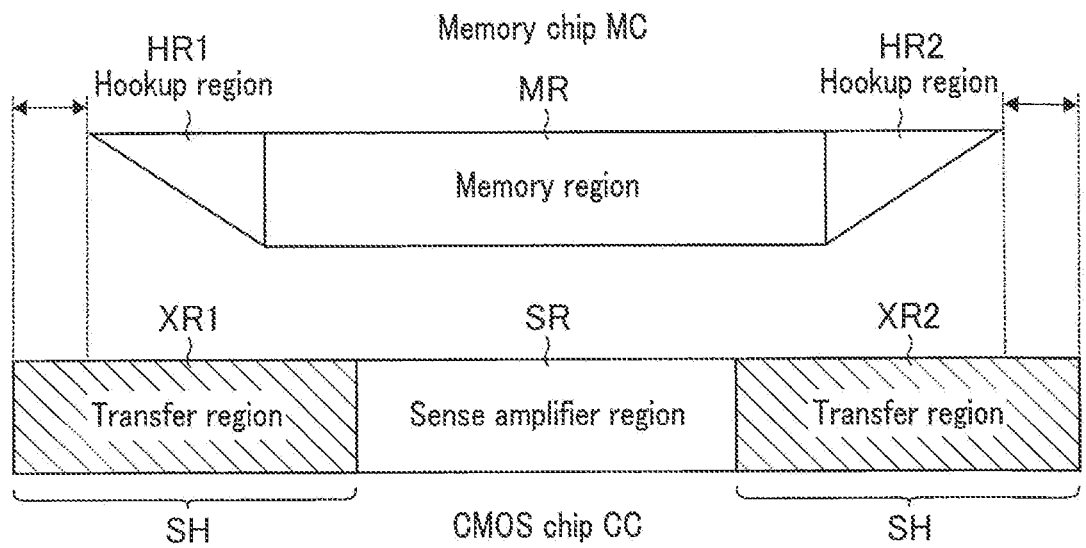
FIG. 33 is a schematic diagram illustrating a structure of a semiconductor memory device according to a comparative example.
Figure 34:
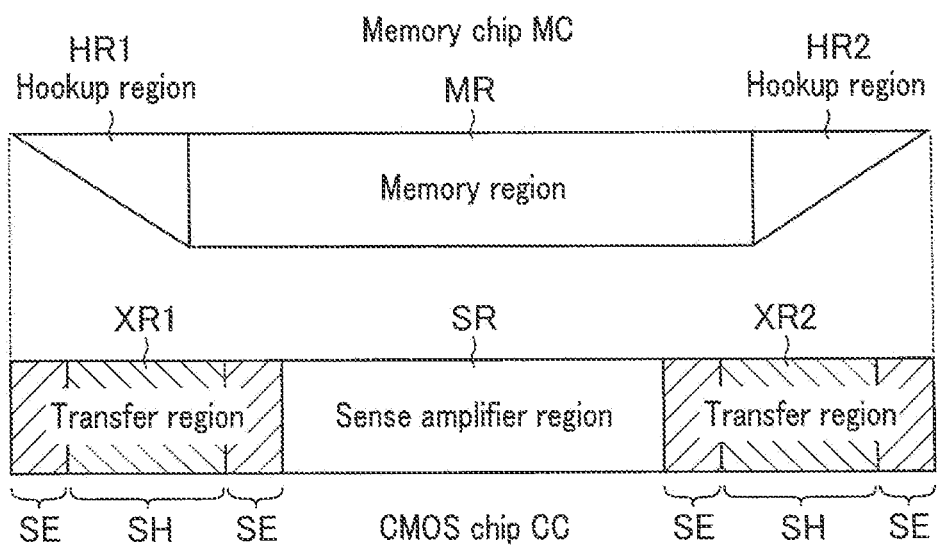
FIG. 34 is a schematic diagram illustrating a structure of the semiconductor memory device according to the second embodiment corresponding to the comparative example.

For example, if the external size of the CMOS chip CC is larger than that of the memory chip MC as illustrated in FIG. 33, the gate sharing transistors SH in the end portion region in the transfer region XR1 and the gate sharing transistors SH in the inner region on the sense amplifier region SR side in the transfer region XR1 are replaced with gate separation transistors SE as illustrated in FIG. 34. The gate sharing transistors SH in the central region in the transfer region XR1 are not replaced, and the gate separation transistors SE are left in place. Similarly, the gate sharing transistors SH in the end portion region in the transfer region XR2 and the gate sharing transistors SH in the inner region on the sense amplifier region SR side in the transfer region XR2 are replaced with gate separation transistors SE. The gate sharing transistors SH in the central region in the transfer region XR2 are not replaced, and the gate separation transistors SE are left in place. This reduces the area of the transfer regions XR1 and XR2, thereby reducing the external size of the semiconductor memory device 10.

Figure 35:
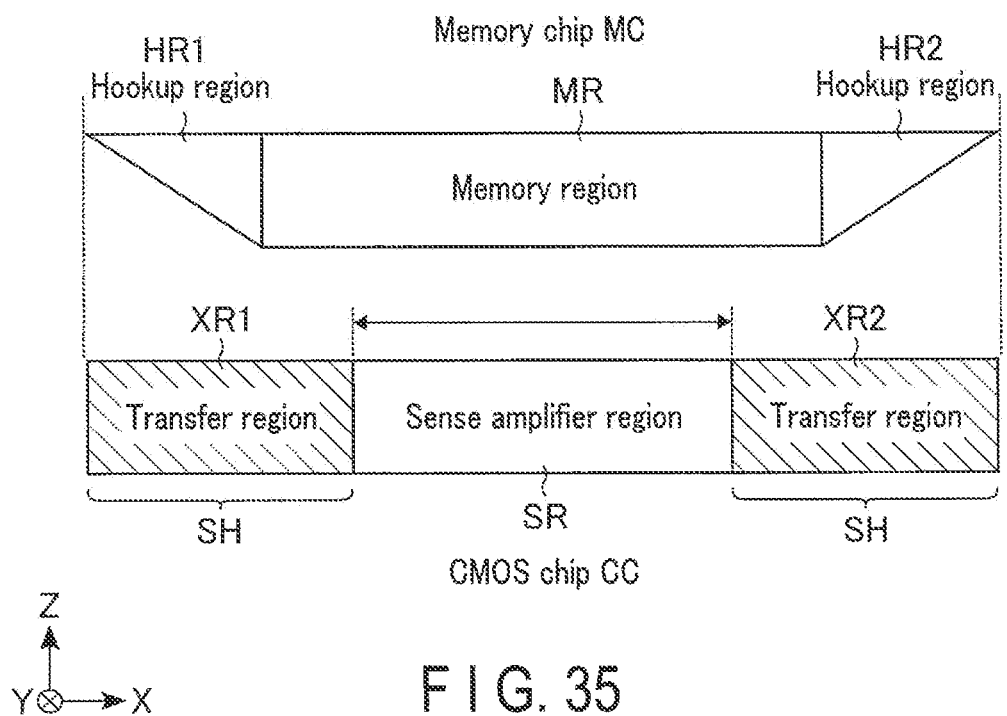
FIG. 35 is a schematic diagram illustrating a structure of a semiconductor memory device according to another comparative example.
Figure 36:
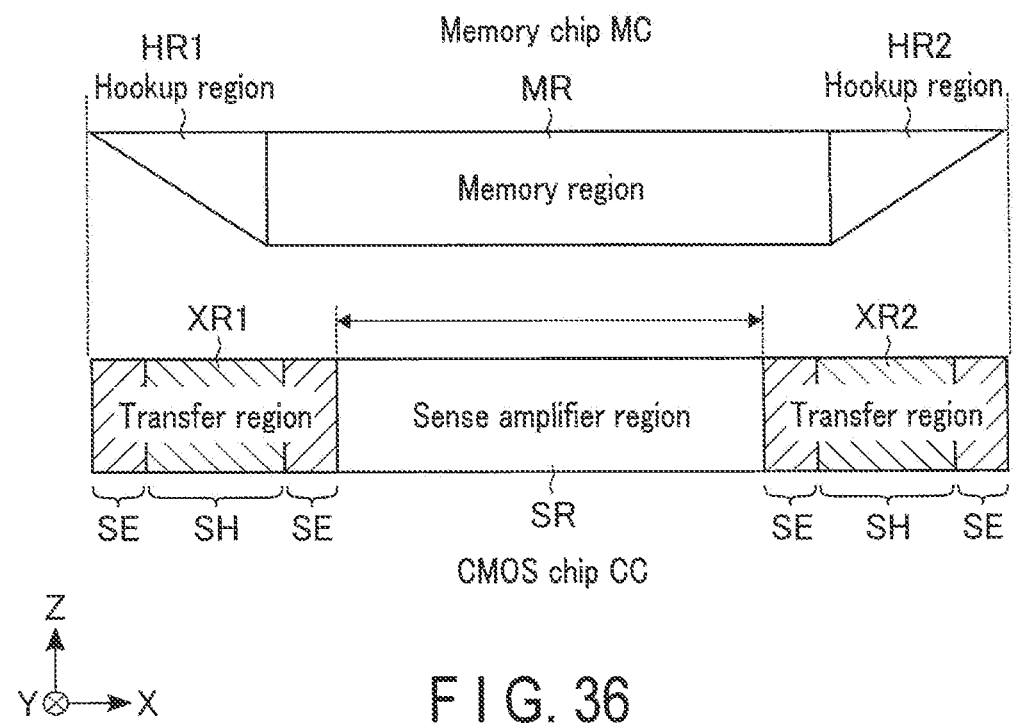
FIG. 36 is a schematic diagram illustrating a structure of the semiconductor memory device according to the second embodiment corresponding to another comparative example.

Further, if the external sizes of the memory chip MC and the CMOS chip CC have almost the same structure as illustrated in FIG. 35, the gate sharing transistors SH in the end portion region of the transfer region XR1 and the gate sharing transistors SH in the inner region on the sense amplifier region SR side of the transfer region XR1 are replaced with gate separation transistors SE as illustrated in FIG. 36. The gate sharing transistors SH in the central area of the transfer region XR1 are not replaced, and the gate separation transistors SE are left in place. The gate sharing transistors SH in the end portion region of the transfer region XR2 and the gate sharing transistors SH in the inner region on the sense amplifier region SR side of the transfer region XR2 are replaced with gate separation transistors SE. The gate sharing transistors SH in the central region of the transfer region XR2 are not replaced, and the gate separation transistors SE are left in place. This reduces the area of the transfer regions XR1 and XR2. In this case, a sufficient sense amplifier region SR can be secured to arrange the sense amplifier 21 and the column control circuit. The arrangement area of the sense amplifier region SR in which the sense amplifier 21 and the column control circuit are arranged can be secured.

As described above, according to the semiconductor memory device of the second embodiment, the external size can be reduced. Furthermore, the arrangement area of the sense amplifier region SR, including the sense amplifier 21 and the column control circuit, can be secured.

3. Other Modification, Etc.

In the above-described embodiments, a NAND flash memory is described as an example of the semiconductor memory device. However, the above embodiments can be applied to not only a NAND flash memory but also the other semiconductor memories in general. Moreover, the above-described embodiments can also be applied to various memory devices other than the semiconductor memories.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first word line coupled to a first memory cell;
   a second word line coupled to a second memory cell;
   a third word line coupled to a third memory cell;
   a fourth word line coupled to a fourth memory cell;
   a first transistor including a first gate and electrically coupled to the first word line;
   a second transistor including a second gate and electrically coupled to the second word line;

a third transistor including a third gate and electrically coupled to the third word line; and a fourth transistor including a fourth gate and electrically coupled to the fourth word line, wherein the first gate is included in a first conductive layer, the second gate is included in a second conductive layer arranged away from the first conductive layer, and the third gate and the fourth gate are included in a third conductive layer which is integral and continuous.

2. The semiconductor memory device according to claim 1, wherein the first transistor, the second transistor, the third transistor, and the fourth transistor are provided on a substrate, the third transistor and the fourth transistor are arranged in a first region of the substrate, and the first transistor and the second transistor are arranged in a second region closer to an end portion side of the substrate than the first region.

3. The semiconductor memory device according to claim 1, wherein the first conductive layer, the second conductive layer, and the third conductive layer are provided above a substrate at a first distance away from the substrate.

4. The semiconductor memory device according to claim 1, further comprising a fourth conductive layer provided above the first conductive layer and the second conductive layer, wherein the first conductive layer and the second conductive layer are electrically coupled by the fourth conductive layer.

5. The semiconductor memory device according to claim 1, further comprising a fifth conductive layer provided between the first conductive layer and the second conductive layer.

6. The semiconductor memory device according to claim 1, further comprising a pillar, wherein the first word line, the second word line, the third word line, and the fourth word line extend in a first direction and are sequentially stacked in a second direction intersecting the first direction, and the pillar passes through the first word line, the second word line, the third word line, and the fourth word line in the second direction.

7. The semiconductor memory device according to claim 6, wherein an intersection between the first word line and the pillar functions as the first memory cell, an intersection between the second word line and the pillar functions as the second memory cell, an intersection between the third word line and the pillar functions as the third memory cell, and an intersection between the fourth word line and the pillar functions as the fourth memory cell.

8. The semiconductor memory device according to claim 6, further comprising a bit line coupled to one end of the pillar, wherein the bit line is provided between the pillar and the fourth transistor.

9. The semiconductor memory device according to claim 1, further comprising a first circuit electrically coupled to drains of the first transistor, the second transistor, the third transistor, and the fourth transistor, wherein the first circuit is configured to supply voltages to the drains.

10. The semiconductor memory device according to claim 1, further comprising a second circuit electrically coupled to the first gate of the first transistor, the second gate of the second transistor, the third gate of the third transistor, and the fourth gate of the fourth transistor, wherein the second circuit is configured to supply signal voltages to the first gate, the second gate, the third gate, and the fourth gate based on an address signal.

11. A semiconductor memory device comprising:

a first word line coupled to a first memory cell;

a second word line coupled to a second memory cell;

a third word line coupled to a third memory cell;

a fourth word line coupled to a fourth memory cell;

a fifth word line coupled to a fifth memory cell;

a sixth word line coupled to a sixth memory cell;

a first transistor including a first gate and electrically coupled to the first word line;

a second transistor including a second gate and electrically coupled to the second word line;

a third transistor including a third gate and electrically coupled to the third word line;

a fourth transistor including a fourth gate and electrically coupled to the fourth word line;

a fifth transistor including a fifth gate and electrically coupled to the fifth word line; and a sixth transistor including a sixth gate and electrically coupled to the sixth word line, wherein the first gate is included in a first conductive layer, the second gate is included in a second conductive layer arranged away from the first conductive layer, the third gate and the fourth gate are included in a third conductive layer which is integral and continuous, the fifth gate is included in a fourth conductive layer, and the sixth gate is included in a fifth conductive layer arranged away from the fourth conductive layer.

12. The semiconductor memory device according to claim 11, wherein the first transistor, the second transistor, the third transistor, the fourth transistor, the fifth transistor, and the sixth transistor are provided on a substrate, the fifth transistor and the sixth transistor are arranged in a first region of the substrate, the first transistor and the second transistor are arranged in a second region closer to an end portion side of the substrate than the first region, and the third transistor and the fourth transistor are arranged in a third region between the first region and the second region.

13. The semiconductor memory device according to claim 11, wherein the first conductive layer, the second conductive layer, the third conductive layer, the fourth conductive layer, and the fifth conductive layer are provided above a substrate at a first distance away from the substrate.

14. The semiconductor memory device according to claim 11, further comprising:

a sixth conductive layer provided above the first conductive layer and the second conductive layer; and a seventh conductive layer provided above the fourth conductive layer and the fifth conductive layer, wherein the first conductive layer and the second conductive layer are electrically coupled by the sixth conductive layer, and the fourth conductive layer and the fifth conductive layer are electrically coupled by the seventh conductive layer.

15. The semiconductor memory device according to claim 11, further comprising:

an eighth conductive layer provided between the first conductive layer and the second conductive layer; and a ninth conductive layer provided between the fourth conductive layer and the fifth conductive layer.

16. The semiconductor memory device according to claim 11, further comprising a pillar,
wherein the first word line, the second word line, the third word line, the fourth word line, the fifth word line, and the sixth word line extend in a first direction and are sequentially stacked in a second direction intersecting the first direction, and
the pillar passes through the first word line, the second word line, the third word line, the fourth word line, the fifth word line, and the sixth word line in the second direction.

17. The semiconductor memory device according to claim 16, wherein an intersection between the first word line and the pillar functions as the first memory cell, an intersection between the second word line and the pillar functions as the second memory cell, an intersection between the third word line and the pillar functions as the third memory cell, an intersection between the fourth word line and the pillar functions as the fourth memory cell, an intersection between the fifth word line and the pillar functions as the fifth memory cell, and an intersection between the sixth word line and the pillar functions as the sixth memory cell.

18. The semiconductor memory device according to claim 16, further comprising a bit line coupled to one end of the pillar,
wherein the bit line is provided between the pillar and the sixth transistor.

19. The semiconductor memory device according to claim 11, further comprising a first circuit electrically coupled to drains of the first transistor, the second transistor, the third transistor, the fourth transistor, the fifth transistor, and the sixth transistor,
wherein the first circuit is configured to supply voltages to the drains.

20. The semiconductor memory device according to claim 11, further comprising a second circuit electrically coupled to the first gate of the first transistor, the second gate of the second transistor, the third gate of the third transistor, the fourth gate of the fourth transistor, the fifth gate of the fifth transistor, and the sixth gate of the sixth transistor,
wherein the second circuit is configured to supply signal voltages to the first gate, the second gate, the third gate, the fourth gate, the fifth gate, and the sixth gate based on an address signal.

* * * * *